US009070690B2

(12) United States Patent
Suzumura et al.

(10) Patent No.: US 9,070,690 B2
(45) Date of Patent: Jun. 30, 2015

(54) SEMICONDUCTOR DEVICE AND METHOD OF MANUFACTURING THE SAME

(71) Applicant: RENESAS ELECTRONICS CORPORATION, Kanagawa (JP)

(72) Inventors: Naohito Suzumura, Kanagawa (JP); Yoshihiro Oka, Kanagawa (JP)

(73) Assignee: RENESAS ELECTRONICS CORPORATION, Kanagawa (JP)

( * ) Notice: Subject to any disclaimer, the term of this patent is extended or adjusted under 35 U.S.C. 154(b) by 0 days.

(21) Appl. No.: 13/909,551

(22) Filed: Jun. 4, 2013

(65) Prior Publication Data

US 2013/0341793 A1    Dec. 26, 2013

(30) Foreign Application Priority Data

Jun. 21, 2012  (JP) ................................. 2012-139456

(51) Int. Cl.
| H01L 23/538 | (2006.01) |
| H01L 21/768 | (2006.01) |
| H01L 23/522 | (2006.01) |
| H01L 23/532 | (2006.01) |
| H01L 23/00 | (2006.01) |

(52) U.S. Cl.
CPC .......... *H01L 23/5384* (2013.01); *H01L 23/538* (2013.01); *H01L 21/768* (2013.01); *H01L 23/5222* (2013.01); *H01L 23/53238* (2013.01); *H01L 23/5329* (2013.01); *H01L 23/53295* (2013.01); *H01L 21/76807* (2013.01); *H01L 21/7682* (2013.01); *H01L 21/76825* (2013.01); *H01L 21/76826* (2013.01); *H01L 21/76831* (2013.01); *H01L 21/76835* (2013.01); *H01L 2221/1036* (2013.01); *H01L 2221/1047* (2013.01); *H01L 24/05* (2013.01); *H01L 2924/1306* (2013.01)

(58) Field of Classification Search
CPC ................... H01L 21/76807; H01L 21/76801;
    H01L 21/76802; H01L 2221/1036; H01L
    2221/1047; H01L 2224/05006; H01L 21/7682
USPC .................................. 438/622, 637, 638, 667
See application file for complete search history.

(56) References Cited

U.S. PATENT DOCUMENTS

| 2011/0147882 A1 | 6/2011 | Tsutsue |
| 2011/0285028 A1 | 11/2011 | Seo |

FOREIGN PATENT DOCUMENTS

| JP | 2008-232759 | 10/2008 |
| JP | 2010-171072 | 8/2010 |
| JP | 2010-182946 | 8/2010 |
| JP | 2011-109036 | 6/2011 |
| WO | 2011/061879 | 5/2011 |

OTHER PUBLICATIONS

English Machine Translation of JP 2011-109036; Seo T.; published Jun. 6, 20011.*

* cited by examiner

*Primary Examiner* — Peniel M Gumedzoe
(74) *Attorney, Agent, or Firm* — Young & Thompson

(57) ABSTRACT

A semiconductor device is provided in which reliability of the semiconductor device is improved by improving an EM characteristic, a TDDB characteristic, and a withstand voltage characteristic of the semiconductor device. An average diameter of first vacancies in a lower insulating layer which configures an interlayer insulating film of a porous low-k film for embedding a wiring therein, is made smaller than an average diameter of second vacancies in an upper insulating layer, and thereby an elastic modulus is increased in the lower insulating layer. Further, a side wall insulating layer which is a dense layer including the first vacancies having an average diameter smaller than the second vacancies is formed on the surface of the interlayer insulating film exposed on a side wall of a wiring trench.

7 Claims, 34 Drawing Sheets ns direction.

SEMICONDUCTOR DEVICE AND METHOD OF MANUFACTURING THE SAME

CROSS-REFERENCE TO RELATED APPLICATION

The disclosure of Japanese Patent Application No. 2012-139456 filed on Jun. 21, 2012 including the specification, drawings and abstract is incorporated herein by reference in its entirety.

TECHNICAL FIELD

The present invention relates to a semiconductor device and a method of manufacturing the same, and in particular, relates to a technique which is effectively applied to a semiconductor device having a low relative permittivity film.

BACKGROUND

In a leading-edge advanced system LSI (Large Scale Integration), along with the progress of element miniaturization, there arises a problem of increase in wiring delay (RC (Resistance-Capacitance) delay) which is proportional to a product of a wiring resistance and a wiring parasitic capacity. As a countermeasure against this problem, the wiring resistance is reduced by the use of a copper (Cu) wiring and also there has been frequently employed a method of reducing the parasitic capacity by using an insulating film having a relative permittivity k not lower than 2.5 and not higher than 3.1 (low-k film) as an interlayer insulating film. Recently, as a material having further lower relative permittivity, there has been developed a porous low-k film obtained by introducing vacancies in a low-k film, and the like.

Patent Document 1 (Japanese Patent Laid-Open No. 2010-182946) describes that a plurality of wiring trenches is formed in a film which includes an insulating film of a low vacancy rate region having a low vacancy rate and an insulating film of a high vacancy rate region having a vacancy rate higher than the low vacancy rate region, and a Cu wiring is formed in each of the wiring trenches. Here, it is described that, in the insulating film between the respective wirings, an insulating film of a low vacancy rate region is formed in a peripheral part of a side wall in each of the wiring trenches, and a region having a relatively high vacancy density is formed in a region of the insulating film except the peripheral region of the side wall in each of the wiring trenches.

Patent Document 2 (Japanese Patent Laid-Open No. 2010-171072 and Patent Document 3 (Japanese Patent Laid-Open No. 2011-109036) describe that the vacancy occupation rate per a unit volume in an insulating film is changed in the film thickness direction by increase of a porogen flow rate during a film formation process of the insulating film. Patent Document 3 describes that a vacancy diameter increases particularly in the center part of the insulating film in the film thickness direction.

SUMMARY

In a case where the porous low-k film is used for an interlayer insulating film in which a wiring, a via, or the like is embedded, when the vacancy diameter is increased in the porous low-k film, it is possible to reduce permittivity of the insulating film and to reduce parasitic capacitance of the wiring. When the vacancy diameter is increased, however, there may occur a problem that an EM (Electro Migration) lifetime of the wiring including a plug (via) becomes short.

Further, when the vacancy diameter is increased, there may occur a problem that a line-to-line TDDB (Time Dependent Dielectric Breakdown) lifetime becomes short between the wirings arranged in parallel in the porous low-k film.

In particular, when the diameter of vacancies in the lower layer within the porous low-k film is increased, the EM characteristic and the TDDB characteristic are degraded significantly in a via (coupling portion) which is embedded in the porous low-k film and couples a wiring in a wiring trench formed in the upper surface of the porous low-k film and a wiring in the lower layer thereof. When degradation in the EM characteristic and the TDDB characteristic is caused in a via within the porous low-k film in this manner, reliability of a semiconductor device is degraded.

The other problem and the new feature will become clear from the description of the present specification and the accompanying drawings.

Among embodiments disclosed in the present application, an outline of a representative one will be explained briefly as follows.

In a semiconductor device of an embodiment, an interlayer insulating film of a porous low-k film has a two-layer structure configured with a first film which includes a plurality of vacancies and a second film which is formed over the first film and includes a plurality of vacancies having an average diameter larger than that of the vacancies in the first film, and this interlayer insulating film is formed embedding a wiring and a via therein.

Further, a method of manufacturing a semiconductor device, which is another embodiment, increases a flow rate of porogen which is supplied together with source gas during a film formation process of forming an interlayer insulating film of a porous low-k film, and then eliminates the porogen from the inside of the interlayer insulating film. Thereby, the interlayer insulating film has a two layer structure configured with a first film which includes a plurality of vacancies and a second film which is formed on the first film and includes a plurality of vacancies having an average diameter larger than the vacancies in the first film, and this interlayer insulating film is formed embedding a wiring and a via therein.

According to an embodiment disclosed in the present application, it is possible to improve reliability of a semiconductor device.

MODE FOR CARRYING OUT THE INVENTION

Hereinafter, an embodiment will be explained in detail according to the drawings. Note that, in all the drawings for explaining an embodiment, a component having the same function is provided with the same sign and repeated explanation thereof will be omitted. Further, in the following embodiment, explanation of the same or similar part will not be repeated in principle except a case necessary in particular.

Figure 1:
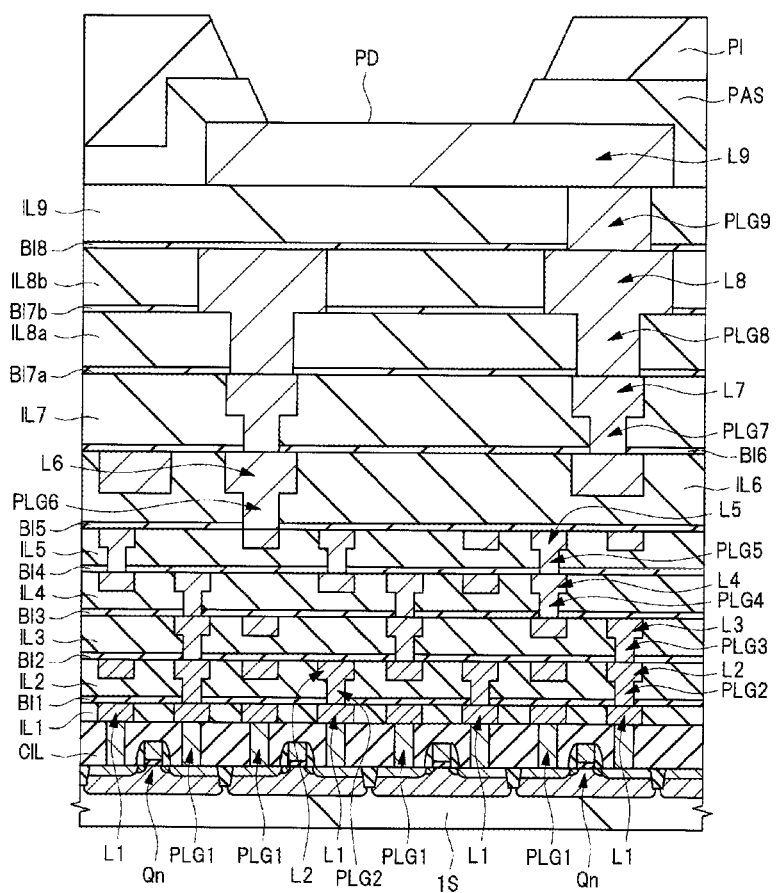
FIG. 1 is a cross-sectional view showing a semiconductor device in an embodiment of the present invention.

A semiconductor device of the present embodiment is obtained by means of forming an interlayer insulating film which embeds an upper layer wiring, a coupling via, and the like electrically coupled to a semiconductor element or the like over a semiconductor substrate, with a porous low-k film and controlling diameters of a plurality of vacancies included in the interlayer insulating film. In the following, an example of the semiconductor device according to the present embodiment will be explained by the use of FIG. 1. FIG. 1 is a cross-sectional view showing a part of a semiconductor device which has a MISFET (Metal Insulator Semiconductor Field Effect Transistor) of a field effect transistor and a plurality of wiring layers formed over the MISFET, over the semiconductor substrate.

As shown in FIG. 1, a plurality of MISFETs Qn is formed over a semiconductor substrate 1S configured with a silicon single crystal. The MISFETs Qn are formed in an active region isolated by an element isolation region, and configured as shown in the following, for example. Specifically, a well is formed in the active region isolated by the element isolation region and the MISFET Qn is formed over the well. The MISFET Qn has, for example, a gate insulating film configured with a silicon oxide film and a gate electrode which is formed over this gate insulating film and configured with a stacked film of a poly silicon film and a silicide film (such as a nickel silicide film) provided over this poly silicon film, over the major surface of the semiconductor substrate 1S. Note that the silicide film is not shown in FIG. 1.

At each of side walls on both sides of the gate electrode, a side wall configured with a silicon oxide film, for example, is formed, and a shallow impurity diffusion region is formed in the semiconductor substrate under this side wall in alignment with the gate electrode. Then, outside the shallow impurity diffusion region, a deep impurity diffusion region is formed in alignment with the side wall. A source region and a drain region of the MISFET Qn are formed by the pairs of shallow impurity region and deep impurity region, respectively. As described above, the MISFET Qn is formed having the gate electrode and the source-drain regions over the semiconductor substrate 1S.

Successively, as shown in FIG. 1, a contact interlayer insulating film CIL is formed over the semiconductor substrate 1S where the MISFETs Qn are formed. This contact interlayer insulating film CIL is formed, for example, by a stacked film of an ozone TEOS film (silicon oxide film) which is formed by a thermal CVD method using ozone and TEOS (Tetra Ethyl Ortho Silicate) as source and a plasma TEOS film (silicon oxide film) which is provided over this ozone TEOS film and formed by a plasma CVD method using TEOS as source.

Then, a plurality of plugs PLG1 is formed passing through this contact interlayer insulating film CIL and reaching the source region, drain region or the like of the MISFET Qn. The plug PLG1 is formed, for example, by means of embedding a barrier conductor film which is configured with titanium/titanium nitride film (hereinafter, titanium/titanium nitride film indicates a film formed by titanium and titanium nitride provided over this titanium) and a tungsten film which is formed over this barrier conductor film, into a contact hole.

The titanium/titanium nitride film is a film provided for preventing tungsten configuring the tungsten film from being diffused into the silicon, and a film for preventing fluoride attack from being made on the contact interlayer insulating film CIL and semiconductor substrate 1S and from causing damage therein in a CVD method which performs reduction processing on $WF_6$ (tungsten fluoride) when this tungsten film is formed. Note that the contact interlayer insulating film CIL may be formed by any of a silicon oxide film ($SiO_2$ film), SiOF film, and a silicon nitride film.

Next, a plurality of first layer wirings L1 is formed over the contact interlayer insulating film CIL. Specifically, the first layer wiring L1 is formed so as to be embedded in an interlayer insulating film IL1 formed over the contact interlayer insulating film CIL in which the plug PLG1 is formed, and the first layer wiring L1 is formed contacting the interlayer insulating film IL1.

The interlayer insulating film IL1 is configured, for example, with a low-k film having a relative permittivity lower than a passivation film PAS formed in the upper layer of the semiconductor substrate 1S and is configured, for example, with an SiOC film. That is, the first layer wiring L1 is formed by means of embedding a film containing mainly copper (hereinafter, described as copper film) in a wiring trench which passes through the interlayer insulating film IL1 and exposes the plug PLG 1 at the bottom. Here, a layer including the first layer wiring L1 and the interlayer insulating film IL1 in the same layer as the first layer wiring L1 is sometimes called a first fine layer in the present specification.

Successively, an interlayer insulating film IL2 and a plurality of second layer wirings L2 contacting the interlayer insulating film IL2 are formed over the interlayer insulating film IL1 in which the first layer wiring L1 is formed. Specifically, a barrier insulating film BI1 is formed over the interlayer insulating film IL1 in which the first layer wiring L1 is formed, and the interlayer insulating film IL2 is formed over the barrier insulating film BI1. The barrier insulating film BI1 is configured with a stacked film of an SiCN film and an SiCO film provided over the SiCN film, for example, and the interlayer insulating film IL2 is formed by an SiOC film having a plurality of vacancies inside, for example. The respective film thicknesses of the SiCN film and the SiCO film configuring the barrier insulating film BI1 are approximately 10 to 20 nm, and the relative permittivity of the SiCO film is 4, for example.

Here, as a feature of the semiconductor device of the present embodiment, the size (diameter) of the vacancy included in the interlayer insulating film IL2 is different between the upper part and the lower part within the interlayer insulating film IL2. The size (diameter) of the vacancy in the interlayer insulating film IL2 will be described below in detail by the use of FIG. 3.

A plurality of second layer wirings L2 of damascene wirings and a plurality of plugs (vias) PLG2 are formed in the barrier insulating film BI1 and the interlayer insulating film IL2 so as to be embedded therein. The second layer wiring L2 is electrically coupled to the first layer wiring L1 via the plug PLG2. The second layer wiring L2 and the plug PLG2 are formed by metal films containing mainly copper, for example. The barrier insulating film is formed between a metal wiring containing mainly copper (e.g., first layer wiring L1) and an interlayer insulating film (e.g., interlayer insulating film IL2), and is a film having a function of preventing a metal ion in the metal wiring from being diffused into the interlayer insulating film.

Then, as with the second layer wiring L2, a third layer wiring L3 to a fifth layer wiring L5 are formed over the second layer wiring L2. The third layer wiring L3 to the fifth layer wiring L5 are formed contacting interlayer insulating films IL3 to IL5, respectively. Specifically, over the interlayer insulating film IL2 and the second layer wiring L2, a barrier insulating film BI2 is formed contacting the interlayer insulating film IL2 and the second layer wiring L2. The interlayer insulating film IL3 is formed over the barrier insulating film BI2, and the respective upper surfaces of the second layer wiring L2 and the interlayer insulating film IL2 contact the barrier insulating film BI2.

The barrier insulating film BI2 is formed by a stacked film of an SiCN film and an SiCO film provided over the SiCN film, for example. The interlayer insulating film IL3 is formed by an SiOC film having a vacancy, for example, as with the interlayer insulating film IL2. The third layer wiring L3 and a plug (via) PLG3 are formed so as to be embedded in the barrier insulating film BI2 and the interlayer insulating film IL3. The third layer wiring L3 is electrically coupled to the second layer wiring L2 via the plug PLG3. The third layer wiring L3 and the plug PLG3 are formed by copper films, for example.

Here, the SiOC film configuring the interlayer insulating film IL2 and the like and the SiCO film configuring the barrier insulating film BI2 and the like are different from each other. Specifically, a vacancy is formed in the SiOC film configuring the interlayer insulating film IL2 and the like but a vacancy is not formed in the SiCO film. Accordingly, while the SiOC film has a relative permittivity of approximately 2.45 to 3.0, the SiCO film has a relative permittivity of approximately 4 higher than the SiOC film. Further, compared to the SiOC film, the SiCO film has a dense and hard film quality and, since the Yang's modulus is high, the elastic modulus is low.

Further, the SiOC film includes carbon (C) only in a methyl group ($CH_3$) configuring a molecule thereof. On the other hand, the SiCO film also has a higher ratio of carbon (C) bonded with silicon (Si) than the SiOC film except carbon in the methyl group ($CH_3$) and includes carbon (C) in a form of SiC, and therefore the SiCO film has a larger content amount of carbon than the SiOC film. However, the SiCO film has a smaller content amount of the methyl group ($CH_3$) than the SiOC film. Accordingly, in the present embodiment, a lower insulating layer PB2 which has a small inside vacancy diameter and a higher elastic modulus and the SiCO film configuring the barrier conductor film are different from each other.

Next, over the interlayer insulating film IL3 and over the third layer wiring L3, a barrier insulating film BI3 is formed contacting the interlayer insulating film IL3 and the third layer wiring L3, and an interlayer insulating film IL4 is formed over the barrier insulating film BI3. The barrier insulating film BI3 is formed by a stacked film of an SiCN film and an SiCO film provided over the SiCN film, for example, and the interlayer insulating film IL4 is formed by an SiOC film including a vacancy, for example. In the barrier insulating film BI3 and the interlayer insulating film IL4, the fourth layer wiring L4 and a plug (via) PLG4 are formed so as to be embedded therein. The fourth layer wiring L4 is electrically coupled to the third layer wiring L3 via the plug PLG4. The fourth layer wiring L4 and the plug PLG4 are formed by copper films, for example.

Moreover, over the interlayer insulating film IL4 and over the fourth layer wiring L4, a barrier insulating film BI4 is formed contacting the interlayer insulating film IL4 and the fourth layer wiring L4, and an interlayer insulating film IL5 is formed over the barrier insulating film BI4. The barrier insulating film BI4 is formed by a stacked film of an SiCN film and an SiCO film provided over the SiCN film, for example, and the interlayer insulating film IL5 is formed by an SiOC film having a vacancy, for example. In the barrier insulating film BI4 and the interlayer insulating film IL5, the fifth layer wiring L5 and a plug (via) PLG5 are formed so as to be embedded therein.

The fifth layer wiring L5 is electrically coupled to the fourth layer wiring L4 via the plug PLG5. The fifth layer wiring L5 and the plug PLG5 are formed by copper films, for example. Here, the second layer wiring L2 to the fifth layer wiring L5 and the interlayer insulating films IL2 to IL5 which are formed in the same layers as the second layer wiring L2 to the fifth layer wiring L5 respectively are sometimes called a second fine layer as a whole in the present specification. In each of the interlayer insulating films IL2 to IL5 which are the second fine layer, a plurality of wirings is formed.

Successively, over the interlayer insulating film IL5 and over the fifth layer wiring L5, a barrier insulating film BI5 is formed contacting the interlayer insulating film IL5 and the fifth layer wiring L5, and an interlayer insulating film IL6 is formed over the barrier insulating film BI5. The barrier insulating film BI5 is formed by a stacked film of an SiCN film and an SiCO film provided over the SiCN film, for example, and the interlayer insulating film IL6 is formed by an SiOC film, for example. In the barrier insulating film BI5 and the interlayer insulating film IL6, the sixth layer wiring L6 and a plug (via) PLG6 are formed so as to be embedded therein. The sixth layer wiring L6 is electrically coupled to the fifth layer wiring L5 via the plug PLG6. This sixth layer wiring L6 and the plug PLG6 are formed by copper films, for example.

Next, over the interlayer insulating film IL6, a barrier insulating film BI6 is formed, and an interlayer insulating film IL7 is formed over the barrier insulating film BI6. The barrier insulating film BI6 is formed by a stacked film of an SiCN film and an SiCO film provided over the SiCN film, for example, and the interlayer insulating film IL7 is formed by an SiOC film, for example. In the barrier insulating film BI6 and the interlayer insulating film IL7, the seventh layer wiring L7 and a plug (via) PLG7 are formed so as to be embedded therein. The seventh layer wiring L7 is electrically coupled to the sixth layer wiring L6 via the plug PLG7. The seventh layer wiring L7 and the plug PLG7 are formed by copper films, for example. Here, the sixth layer wiring L6 and the seventh layer wiring L7 are sometimes called a semi-global layer as a whole in the present specification.

Moreover, a barrier insulating film BI7a is formed over the interlayer insulating film IL7 and an interlayer insulating film IL8a is formed over the barrier insulating film BI7a. Then, an etching stop insulating film BI7b is formed over the interlayer insulating film IL8a, and an interlayer insulating film IL8b is formed over this etching stop insulating film BI7b. The barrier insulating film BI7a is formed by a stacked film of an SiCN film and an SiCO film, for example, and the etching stop insulating film BI7b is formed by any one of an SiCN film, SiC film, and SiN film, for example.

Each of the interlayer insulating film IL8a and the interlayer insulating film IL8b is formed by a silicon oxide film (SiO$_2$ film), an SiOF film or a TEOS film, for example. In the barrier insulating film BI7a and the interlayer insulating film IL8a, a plug (via) PLG8 is formed so as to be embedded therein, and in the etching stop insulating film BI7b and the interlayer insulating film IL8b, an eighth layer wiring L8 is formed so as to be embedded therein. The eighth layer wiring L8 is electrically coupled to the seventh layer wiring L7 via the plug PLG8. The eighth layer wiring L8 and the plug PLG8 are formed by copper films, for example. Here, the eighth layer wiring L8 is sometimes called a global layer in the present specification.

Successively, a barrier insulating film BI8 is formed over the interlayer insulating film IL8b, and an interlayer insulating film IL9 is formed over the barrier insulating film BI8. The barrier insulating film BI8 is formed by a stacked film of an SiCN film and an SiCO film, for example. The interlayer insulating film IL9 is formed by a silicon oxide film (SiO$_2$ film), an SiOF film, or a TEOS film, for example. In the barrier insulating film BI8 and the interlayer insulating film IL9, a plug PLG9 is formed so as to be embedded therein. Then, a ninth layer wiring L9 is formed over the interlayer insulating film IL9. The ninth layer wiring L9 is electrically coupled to the eighth layer wiring L8 via the plug PLG9. The plug PLG9 and the ninth layer wiring L9 are formed by aluminum films, for example.

Over the ninth layer wiring L9, a passivation film PAS is formed as a surface protection film, and a part of the ninth layer wiring L9 is exposed from an opening formed in this passivation film PAS. This exposed region of the ninth layer wiring L9 becomes a pad PD. The passivation film PAS has a function of protecting the semiconductor device from impurity intrusion and is formed by a silicon oxide film and a silicon nitride film provided over this silicon oxide film, for example.

Then, a polyimide film PI is formed over the passivation film PAS. This polyimide film PI also has an opening in the region where the pad PD is formed. The pad PD is a region which becomes an electrode of a semiconductor chip including the semiconductor device shown in FIG. 1, and is a region which is electrically coupled to another conductor component via a metal wire or the like in a package mounting the semiconductor chip.

Each of the barrier insulating films BI1 to BI6, BI7a, and BI8 is a liner film which has a function of preventing Cu (copper) in the copper film contacting the lower surface of this barrier insulating film from being diffused into the interlayer insulating film and the like over this barrier insulating film, and also functions as an etching stopper film when a via hole is formed in the interlayer insulating film over this barrier insulating film.

Figure 2:
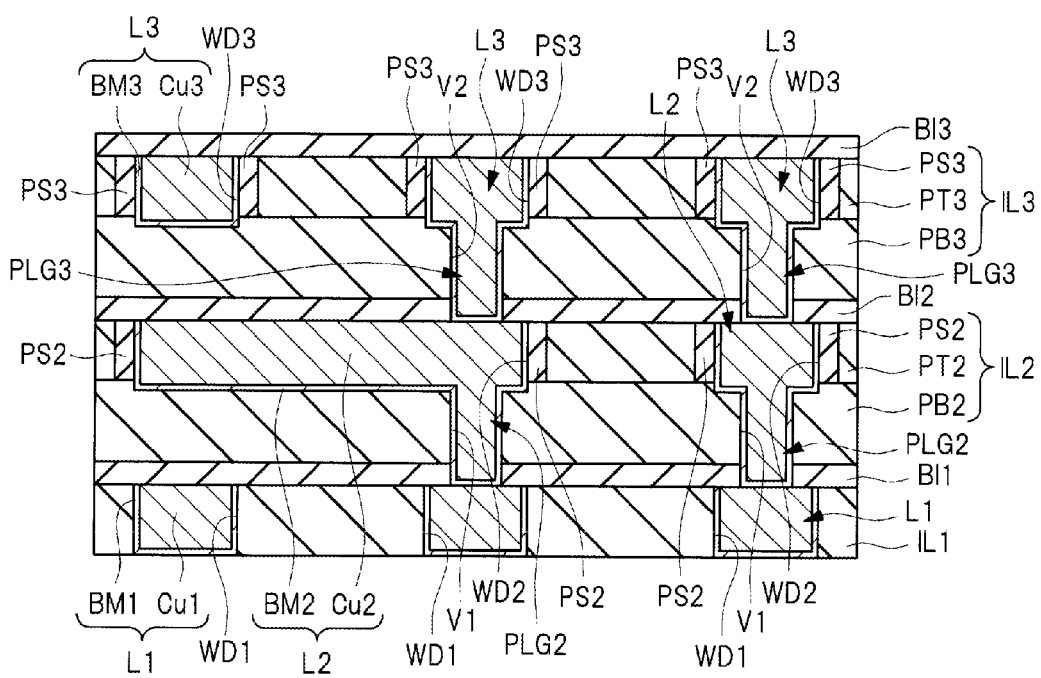
FIG. 2 is an enlarged sectional view showing a part of the semiconductor device shown in FIG. 1.

Next, an enlarged sectional view of the first, second, and third wiring layers is shown in FIG. 2 including the first layer wirings L1, the second layer wirings L2, and the third layer wirings L3 shown in FIG. 1. FIG. 2 shows the first layer wiring L1 of the first fine layer, and the second layer wiring L2 and third layer wiring L3 of the second fine layer formed over this first layer wiring L1. In FIG. 2, the first layer wiring L1 is formed in a wiring trench WD1 which passes through the interlayer insulating film IL1 configured with an SiOC film, for example.

Specifically, the first layer wiring L1 is configured with a barrier conductor film BM1 of a tantalum/tantalum nitride film (hereinafter, tantalum/tantalum nitride film indicates a film configured with a tantalum nitride and tantalum formed over this tantalum nitride), a titanium/titanium nitride film, or the like which is formed on the side wall and the bottom surface of the wiring trench WD1, and also configured with a copper film Cu1 which is formed over this barrier conductor film BM1 so as to fill the wiring trench.

The reason why the copper film is not formed directly in a plurality of the wiring trenches WD1 formed in the interlayer insulating film IL1 but the barrier conductor film BM1 is formed in this manner is to prevent copper configuring the copper film from being diffused into the silicon configuring the semiconductor substrate 1S or the interlayer insulating film such as the interlayer insulating film IL1 by heat treatment. Since the diffusion constant of copper atom into silicon is comparatively large, a copper atom diffused into the interlayer insulating film is easily diffused also into the silicon configuring the semiconductor substrate 1S. In this case, since a semiconductor element such as the MISFET Qn is formed in the semiconductor substrate 1S, the copper atom diffusion into such a formation region causes characteristic degradation represented by a withstand voltage failure in the semiconductor element.

That is, a copper atom is diffused into the interlayer insulating film at a high diffusion constant and thereby line-to-line TDDB characteristic degradation is caused. Therefore, the barrier conductor film BM1 is provided so as to prevent a copper atom from being diffused from the copper film configuring the first layer wiring. That is, the barrier conductor film BM1 is a film having a function of preventing the copper atom diffusion. Note that, as a material of the barrier conductor film, ruthenium (Ru), manganese (Mn), a compound thereof, or the like may be used other than the titanium or tantalum. The line-to-line TDDB characteristic means a characteristic that, when a voltage is applied continuously to an oxide film (corresponding to each of the interlayer insulating films IL2 to IL5 shown in FIG. 1 in the present embodiment), the breakdown rate of the oxide film increases over time. In the following, the line-to-line TDDB characteristic is sometimes simply called the TDDB characteristic. Further, a time until insulation breakdown becomes outstanding by the line-to-line TDDB is called the TDDB lifetime.

Further, as shown in FIG. 2, the barrier insulating film BI1 is formed over the interlayer insulating film IL1 in which the first layer wiring L1 is formed, and the interlayer insulating film IL2 is formed over the barrier insulating film BI1. In this case, the barrier insulating film BI1 is configured with a stacked film of an SiCN film and an SiCO film and the interlayer insulating film IL2 is configured with an SiOC film having a plurality of vacancies inside, for example. The second layer wiring L2 and plug PLG2 are embedded in a wiring trench WD2 which reaches a mid-depth of the interlayer insulating film IL2 and a via hole V1 which passes through the barrier insulating film BI1 and the interlayer insulating film IL2 to reach the upper surface of the first layer wiring L1, respectively.

As with the interlayer insulating film IL2, the interlayer insulating film IL3 is formed over the barrier insulating film BI2. In this case, the barrier insulating film BI2 is configured with a stacked film of an SiCN film and an SiCO film, and the interlayer insulating film IL3 is configured with an SiOC film having a plurality of vacancies inside, for example. The third layer wiring L3 and the plug PLG3 are embedded in a wiring trench WD3 which reaches a mid-depth of the interlayer insulating film IL3 and in a via hole V2 which passes through the barrier insulating film BI2 and the interlayer insulating film IL3 to reach the upper surface of the second layer wiring L2, respectively. The barrier insulating film BI3 is formed so as to cover each upper surface of the interlayer insulating film IL3 and the third layer wiring L3.

Here, the interlayer insulating film IL2 includes, in the inside thereof, a lower insulating layer (first insulating layer) PB2 formed over the barrier insulating film BI1, an upper insulating layer (second insulating layer) PT2, and a side wall insulating layer PS2. The lower insulating layer PB2 is formed in the whole lower surface of the interlayer insulating film IL2, and covers the upper surface of the barrier insulating film BI1 and a part of the upper surface of the first layer wiring L1. The upper insulating layer PT2 is formed over the lower insulating layer PB2 so as to cover the upper surface of the lower insulating layer PB2, and formed in the whole upper surface of the interlayer insulating film IL2.

That is, the interlayer insulating film IL2 has a two-layer structure including the lower insulating layer PB2 and the upper insulating layer PT2 thereover. The side wall insulating layer PS2 is formed over the lower insulating layer PB2 in a region between the upper insulating layer PT2 and the second layer wiring L2. Accordingly, a through hole configured with the wiring trench WD2 and the via hole V1 is formed so as to pass through the side wall insulating layer PS2, the lower insulating layer PB2, the upper insulating layer PT2, and the barrier insulating film BI1. Thereby, the side wall insulating layer PS2 is formed so as to be exposed on the side wall of the wiring trench WD2, and the lower insulating layer PB2 is exposed at the bottom of the wiring trench WD2 and on the side wall of the via hole V1.

The lower insulating layer PB2 is formed in a region having the same height as the via hole V1. In other words, the lower insulating layer PB2 is formed between a plurality of the plugs PLG2 neighboring each other. The upper insulating layer PT2 is formed over the lower insulating layer PB2, and formed between the second layer wirings L2 neighboring each other. That is, the upper insulating layer PT2 is formed in the part higher than the lower surface of the second layer wiring L2 and the lower insulating layer PB2 is formed in the part lower than the lower surface of the second layer wiring L2. Accordingly, the lower insulating layer PB2 is exposed at the lower surface of the interlayer insulating film IL2 and the upper insulating layer PT2 is exposed at the upper surface of the interlayer insulating film IL2.

However, the interface between the lower insulating layer PB2 and the upper insulating layer PT2 does not necessarily have the same height as the lower surface of the second layer wiring L2, that is, the interface between the second layer wiring L2 and the plug PLG2. As shown in FIG. 2, the interface between the lower insulating layer PB2 and the upper insulating layer PT2 may be located at a position higher than the lower surface of the second layer wiring L2. When the bottom surface of the wiring trench WD2 reaches the upper surface of the lower insulating layer PB2 in this manner, the whole side wall of the plug PLG2 in the region contacting the interlayer insulating film IL2 is covered by the lower insulating layer PB2. Thereby, as will be described below, it is possible to obtain an effect of improving the EM characteristic, the TDDB characteristic, and the withstand voltage characteristic in the plug PLG2 and to improve the reliability of the semiconductor device.

As with the above described structure, the interlayer insulating film IL3 includes a lower insulating layer PB3, an upper insulating layer PT3 formed thereover, and a side wall insulating layer PS3 formed on the side wall of a wiring trench WD3. Each of the lower insulating layers PB2 and PB3, the upper insulating layers PT2 and PT3, and the side wall insulating layers PS2 and PS3 includes a vacancy inside. The side wall insulating layers PS2 and PS3 are layers in which the insulating films in the side wall regions of the upper insulating layers PT2 and PT3 are made dense by plasma processing, and the sizes of the inside vacancies are reduced and the hardness in the insulating films is made higher than that in the upper insulating layers PT2 and PT3.

Here, "dense" used in the present specification means that material configuring a film is compressed and has a high density compared to a film to be compared.

Note that, while the lower insulating layer PB2 and the upper insulating layer PT2 are shown as different layers in FIG. 2, the lower insulating layer PB2, the upper insulating layer PT2 and the side wall insulating layer PS2 are integrally formed to configure a single interlayer insulating film IL2. As will be described below, the lower insulating layer PB2 and the upper insulating layer PT2 are formed in a contiguous process. Accordingly, the lower insulating layer PB2, the upper insulating layer PT2, and the side wall insulating layer PS2 are configured with the same SiOC film, for example. The lower insulating layer PB2, the upper insulating layer PT2, and the side wall insulating layer PS2 are different from each other in the size (diameter) of the vacancy formed in each of the layers, as will be described below.

Here, the side wall insulating layer PS2 has a relative permittivity of 3, for example, the lower insulating layer PB2 has a relative permittivity of 2.7, for example, and the upper insulating layer PT2 has a relative permittivity of 2.45, for example.

As shown in FIG. 2, each of the second layer wiring L2 and the plug PLG2 is formed by a stacked film of a barrier conductor film BM2 and a copper film Cu2 as with the first layer wiring L1. The second layer wirings L2 are a plurality of damascene wirings embedded in the respective insides of a plurality of the wiring trenches WD2 formed in the upper surface of the interlayer insulating film IL2, and the barrier conductor film BM2 is formed between the second layer wiring L2 and the interlayer insulating film IL2, as with the first layer wiring L1.

Further, the third layer wiring L3 and the plug PLG3 are embedded in a plurality of the wiring trenches WD3 which reaches a mid-depth of the interlayer insulating film IL3 and in a via hole V2 which passes through the barrier insulating film BI2 and the interlayer insulating film IL3 to reach the upper surface of the second layer wiring L2, respectively. The third layer wiring L3 and the plug PLG3 are also formed by a stacked film of a barrier conductor film BM3 and a copper film Cu3.

Here, a layer including a plurality of the sixth layer wirings L6 and seventh layer wirings L7, in which the wirings are arranged at an interval (wiring pitch) wider than the minimum interval (wiring pitch) between the second layer wirings L2, the minimum interval between the third layer wirings L3, the minimum interval between the fourth layer wirings L4, and the minimum interval between the fifth layer wirings L5 shown in FIG. 1, is called the semi-global layer. Further, a layer including the first layer wiring L1 to the fifth layer wiring L5 each having a wiring pitch narrower than that of the semi-global layer is called the fine layer. In particular, the layer including a plurality of the first layer wirings L1 is called a first fine layer, and the layer including the second layer wiring L2 to the fifth layer wiring L5 is called a second fine layer.

Since the wiring pitch in the second fine layer is narrow compared to the semi-global layer, it is important that the interlayer insulating film in the second fine layer has a relative permittivity lower than the interlayer insulating film in the semi-global layer. Further, since the wiring pitch in the second fine layer is narrow compared to the semi-global layer, it is necessary to prevent reliability degradation of the interlayer insulating film by suppression of variation in the relative permittivity in the interlayer insulating film, suppression of increase in the relative permittivity caused by a process damage in the interlayer insulating film, and the like, in the second fine layer.

FIG. 2 shows the second layer wiring L2 in a region which extends in the cross-sectional direction of FIG. 2 and does not contact the plug PLG3 on the upper surface, as one of the second layer wirings L2 embedded in the wiring trenches WD2 in the upper surface of the interlayer insulating film IL2. That is, the upper surface of the second layer wiring L2 has a region which does not contact the plug PLG3 and is covered by the interlayer insulating film IL3, and most parts of the upper surfaces in the many second layer wirings L2 are covered by the interlayer insulating film IL3. Here, since the whole lower part within the interlayer insulating film IL3 is configured with the lower insulating layer PB3 which includes the small diameter vacancy 9, the whole region where the plug PLG3 is not formed, that is, the whole upper surface of the second layer wiring L2 directly under the region between a plurality of the plugs PLG3 is covered by the lower insulating layer PB3.

Figure 3:
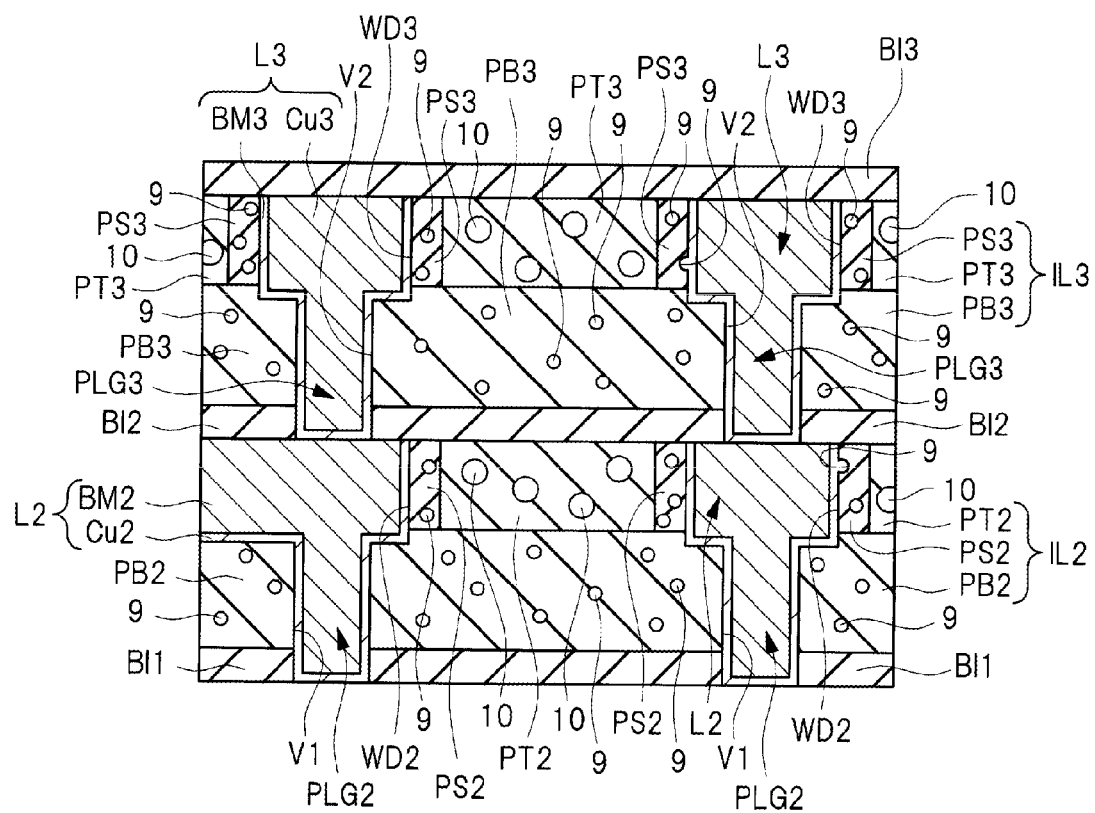
FIG. 3 is an enlarged sectional view showing a part of the semiconductor device shown in FIG. 2.

Here, FIG. 3 shows a cross-sectional view enlarging a region of FIG. 2 including the interlayer insulating films IL2 and IL3, the second layer wiring L2, the third layer wiring L3, and the plugs PLG2 and PLG3. As shown in FIG. 3, a plurality of the vacancies 10 and a plurality of the vacancies 9 having an average diameter smaller than the vacancies 10 are formed in the interlayer insulating film IL2. In the interlayer insulating film IL2, the vacancy 9 is not formed but the vacancy 10 is formed in the upper insulating layer PT2, and the vacancy 10 is not formed but the vacancy 9 is formed in the side wall insulating layer PS2 and the lower insulating layer PB2.

That is, the interlayer insulating film IL2 includes a plurality of the vacancies inside, and, out of the vacancies, the vacancy in the lower part within the interlayer insulating film IL2 is smaller than the vacancy in the upper part within the interlayer insulating film IL2. Further, out of the vacancies in the upper part of the interlayer insulating film IL2, the vacancy formed in the side wall exposed to the inside of the wiring trench WD2 which is opened in the interlayer insulating film is smaller than the other vacancies in the upper part of the interlayer insulating film IL2. Note that, here, while the average diameters of the vacancies included in the side wall insulating layer PS2 and the lower insulating layer PB2 are assumed to be approximately the same, one of the average diameters of the vacancies included in the side wall insulating layer PS2 and the lower insulating layer PB2 may be larger than the other.

The structure inside the interlayer insulating film IL3 is the same as that of the interlayer insulating film IL2, and vacancies 10 in the upper insulating layer PT3 have an average diameter larger than vacancies 9 in the side wall insulating layer PS3 and the lower insulating layer PB3.

The vacancies 9 and 10 shown in FIG. 3 are voids formed at positions where porogen has been formed, by means of forming an insulating film which has a plurality of vacancies including the porogen gas by a plasma CVD method to be described below or the like and then eliminating the porogen from the insulating film.

In the present embodiment, the interlayer insulating film in which the vacancy 9 or 10 is formed (e.g., interlayer insulating film IL2 or IL3) is explained to be defined as a porous low-k film. The porous low-k film configures the interlayer insulating films IL2 to IL5 (refer to FIG. 1) which are the second fine layer, for example. That is, each of the interlayer insulating films IL2 to IL5 includes a plurality of the vacancies inside thereof. The porous low-k film is an insulating film in which the permittivity is reduced by the formation of inside vacancy compared to an insulating film without including a vacancy inside such as a silicon oxide film. Thus, the porous low-k film having a high vacancy density (vacancy occupation rate) has a low permittivity and a low elastic modulus compared to the interlayer insulating film having a low vacancy density.

The reason why the vacancy is formed in the interlayer insulating film of the second fine layer and the permittivity thereof is reduced in this manner is that the wirings in the second fine layer shown in FIG. 1 are arranged at a wiring pitch (minimum interval between the wirings) narrower than the wiring pitch in the semi-global layer such as the sixth layer wiring L6 or the seventh layer wiring L7. That is, in the second fine layer having a small wiring pitch, the interlayer insulating film preferably has a relative permittivity lower than the interlayer insulating film in the semi-global layer. In the fine layer, it is possible to prevent generation of wiring delay which is proportional to a product of a wiring resistance and a wiring parasitic capacitance in the semiconductor device, by using the interlayer insulating film having a low relative permittivity. Further, it is possible to increase a withstand voltage between the second layer wirings L2, for example, by using the interlayer insulating film having a low relative permittivity.

Note that, in FIG. 3, the film thickness in each of the barrier insulating films BI1 to BI3 is 40 nm, for example. Further, the film thickness in each of the interlayer insulating films IL2 and IL3 is 150 nm, for example. Further, the depth in each of the wiring trenches WD2 and WD3, that is, the thickness in each of the second layer wiring L2 and the third layer wiring L3 is 100 nm, for example. The film thickness (length) in each of the plugs PLG2 and PLG3 under the wirings is 90 nm, for example. Accordingly, in the film thickness direction of the interlayer insulating film IL2, for example, the lower insulating layer PB2 has a height of approximately 50 nm, and each of the upper insulating layer PT2 and the side wall insulating layer PS2 has a height of approximately 100 nm.

Further, each of the interlayer insulating film IL3 and the interlayer insulating films IL4 and IL5 shown in FIG. 1 has the same structure as the interlayer insulating film IL2 which is the porous low-k film shown in FIG. 3. That is, the vacancies 9 and 10 shown in FIG. 3 are formed in each of the interlayer insulating film IL3 and the interlayer insulating films IL4 and IL5 which are the second fine layer. That is, each of the interlayer insulating films IL3 to IL5 has the same structure as the structure of the lower insulating layer PB2, the upper insulating layer PT2, and the side wall insulating layer PS2 shown in FIG. 3.

Also, it is conceivable that vacancies having an average diameter smaller than the vacancies 10 are formed in each of the interlayer insulating film IL1 which is the first fine layer and the interlayer insulating films IL6 and IL7 which are the semi-global layers. While the vacancy is assumed here not to be formed in each of the interlayer insulating films IL1, IL6 and IL7, the vacancy may be formed in each of the interlayer insulating films IL1, IL6 and IL7.

Here, there is a possibility that a plurality of the vacancies contacts each other and a number of vacancies are formed each having a deformed shape in the interlayer insulating film. Accordingly, the average diameter of the vacancies referred to in the present application is assumed to indicate an average diameter value of spheres when a plurality of the vacancies in the interlayer insulating film are assumed as the spheres having the respective volumes thereof. Here, the average diameter of the vacancies 10 shown in FIG. 3 is not smaller than 1.0 nm and the average diameter of the vacancies 9 is smaller than 1.0 nm.

As a measuring method of the average vacancy diameter, there is a method of using a positron-positronium lifetime measurement system using a slow positron beam. This measurement method measures the vacancy diameter by forming positronium by irradiating the vacancy in the interlayer insulating film with a positron beam and measuring a time until this positronium is annihilated, and the time until the positronium is annihilated becomes longer as the vacancy diameter is larger. For the above measurement apparatus, a measurement apparatus using a slow positron beam is disclosed in Japanese Patent Laid-Open No. 2008-232759, for example.

When the interlayer insulating film is formed by the porous low-k film, there is an idea that the vacancies having a relatively large average diameter like the vacancies 10 are distributed in the whole region of the interlayer insulating film and the occupation rate of vacancies is increased in the interlayer insulating film, for the purpose of reducing the permittivity of the interlayer insulating film. On the other hand, the interlayer insulating film of the present embodiment has a feature to have the lower insulating layer PB2 including a plurality of the vacancies 9 having a relatively small average diameter, the upper insulating layer PT2 including a plurality of the vacancies 10 having a relatively large average diameter, and the side wall insulating layer PS2 including a plurality of the vacancies 9 having a relatively small average diameter, as with the interlayer insulating film IL2 shown in FIG. 2. That is, the vacancies each having approximately the same diameter are not formed in the whole region of the interlayer insulating film IL2, but the average diameter of the vacancy 9 formed between a plurality of the via holes V1 and in the side wall of the wiring trench is made smaller than that of the vacancies 10 in the other region, in the interlayer insulating film IL2.

Here, the upper insulating layer PT2 is a less dense layer having a larger vacancy average diameter in the layer and a larger occupation rate of the vacancy (vacancy occupation rate) in the layer, than the side wall insulating layer PS2 or the lower insulating layer PB2. Accordingly, the upper insulating layer PT2 has a lower permittivity and a lower elastic modulus than the side wall insulating layer PS2 or the lower insulating layer PB2. That is, the side wall insulating layer PS2 or the lower insulating layer PB2 is a layer having a high elastic modulus and a large internal stress compared to the upper insulating layer PT2.

In the following, there will be explained an effect of the semiconductor device of the present embodiment.

When a plurality of the vacancies is formed in the interlayer insulating film in which wiring is embedded and the permittivity of the interlayer insulating film is reduced for reduction of capacitance generated between the wirings and other purposes, there is an idea that a plurality of the vacancies having the same diameter is formed in the whole region of the interlayer insulating film. In this case, the vacancies formed in the interlayer insulating film have a higher vacancy occupation rate in the interlayer insulating film and therefore the permittivity of the interlayer insulating film is reduced as the diameter thereof becomes larger.

However, when the relatively large vacancy having the same diameter as the vacancy in the interlayer insulating film located at the same height as the wiring (interlayer insulating film between the neighboring wirings) is formed in the interlayer insulating film located at the same height as the via which couples the upper and the lower wirings with each other (interlayer insulating film between the neighboring vias), there arises a problem that the EM characteristic (EM lifetime) is degraded in the metal wiring including the via and further the TDDB characteristic (lifetime) is degraded between the metal wirings. Here, the EM (Electro-Migration) is an phenomenon that a metal atom of wiring material causes mass transportation by obtaining a kinetic momentum via the electron flow direction from influence of collision with an electron, and a void is formed in a metal wiring and the like by this EM (Electro-Migration) and causes increase in a resistance value, disconnection, and the like in the metal wiring. The EM occurs not only in a wiring extending in a direction along the major surface of a semiconductor substrate but also in a plug (via).

In this manner, the vacancy formed in the interlayer insulating film can reduce the permittivity of the interlayer insulating film and reduce capacitance generated between the wirings embedded in the interlayer insulating film and the like by means of increasing the size (diameter) thereof. On the other side, when the diameter of the vacancy is increased in the interlayer insulating film between the neighboring vias, the degradation of the EM characteristic or the TDDB characteristic is caused considerably, there arises a problem such as the increase in the resistance value of the metal wiring including the plug (via), and the reliability of the semiconductor device is degraded. That is, when a plurality of the vacancies in the interlayer insulating film is made larger as a whole in the interlayer insulating film, the voids are easily caused particularly in the part of the plug (via).

One of the reasons why such a problem is caused is that the vacancy having a large diameter is exposed on the side surface of the wiring trench in which the metal wiring is embedded or the via hole in which the via is embedded, and thereby adhesion is degraded between the barrier conductor film, which covers the surface of the metal wiring and the via, and the interlayer insulating film. When the wiring trench and the via hole are formed in the interlayer insulating film, a trench and a through hole are provided by means of processing the interlayer insulating film by a dry etching method, as will be described below. Here, when a plurality of the vacancies is formed in the interlayer insulating film, the surfaces of some vacancies are exposed on the side wall and the bottom surface of the wiring trench and on the side wall of the via hole to form unevenness there, and sometimes flatness of these surfaces is degraded.

When the barrier conductor film is formed on such a side wall, it becomes more difficult to form the barrier conductor film uniformly as the vacancy diameter becomes larger. That is, it is difficult to form the barrier conductor film over the surfaces of the vacancies exposed on the side wall and bottom surface of the wiring trench and on the side wall of the via hole, and there is a possibility that the thickness of the barrier conductor film formed on the surface of the exposed vacancy becomes thin or the barrier conductor film is not formed. In a region where the barrier conductor film is not formed, adhesion between the metal wiring and the interlayer insulating film is degraded and thus the EM is caused considerably. Further, as described above, the barrier conductor film is a film which has a function of preventing diffusion of a copper atom which mainly configures the metal wiring, and therefore the copper atom is diffused into the interlayer insulating film in a region where the barrier insulation film is not formed and the line-to-line TDDB characteristic is degraded.

Further, another reason why the EM characteristic is degraded considerably when the vacancy diameter is increased in the interlayer insulating film between the neighboring vias, is that the vacancy diameter becomes large in the upper layer interlayer insulating film covering over the upper surface of the metal wiring embedded in the upper part of the lower layer interlayer insulating film, and thereby the elastic modulus is reduced in the bottom surface of the upper layer interlayer insulating film. That is, when the elastic modulus is reduced in the bottom surface of the interlayer insulating film which is formed over the metal wiring via the barrier insulating film, stress in the interlayer insulating film is reduced and force which presses the metal wiring of the lower layer from above is reduced, and thereby a void is generated in the metal wiring caused by the EM.

In this case, when current flows in the metal wiring, tensile stress becomes large in the metal wiring on the cathode side, and, when this tensile stress exceeds a critical stress, a void is generated in the metal wiring. The critical stress depends on the elastic modulus of the interlayer film formed around the metal wiring, and the critical stress increases and the void is generated less frequently as this elastic modulus is higher.

In addition, as another problem, there is a problem that, when a position where the barrier conductor film is not formed exists on the side walls of the wiring trench and the like, water easily intrudes into the interlayer insulating film from such a position. When the surface layer of the interlayer insulating film exposed on the side wall of the wiring trench and the like is not dense and has soft states, there arises a problem that moisture adsorption from such a surface becomes particularly outstanding.

When the interlayer insulating film (porous low-k film) adsorbs moisture, there is a possibility that the surface of the metal wiring (damascene wiring) neighboring the porous low-k film is oxidized by water included in the porous low-k film and copper in the damascene wiring is diffused into the porous low-k film. Thereby, the line-to-line TDDB lifetime becomes short in the wirings arranged in parallel in the porous low-k film.

Further, when the surface of the damascene wiring neighboring the porous low-k film is oxidized by water included in the porous low-k film, there is a possibility that adhesion is degraded between the damascene wiring and the porous low-k film or another insulating film neighboring the damascene wiring. In this case, the EM lifetime of the damascene wiring formed in the porous low-k film becomes short and reliability of the porous low-k film is degraded. Further, that the porous low-k film comes to include water easily causes degradation of a withstand voltage between the wirings arranged via the porous low-k film, and results in degradation of an electric characteristic of the porous low-k film.

In the semiconductor device of the present embodiment, the barrier conductor film having a function of causing the metal wiring and the interlayer insulating film to adhere to each other is formed so as to cover the side walls which are exposed to each inside of the wiring trench and the via hole, and, for improving the reliability thereof, the average diameter of the vacancy exposed on the side wall is made smaller than that of the vacancy formed in the upper layer within the interlayer insulating film. Specifically, as shown in FIG. 3, the side wall insulating layer PS2 including the vacancy 9 which has a relatively small diameter is formed on the surface of interlayer insulating film in the region exposed on the side wall of the wiring trench WD2. Further, the lower insulating layer PB2 including the vacancy 9 which has a relatively small diameter is formed on the bottom surface of the wiring trench WD2 and on the side wall of the via hole V1.

Accordingly, the diameter of vacancy in the interlayer insulating film IL2 which is exposed on the side walls of the wiring trench WD2 and the via hole V1 is made smaller than that of the vacancy 10 in the upper insulating layer PT2, and thereby it is possible to improve coverage of the barrier conductor film BM2 over the surfaces of the second layer wiring L2 and the plug PLG2. That is, when the barrier conductor film BM2 is formed on the surfaces of the vacancies 9 which are exposed on the side walls of the wiring trench WD2 and the via hole V1, it is possible to prevent occurrence of the problem such as one that the film thickness of the barrier conductor film BM2 becomes thin or the barrier conductor film BM2 is not formed.

In this manner, it is possible to prevent the degradation of adhesion between the second layer wiring L2 and plug PLG2 and the interlayer insulating film IL2 which is caused by formation failure of the barrier conductor film BM2 and to prevent the occurrence of the EM, and thereby it is possible to improve the reliability of the semiconductor device. Further, since it is possible to prevent generation of a region where the barrier insulating film is not formed, it is possible to prevent copper atoms configuring the second layer wiring L2 and the plug PLG2 from being diffused into the interlayer insulating film IL2 and to prevent the degradation of the line-to-line TDDB characteristic, and resultantly it is possible to improve the reliability of the semiconductor device.

That is, while the permittivity can be reduced by means of increasing the vacancy occupation rate in the upper part within the interlayer insulating film, there arises a problem that a void is easily generated at the part of the plug (via) in the lower part within the interlayer insulating film when the vacancy occupation rate is increased excessively. Accordingly, in the present embodiment, the whole layer of the height where the plug (via) is formed, that is, the whole layer between a plurality of the plugs (vias) embedded in the interlayer insulating film IL2 is configured with the lower insulating layer PB2 and the relatively small vacancy 9 is formed therein, and thereby increase of the permittivity in the lower insulating layer PB2 is suppressed to a minimum and also the degradation of the EM characteristic and the TDDB characteristic is prevented. These effects also can be obtained in each of the interlayer insulating films IL3 to IL5 (refer to FIG. 1) and the like over the interlayer insulating film IL2 by means of forming the same structure.

Note that, only for reducing the sizes of the vacancies exposed on the side walls of the wiring trench and the via hole, it might not be necessary to reduce the vacancy diameter in the interlayer insulating film except the regions exposed on the side walls of the wiring trench and the via hole. However, when the vacancy diameter is large in the lower part within the interlayer insulating film, the internal stress is reduced in the lower part within the interlayer insulating film, and thereby it is difficult to press the metal wiring formed under the interlayer insulating film via the barrier insulating film and the like as described above, and there arises a problem that the EM lifetime is reduced in the metal wiring.

Accordingly, in the present embodiment, as shown in FIG. 3, the lower insulating layer PB2 with the diameter of the inside vacancy 9 reduced is formed along the whole lower surface of the interlayer insulating film IL2 not only in the interlayer insulating film IL2 of a region exposed on the side wall of the via hole V1. Here, each of the interlayer insulating film IL3, the interlayer insulating films IL4 and IL5 (refer to FIG. 1) in the upper layers thereof, and the like has the same structure as the interlayer insulating film IL2. For example, as shown in FIG. 2, while the upper surface of the second layer wiring L2 which extends along the upper surface of the semiconductor substrate (not shown in the drawing) is covered by the interlayer insulating film IL3, also in a region except the vicinity of the plug PLG3 contacting the upper surface of the second layer wiring L2, the upper surface of the second layer wiring L2 is covered by the lower insulating layer PB3 in which a relatively small vacancy 9 (refer to FIG. 3) is formed.

When the vacancy size is reduced only at the vicinity of the via hole in the interlayer insulating film, in a region apart from the via hole, since the vacancy becomes large in the interlayer insulating film covering the upper surface of the metal wiring of the lower layer, the elastic modulus is reduced in this region of the interlayer insulating film and the stress is reduced, and thereby the EM characteristic is degraded in the metal wiring of the lower layer.

On the other hand, in the present embodiment, the lower insulating layer PB3 including the relatively small vacancy 9 is formed in the whole layer having the same height as the via hole V2 in the interlayer insulating film IL3, that is, in a region including the whole lower surface of the interlayer insulating film IL3. In other words, the vacancy 10 is not formed in the lower insulating layer PB3. That is, the whole layer between a plurality of the plugs (vias) PLG3 which pass through the interlayer insulating film IL3 is configured with the lower insulating layer PB3 which has a smaller inside vacancy diameter and a higher elastic modulus than the upper insulating layer PT3.

The elastic modulus is increased in the lower insulating layer PB3 which is a part of the interlayer insulating film IL3 and the stress is increased in the interlayer insulating film IL3 in the upper part of the second layer wiring L2. When the elastic modulus is increased in the lower insulating layer PB3 over the second layer wiring L2, the critical stress is increased in the second layer wiring L2, and, therefore, even if the tensile stress is increased in the second layer wiring L2 because of the current flow in the second layer wiring L2, this tensile stress does not exceed the critical stress and it is possible to prevent the void generation. That is, by fixing the second layer wiring L2, which is formed on the lower surface of the interlayer insulating film IL3 via the barrier insulating film BI2, by the stress of the lower insulating layer PB3, it is possible to prevent the degradation in the EM characteristic of the second layer wiring L2 and therefore it is possible to improve the reliability of the semiconductor device.

Further, in the present embodiment, not only the lower insulating layer PB3 over the second layer wiring L2, but also the lower insulating layer PB2 under the second layer wiring L2 has a high elastic modulus compared to the upper insulating layer PT2, and therefore it is possible to further increase the critical stress of the second layer wiring L2 and it is possible to prevent the degradation of the EM characteristic in the second layer wiring L2.

Further, for the problem that water easily intrudes into the interlayer insulating film from the side walls of the wiring trench and the like, in the present embodiment, the surface layer is made denser and has a higher hardness in the interlayer insulating film exposed on the side walls of the wiring trench and the like, and thereby moisture adsorption from such a surface can be prevented. That is, by forming the side wall insulating layer PS2, which is made dense and has a reduced average vacancy diameter compared to the upper insulating layer PT2, on the side wall of the interlayer insulating film IL2 exposed on the side wall of the wiring trench WD2, water is prevented from intruding into the interlayer insulating film IL2 from the side wall of the wiring trench WD2.

Note that the side wall insulating layer PS2 is a layer formed by plasma processing such as an etching process to be described below when the wiring trench WD2 is formed in the upper surface of the interlayer insulating film IL2. While not shown in the drawing, a layer which is denser than the upper insulating layer PT2 is formed similarly also on the bottom surface of the wiring trench WD2. Further, also on the side wall of the via hole V1, a denser layer is formed similarly by the plasma processing such as an etching process. However, the side wall of the interlayer insulating film IL2 is made dense more notably on the side wall of the wiring trench WD2 than on the side wall in the via hole V1. As described above, by the denser side walls of the wiring trench WD2 and the via hole V1, it is possible to prevent the interlayer insulating film IL2 from adsorbing moisture, to prevent the degradation of the EM characteristic and the line-to-line TDDB characteristic, and to prevent the degradation of the electric characteristic of the porous low-k film, and therefore it is possible to improve the reliability of the semiconductor device.

Figure 43:
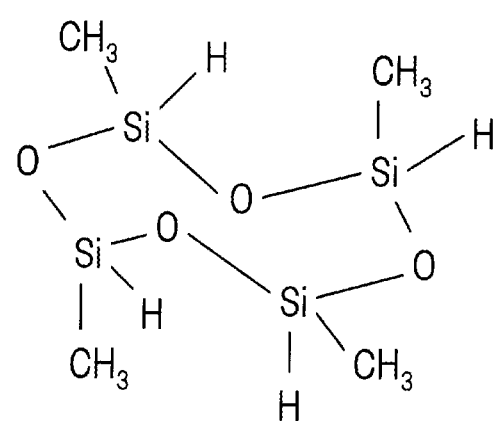
FIG. 43 is a molecular structure chart of an interlayer insulating film.
Figure 44:
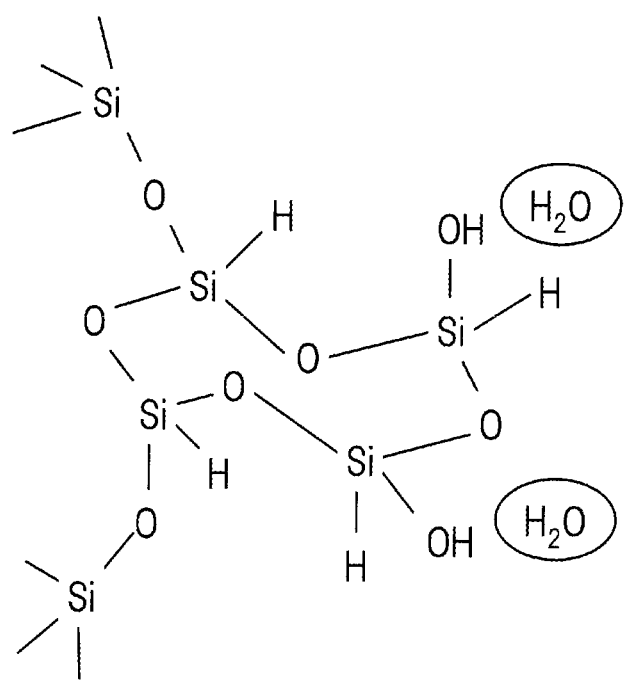
FIG. 44 is a molecular structure chart of an interlayer insulating film.

In the following, there will be explained the reason why the side wall insulating layer PS2 is made denser and the vacancy diameter is reduced by the plasma processing, and the like, by the use of FIG. 43 and FIG. 44. FIG. 43 and FIG. 44 are molecular structure charts showing chemical formulae of the porous low-k films (interlayer insulating films).

For example, the SiOC film configuring the upper insulating layer PT2 (refer to FIG. 3) has a molecular structure shown in FIG. 43. In the SiOC film, a methyl group ($CH_3$) is bonded to silicon (Si) and, when the plasma processing is performed on this SiOC film, the bond between the silicon (Si) and the methyl group ($CH_3$) is dissolved and oxygen (O) or an OH group (hydroxy group) is bonded to the silicon (Si) as in the molecular structure shown in FIG. 44. Accordingly, by the plasma processing, the conversion from Si—$CH_3$ into Si—O or Si—OH progresses in the film surface of the upper insulating layer PT2.

That is, the number of Si—$CH_3$ bonds is reduced and the number of the Si—O or Si—OH bonds is increased in the side wall insulating layer PS2 in which the film is made dense, compared to the upper insulating layer PT2 shown in FIG. 3. Thereby, in the side wall insulating layer PS2, compared to the upper insulating layer PT2, the amount of carbon (C) is reduced and the film structure is compressed to be dense, and thereby the average diameter of the inside vacancy 9 also becomes smaller than that of the vacancy 10 and the permittivity becomes higher.

Note that, as shown in FIG. 44, water ($H_2O$) is easily adsorbed by the OH group (hydroxy group) and therefore it is conceivable that water is adsorbed onto the surface of the side wall insulating layer PS2 (refer to FIG. 3).

Figure 12:
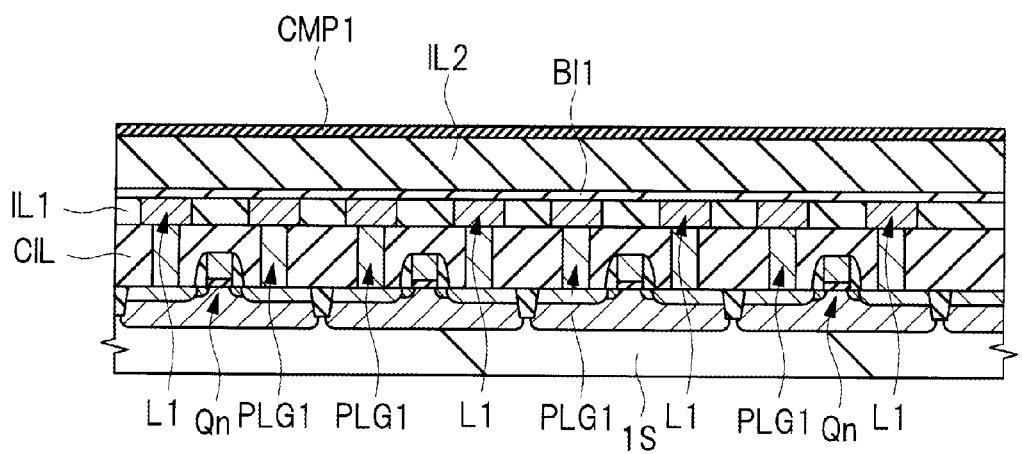
FIG. 12 is a cross-sectional view showing a method of manufacturing a semiconductor device succeeding FIG. 11.
Figure 13:
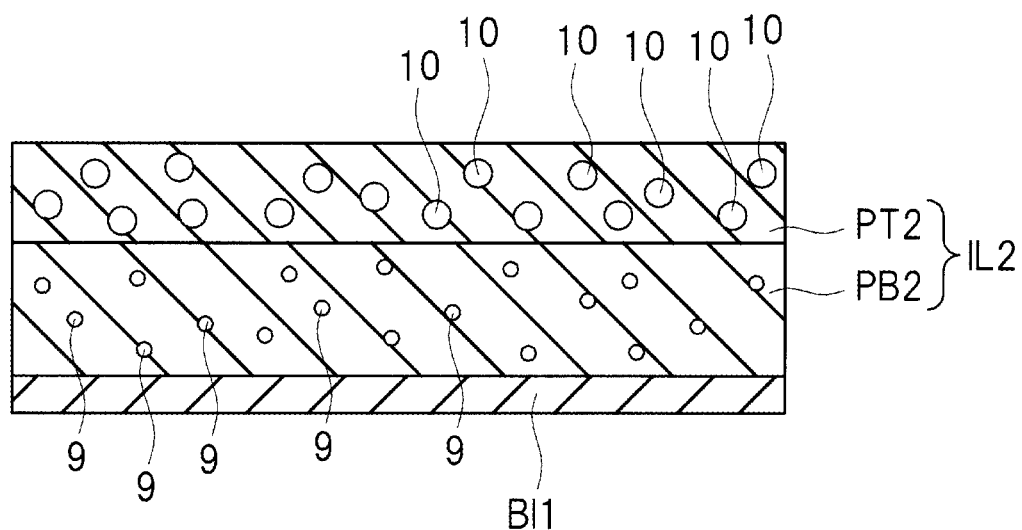
FIG. 13 is an enlarged sectional view specifically explaining a process explained by the use of FIG. 12.
Figure 14:
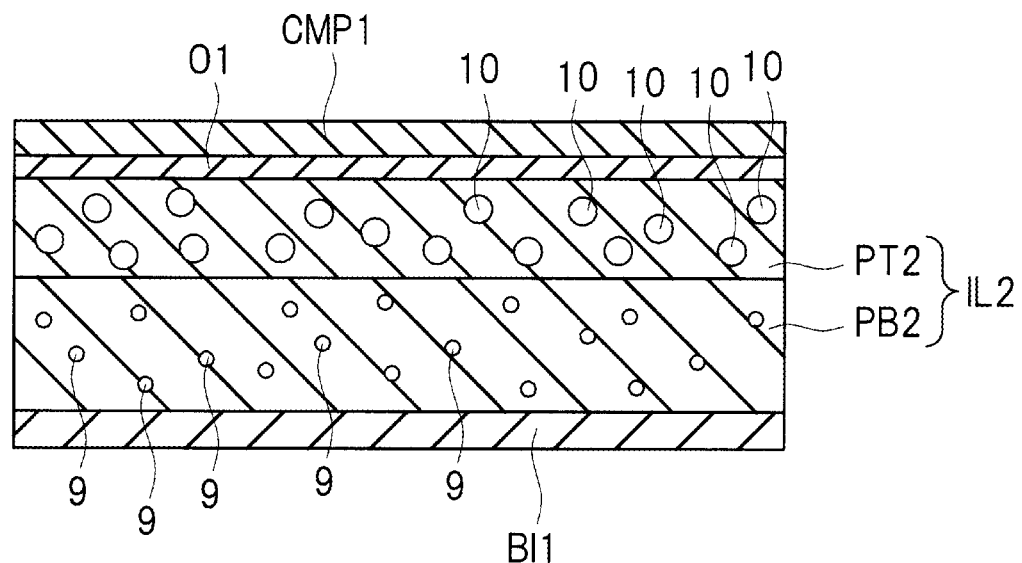
FIG. 14 is an enlarged sectional view specifically explaining a process explained by the use of FIG. 12.

Next, there will be explained a method of manufacturing a semiconductor device of the above described present embodiment by the use of FIG. 4 to FIG. 35. FIG. 4 to FIG. 12, FIG. 15 to FIG. 19, and FIG. 21 to FIG. 35 are cross-sectional views showing a method of manufacturing a semiconductor device in the present embodiment including the MISFET Qn. FIG. 13 and FIG. 14 are enlarged cross-sectional views for detailed explanation of a process to be explained by the use of FIG. 12. FIG. 20 is an enlarged cross-sectional view for detailed explanation of a process to be explained by the use of FIG. 19. Note that the present embodiment is a technique relating to an interlayer insulating film neighboring a metal wiring, and therefore detailed explanation of a process of forming the MISFET will be omitted here.

Figure 4:
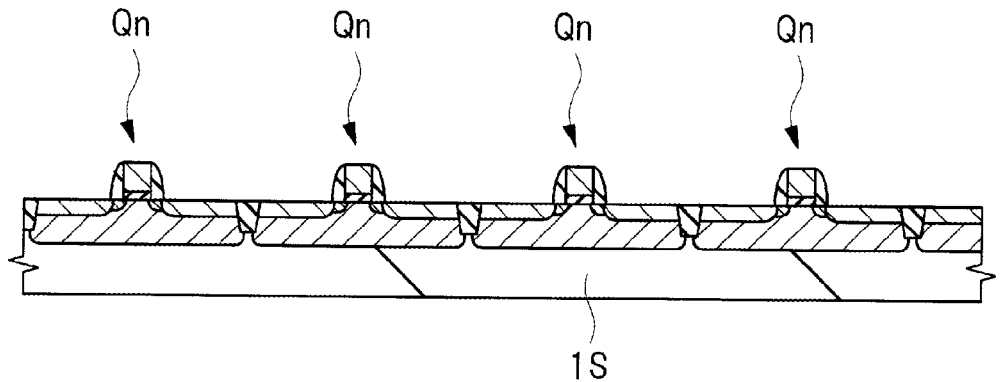
FIG. 4 is a cross-sectional view showing a method of manufacturing a semiconductor device in an embodiment of the present invention.
Figure 5:
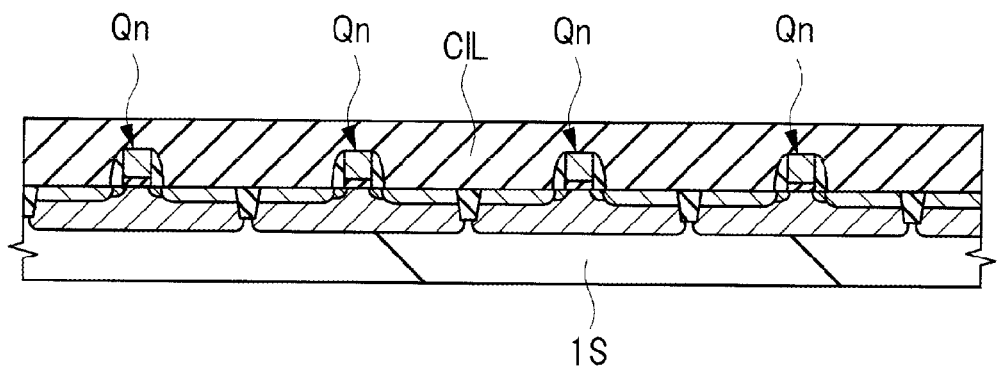
FIG. 5 is a cross-sectional view showing a method of manufacturing a semiconductor device succeeding FIG. 4.

First, as shown in FIG. 4, a plurality of the MISFETs Qn is formed over the semiconductor substrate 1S by the use of a typical semiconductor manufacturing technique. Successively, as shown in FIG. 5, the contact interlayer insulating film CIL is formed over the semiconductor substrate 1S where the MISFETs Qn are formed. This contact interlayer insulating film CIL is formed so as to cover the MISFETs Qn. Specifically, the contact interlayer insulating film CIL is formed by a stacked film of an ozone TEOS film which is formed by a thermal CVD method using ozone and TEOS as source and a plasma TEOS film which is disposed over this ozone TEOS film and formed by a plasma CVD method using TEOS as source, for example. Note that an etching stopper film configured with a silicon nitride film, for example, may be formed in the lower layer of the ozone TEOS film.

Figure 6:
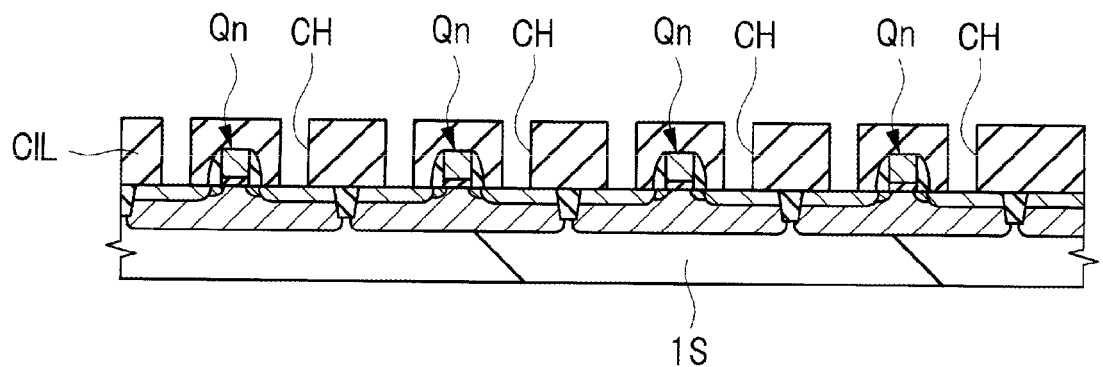
FIG. 6 is a cross-sectional view showing a method of manufacturing a semiconductor device succeeding FIG. 5.

Next, as shown in FIG. 6, a contact hole CH is formed in the contact interlayer insulating film CIL by the use of a photolithography technique and an etching technique. This contact hole CH is processed so as to pass through the contact interlayer insulating film CIL to reach the source region or the drain region of the MISFET Qn formed over the semiconductor substrate 1S.

Figure 7:
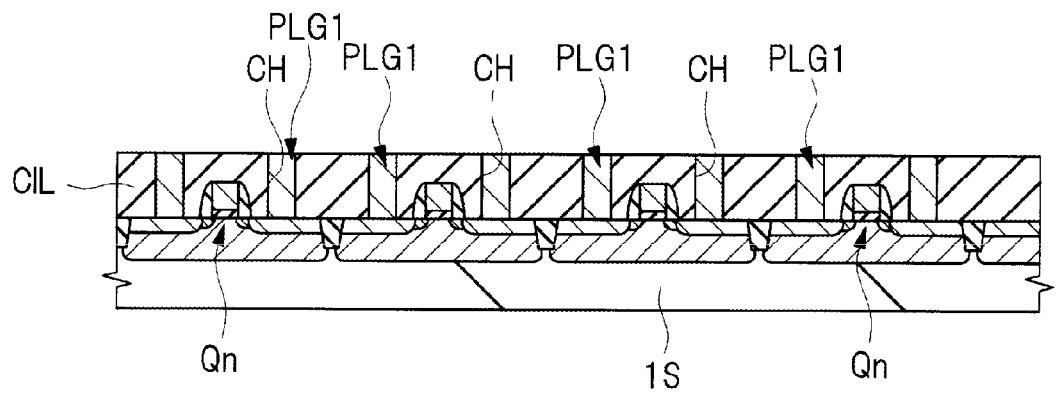
FIG. 7 is a cross-sectional view showing a method of manufacturing a semiconductor device succeeding FIG. 6.

Successively, as shown in FIG. 7, the plug PLG1 is formed by means of embedding a metal film into the contact hole CH formed in the contact interlayer insulating film CIL. Specifically, over the contact interlayer insulating film CIL in which the contact hole CH is formed, a titanium/titanium nitride film is formed as the barrier conductor film by using a sputtering method, for example. Then, a tungsten film is formed over the titanium/titanium nitride film. Thereby, the titanium/titanium nitride film is formed on the inner wall of the contact hole CH (side wall and bottom surface), and the tungsten film is formed over the titanium/titanium nitride film so as to fill the contact hole CH. After that, the unnecessary titanium/titanium nitride film and tungsten film formed over the contact interlayer insulating film CIL are removed by a CMP method. Thereby, the plug PLG1 configured with the embedded titanium/titanium nitride film and tungsten film can be formed only within the contact hole CH.

Figure 8:
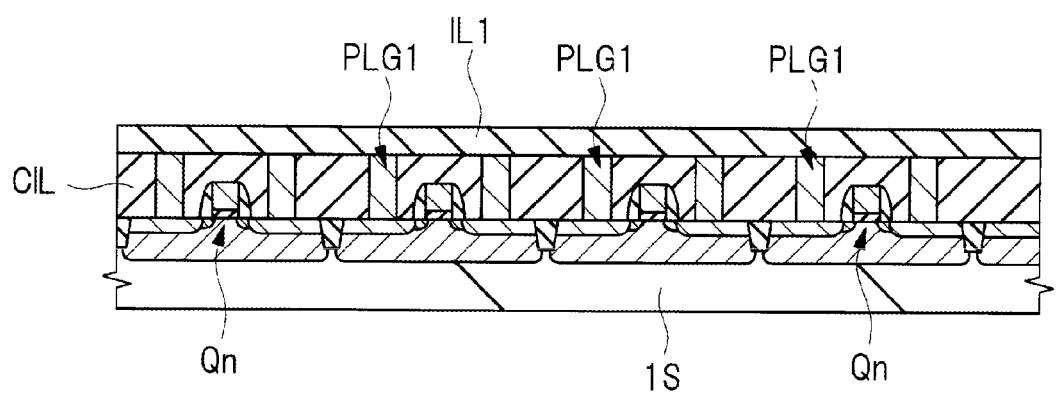
FIG. 8 is a cross-sectional view showing a method of manufacturing a semiconductor device succeeding FIG. 7.

Next, as shown in FIG. 8, the interlayer insulating film IL1 is formed over the contact interlayer insulating film CIL in which the plug PLG1 is formed. This interlayer insulating film IL1 is formed by an SiOC film which is a low-k film having a relative permittivity lower than the passivation film PAS shown in FIG. 1, for example, and is formed by the use of a plasma CVD method, for example.

Figure 9:
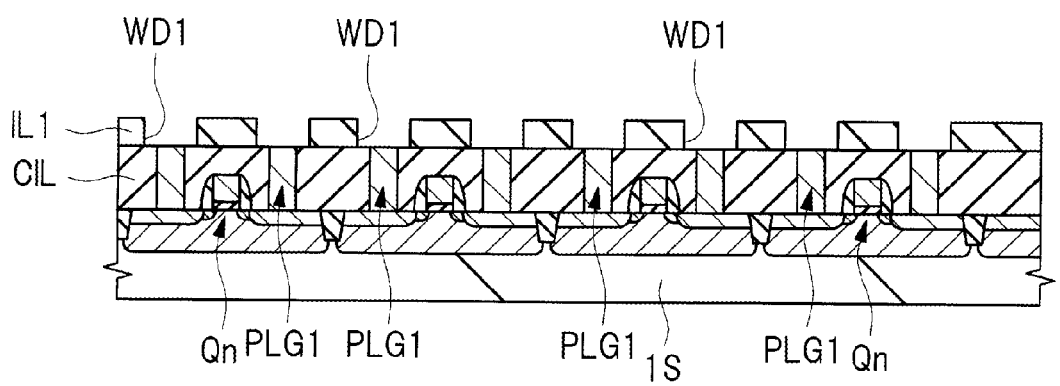
FIG. 9 is a cross-sectional view showing a method of manufacturing a semiconductor device succeeding FIG. 8.

Then, as shown in FIG. 9, the wiring trench WD1 is formed in the interlayer insulating film IL1 by the use of a photolithography technique and an etching technique. This wiring trench WD1 is formed so as to pass through the interlayer insulating film IL1 which is configured with the SiOC film and to reach the contact interlayer insulating film CIL at the bottom surface. Thereby, the surface of the plug PLG1 is exposed at the bottom part of the wiring trench WD1.

Figure 10:
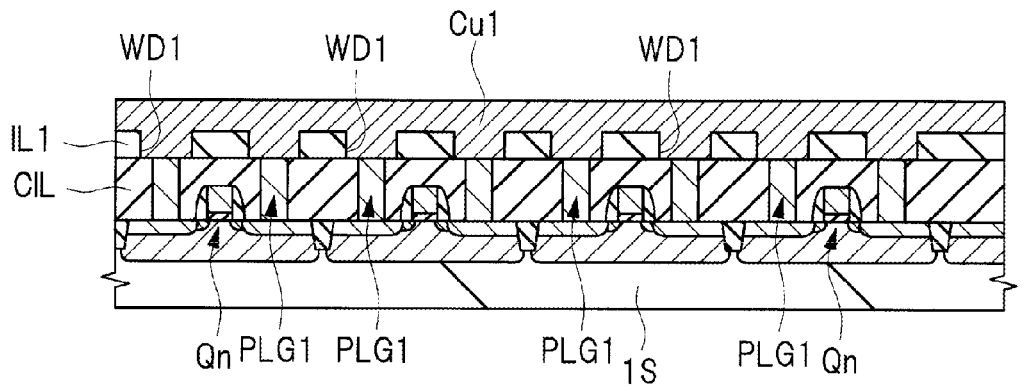
FIG. 10 is a cross-sectional view showing a method of manufacturing a semiconductor device succeeding FIG. 9.

After that, as shown in FIG. 10, a barrier conductor film (copper diffusion prevention film) (not shown in the drawing) is formed over the interlayer insulating film IL1 in which the wiring trench WD1 is formed. This barrier conductor film corresponds to the barrier conductor film BM1 shown in FIG. 2. Specifically, the barrier conductor film is configured with tantalum (Ta), titanium (Ti), ruthenium (Ru), tungsten (W), manganese (Mn), nitride or silicide nitride thereof, or a stacked film thereof, and is formed by the use of a sputtering method, for example.

Successively, a seed film configured with a thin copper film, for example, is formed inside the wiring trench WD1 and over the barrier conductor film formed over the interlayer insulating film IL1 by a sputtering method. Then, the copper film Cu1 is formed by an electrolytic plating method using this seed film as an electrode. This copper film Cu1 is formed so as to fill the wiring trench WD1. This copper film Cu1 is formed by a film containing mainly copper, for example. That is, the copper film Cu1 contains mainly copper (Cu) or copper alloy (copper (Cu) alloy). Other than the above, the copper film Cu1 sometimes contains aluminum (Al), magnesium (Mg), titanium (Ti), manganese (Mn), iron (Fe), zinc (Zn), zirconium (Zr), niobium (Nb), molybdenum (Mo), ruthenium (Ru), palladium (Pd), silver (Ag), gold (Au), indium (I), or alloy of lanthanoid series metal, actinoid series metal, or the like. Further, instead of the copper film Cu1, a metal wiring containing mainly silver or gold may be formed. Note that, while the copper film Cu1 is formed here by the use of the electrolytic plating method, the copper film Cu1 may be formed by the use of a CVD method.

Figure 11:
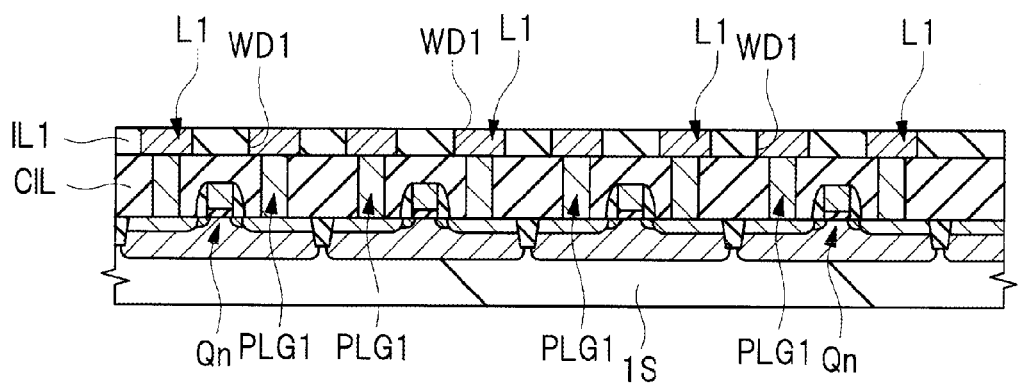
FIG. 11 is a cross-sectional view showing a method of manufacturing a semiconductor device succeeding FIG. 10.

Next, as shown in FIG. 11, the unnecessary barrier conductor film and copper film Cu1 formed over the interlayer insulating film IL1 are removed by a CMP method. Thereby, a layer including the first layer wiring L1, which is configured with the barrier conductor film and the copper film Cu1 embedded in the wiring trench WD1 (first fine layer), can be formed.

After that, ammonia plasma processing is performed on the surface of the interlayer insulating film IL1 in which the first layer wiring L1 is formed, and the surface of the first layer wiring L1 and the surface of the interlayer insulating film IL1 are cleaned. Successively, as shown in FIG. 12, the barrier insulating film BI1 is formed over the interlayer insulating film IL1 in which the first layer wiring L1 is formed. The barrier insulating film BI1 is configured with a stacked film of an SiCN film and an SiCO film, for example, and this stacked film can be formed by a CVD method, for example. Note that, in the present embodiment, the barrier insulating film BI1 is formed after the cleaning processing has been performed by the ammonia plasma processing on the surface of the interlayer insulating film IL1 in which the first layer wiring L1 is formed, and thereby adhesion between the interlayer insulating film IL1 and the barrier insulating film BI1 is improved.

Then, the interlayer insulating film IL2 is formed over the barrier insulating film BI1. Moreover, a CMP protection film CMP1 is formed over the interlayer insulating film IL2. Specifically, the interlayer insulating film IL2 is formed by the porous SiOC film which is formed by the use of porogen to be described below and has a plurality of vacancies. Accordingly, the interlayer insulating film IL2 is an insulating film having a relative permittivity lower than the low-k film which configures the interlayer insulating film IL1, for example. This SiOC film including vacancies can be formed by the use of a plasma CVD method, for example. Further, the CMP protection film CMP1 is configured with a TEOS film or a silicon oxide film, for example. While not shown in the drawing, an SiOC film is formed between the interlayer insulating film IL2 of the porous low-k film and the CMP protection film CMP1.

Here, by the use of FIG. 13 and FIG. 14, a formation method of the above described interlayer insulating film IL2 will be explained in detail. The interlayer insulating film IL2 is formed by means of depositing an SiOC film in a plasma CVD apparatus. This SiOC film is a porous low-k film including a plurality of vacancies inside and can be formed by means of forming an insulating film including porogen by the plasma CVD method and then eliminating the porogen from this insulating film.

Note that the porogen is a vacancy formation agent for forming a number of vacancies within the interlayer insulating film IL2 shown in FIG. 13. After an insulating film having a plurality of vacancies which includes porogen gas has been formed, a plurality of the vacancies without including the porogen is formed by means of performing a curing process which eliminates (exhausts) the porogen from this insulating film, and the interlayer insulating film IL2 is formed.

As a film formation condition when the diameter of the semiconductor substrate (semiconductor wafer) is 200 mm, RF power for plasma excitation is 200 to 600 W, atmospheric pressure in the plasma CVD apparatus is 600 to 1,000 Pa, and temperature of the semiconductor substrate 1S is 100 to 300° C. The interlayer insulating film IL2 is deposited by means of supplying $O_2$ (oxygen), He (helium), $C_5H_{14}O_2Si$ (methyldiethoxysilane) and porogen into the plasma CVD apparatus under this condition as source gas for forming the interlayer insulating film IL2 (refer to FIG. 13) including the porogen.

Here, $O_2$ (oxygen), He (helium), $C_5H_{14}O_2Si$ (methyldiethoxysilane), and porogen are supplied in 0 to 50 sccm (standard cc/min), 0 to 5,000 sccm, 0.2 g/min, 0.10 to 0.30 g/min, respectively. Here, sccm which shows a unit of an oxygen or helium flow rate expresses a volume of material flowing per a unit time under the condition of 1 atm and 0° C.

Note that the above supply amount of the porogen does not mean that a flow rate of any value in a range of 0.10 to 0.30 g/min is kept constant for forming the whole interlayer insulating film IL2, but means that the flow rate is increased in a step-by step manner from 0.10 g/min to 0.30 g/min in the film formation of the interlayer insulating film IL2. That is, while the flow rate of the porogen is 0.10 g/min at the start of film formation of the interlayer insulating film IL2, the flow rate of the porogen is increased in the course of film formation process and the flow rate of the porogen is set to be 0.30 g/min at the end of the film formation.

While it is conceivable that the flow rate of the porogen is increased gradually during the film formation, the flow rate of the porogen may be increased relatively abruptly at a temporal point in the course of film formation. However, the film formation of the interlayer insulating film IL2 is performed continuously from the bottom surface to the top surface and the film formation process is not interrupted for changing the flow rate of the porogen or other purposes on the way. That is, the flow rate of the porogen is changed while the interlayer insulating film IL2 is being formed. Thereby, it is configured that an oxide film or the like is not formed between the upper layer and the lower layer of the interlayer insulating film IL2.

Specifically, in the present embodiment, the RF power for plasma excitation, the atmospheric pressure in the plasma CVD apparatus, and the temperature of the semiconductor substrate 1S are set to 380 W, 800 Pa, and 250° C., respectively. Then, $O_2$ (oxygen), He (helium), $C_5H_{14}O_2Si$ (methyldiethoxysilane), and porogen are supplied in 12 sccm (standard cc/min), 470 sccm, 0.2 g/min, 0.10 g/min to 0.30 g/min, respectively.

Accordingly, in the supplied gas for the film formation, the rate occupied by the porogen is approximately 27.9% when the flow rate is 0.10 g/min at the start of film formation and becomes approximately 53.7% when the flow rate is increased to 0.30 g/min after that.

Note that, among the above described gases supplied into the CVD apparatus, while the methyldiethoxysilane and the porogen are main sources which configure the interlayer insulating film IL2 including porogen, the oxygen is also a source gas which configures the interlayer insulating film IL2 including porogen. While the helium is a gas supplied for generating plasma, all the gases supplied to the plasma CVD apparatus including the helium are defined as the source gas here. The oxygen flow rate of 12 sccm can be converted into that of approximately 0.017 g/min, and the helium flow rate of 470 sccm can be converted into that of approximately 0.042 g/min.

A material for the porogen is $C_XH_Y$ (carbon hydride) having a molecular weight of not smaller than 80 and not larger than 150, and α-terpinene ($C_{10}H_{16}$), limonene ($C_{10}H_{16}$), cycloocta, or the like can be used, for example. Accordingly, when the α-terpinene ($C_{10}H_{16}$) is used for the porogen, the α-terpinene ($C_{10}H_{16}$) is supplied to be increased from 0.10 g/min to 0.30 g/min during the film formation process.

Further, examples of the curing process of eliminating porogen from the interlayer insulating film IL2 include UV (Ultraviolet) irradiation, EB (Electron Beam) irradiation, thermal treatment using a lamp, a curing method by plasma, and the like. Note that "curing" mentioned here indicates a process of exhausting porogen out of the interlayer insulating film by applying energy to the porogen in the interlayer insulating film by means of the above described UV irradiation, the EB irradiation, or the like. Further, this curing process also has a function of increasing strength of the interlayer insulating film IL2.

That is, as shown in FIG. 13, the interlayer insulating film IL2 is formed including a number of vacancies which are filled with porogen gas, over the barrier insulating film BI1 in the film formation process using the above described plasma CVD method. After that, an electron beam (EB) is emitted toward the major surface of the semiconductor substrate 1S (refer to FIG. 12), for example, and the porogen is exhausted (cured) from the interlayer insulating film IL2, and thereby a plurality of the vacancies including the porogen becomes the vacancies 9 and 10 without including the porogen and the porous interlayer insulating film IL2 can be formed including the vacancies 9 and 10 as shown in FIG. 13.

Here, in the film formation process of the interlayer insulating film IL2, since the porogen flow rate is increased from 0.10 g/min to 0.30 g/min in the course of film formation process as described above, each volume of a plurality of the porogens included inside (porogen gas volume) is different between the lower part within the interlayer insulating film IL2 which is formed in an earlier stage of the film formation process and the upper part within the interlayer insulating film IL2 which is formed after that. That is, in the lower insulating layer PB2 of the interlayer insulating film IL2, a plurality of spaces is formed each including a relatively small amount of porogen, and, in the upper insulating layer PT2 of the interlayer insulating film IL2, a plurality of spaces is formed each including a relatively large amount (volume) of porogen.

When the porogen elimination process is performed by the above described curing method after that, the porogen is eliminated from the lower insulating layer PB2 and the upper insulating layer PT2, and a plurality of the vacancies 9 each having a relatively small average diameter is formed in the lower insulating layer PB2 and a plurality of the vacancies 10 each having a relatively large average diameter is formed in the upper insulating layer PT2. In this manner, the present embodiment has a feature that the porogen flow rate is increased during the formation (film formation) process of the interlayer insulating film IL2, and the small vacancy 9 is formed in the lower part within the interlayer insulating film IL2 and the large vacancy 10 is formed in the upper part within the interlayer insulating film IL2. Thereby, the lower insulating layer PB2 of the interlayer insulating film IL2 comes to have a lower vacancy occupation rate and therefore becomes a layer having a higher elastic modulus and a larger internal stress than the upper insulating layer PT2.

Successively, in the process explained by the use of FIG. 12, as shown in FIG. 14, an SiOC film O1 and the CMP protection film CMP1 are formed sequentially over the interlayer insulating film IL2. The SiOC film O1 and the CMP protection film CMP1 configured with a TEOS film or the like are formed by the use of a CVD method, for example.

Figure 15:
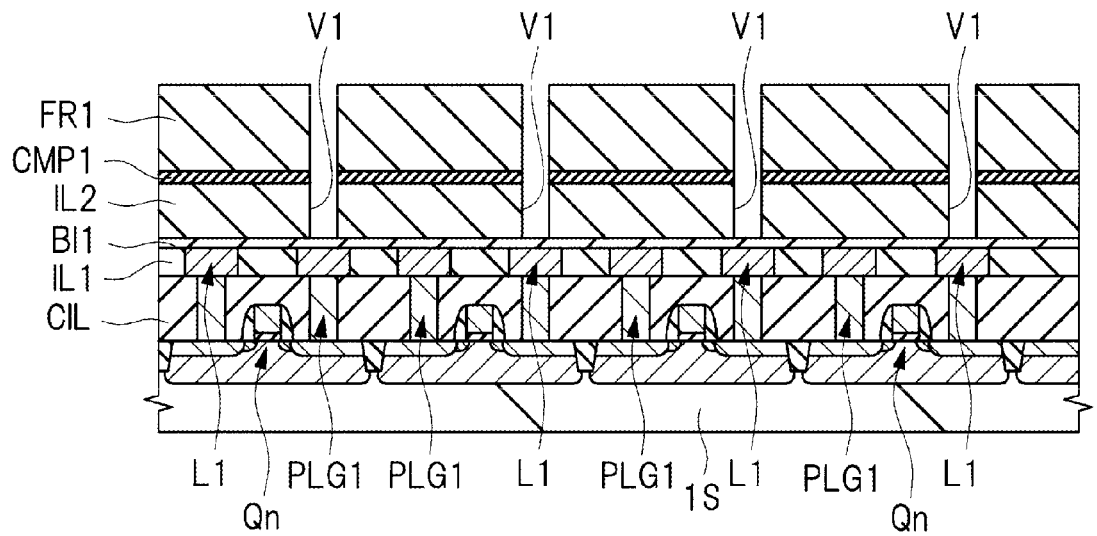
FIG. 15 is a cross-sectional view showing a method of manufacturing a semiconductor device succeeding FIG. 12.

Successively, as shown in FIG. 15, a photo-resist film FR1 is formed over the CMP protection film CMP1. Then, the photo-resist film FR1 is patterned by means of performing exposure and development processing on this photo-resist film FR1. The patterning is performed so as to open a region where the via hole is to be formed. After that, the CMP protection film CMP1 and the interlayer insulating film IL2 are etched with the patterned photo-resist film FR1 as a mask.

Thereby, the via hole V1 which passes through the CMP protection film CMP1 and the interlayer insulating film IL2 to expose the barrier insulating film BI1 can be formed. In this manner, the barrier insulating film BI1 functions as an etching stopper in the etching.

At this time, the side wall of the via hole V1 becomes denser and comes to have a higher hardness than the upper insulating layer PT2 (refer to FIG. 13) of the interlayer insulating film IL2 by the plasma processing in the etching process of forming the via hole V1.

Figure 16:
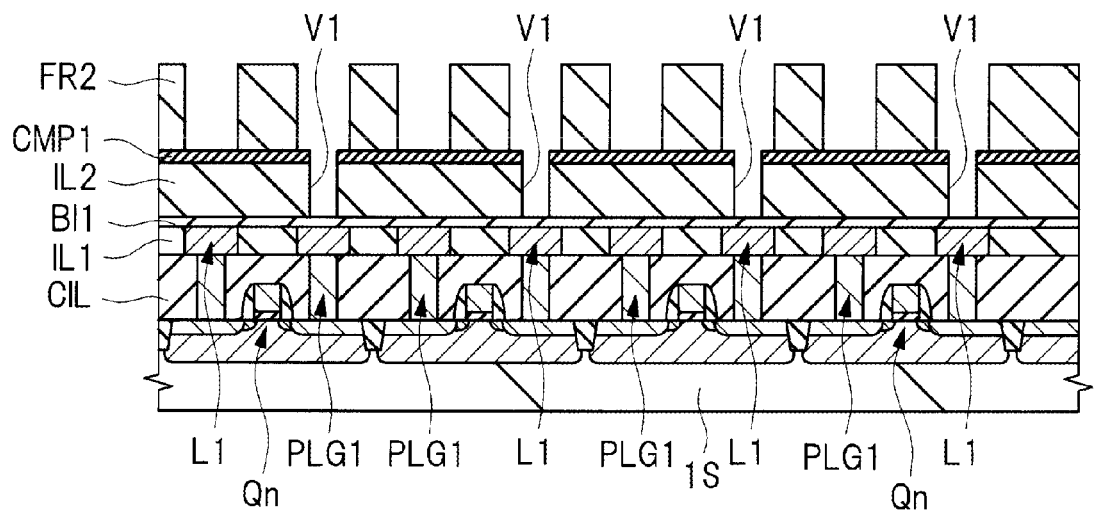
FIG. 16 is a cross-sectional view showing a method of manufacturing a semiconductor device succeeding FIG. 15.

Next, as shown in FIG. 16, the patterned photo-resist film FR1 is removed by plasma ashing processing, and then the major surface of the semiconductor substrate 1S is cleaned. After that, a photo-resist film FR2 is formed over the CMP protection film CMP1, and the photo-resist film FR2 is patterned by means of performing exposure and development processing on the photo-resist film FR2. The patterning of the photo-resist film FR2 is performed so as to open a region where the wiring trench is to be formed.

Figure 17:
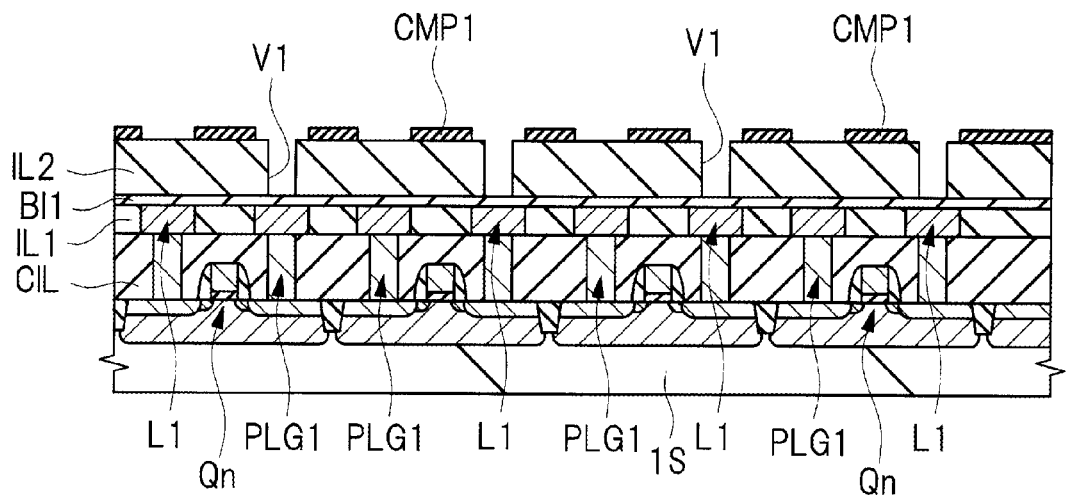
FIG. 17 is a cross-sectional view showing a method of manufacturing a semiconductor device succeeding FIG. 16.

After that, as shown in FIG. 17, the CMP protection film CMP1 is etched by anisotropic etching with the patterned photo-resist film FR2 as a mask. Then, the patterned photo-resist film FR2 is removed by plasma ashing processing and then the major surface of the semiconductor substrate 1S is cleaned. At this time, while not shown in FIG. 17, the SiOC film O1 shown in FIG. 14 is not removed and has a state that the upper surface thereof is exposed from the CMP protection film CMP1.

Figure 18:
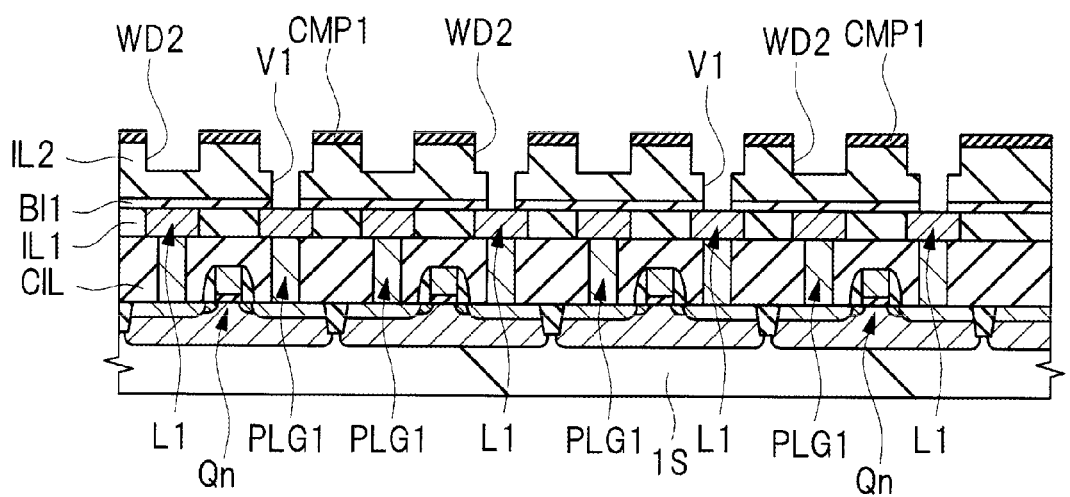
FIG. 18 is a cross-sectional view showing a method of manufacturing a semiconductor device succeeding FIG. 17.

Successively, as shown in FIG. 18, the barrier insulating film BI1 exposed at the bottom part of the via hole V1 is removed by an etch-back method. Thereby, the surface of the first layer wiring L1 comes to be exposed at the bottom part of the via hole V1. By the etch-back process at this time, the SiOC film O1 (refer to FIG. 14) and a part of the interlayer insulating film IL2, which are exposed from the patterned CMP protection film CMP1, are etched and the wiring trench WD2 is formed. At this time, by the plasma processing in the etching process of forming the wiring trench WD2, the side wall and the bottom surface of the wiring trench WD2 become denser and come to have a higher hardness than the upper insulating layer PT2 (refer to FIG. 13) of the interlayer insulating film IL2.

Figure 19:
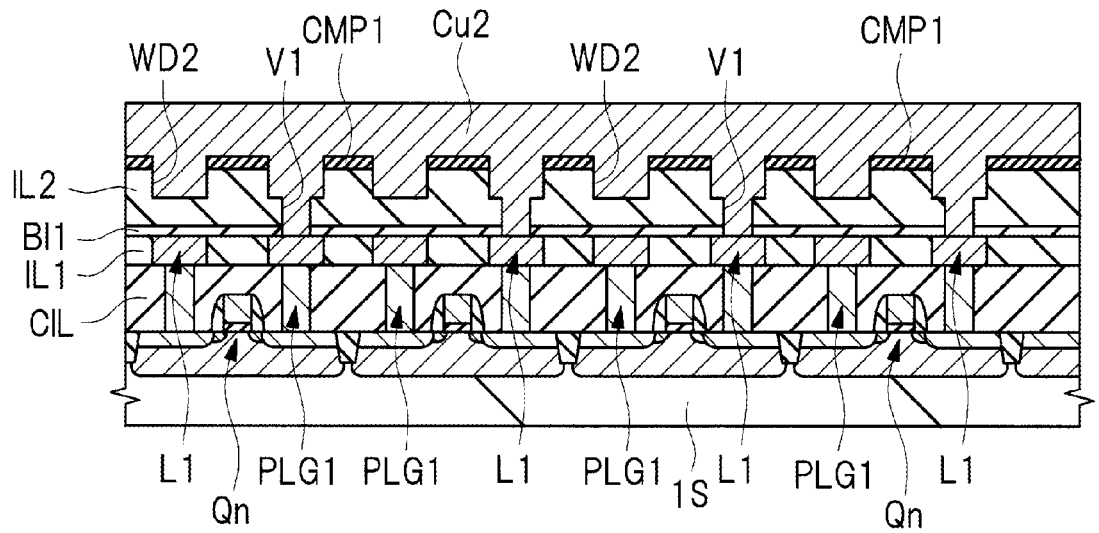
FIG. 19 is a cross-sectional view showing a method of manufacturing a semiconductor device succeeding FIG. 18.
Figure 20:
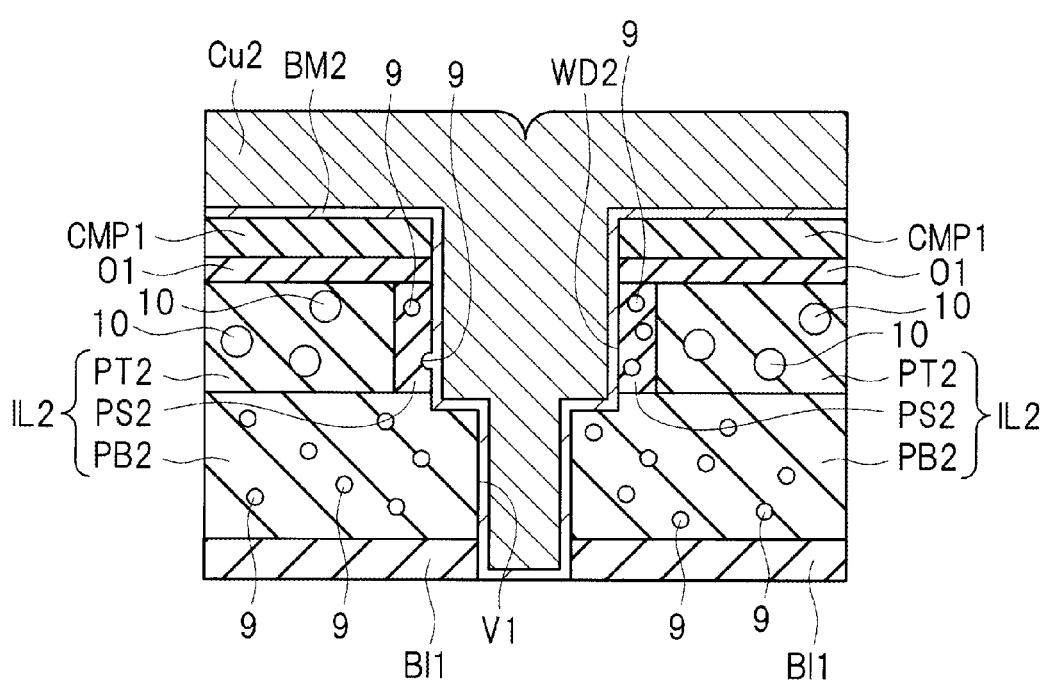
FIG. 20 is an enlarged sectional view specifically explaining a process explained by the use of FIG. 19.

Next, as shown in FIG. 19, the barrier conductor film BM2 (not shown in the drawing) having the same structure as the barrier conductor film BM1 (refer to FIG. 2) is formed over the interlayer insulating film IL2 in which the wiring trench WD2 and the via hole V1 are formed and over the CMP protection film CMP1.

Successively, a seed film (not shown in the drawing) configured with a thin copper film, for example, is formed over the barrier conductor film which is formed inside the wiring trench WD2 and over the CMP protection film CMP1, by a sputtering method. Then, the copper film Cu2 is formed by an electrolytic plating method using this seed film as an electrode. This copper film Cu2 is formed so as to fill the wiring trench WD2. This copper film Cu2 is formed by a film containing mainly copper, for example.

At this time, in the process explained by the use of FIG. 18, as shown in FIG. 20, the side wall insulating layer PS2 which is denser and has a higher hardness than the upper insulating layer PT2 is formed on the surface of the interlayer insulating film IL2 exposed on the side wall of the wiring trench WD2. The side wall insulating layer PS2 is a layer in which the upper insulating layer PT2 becomes denser by the plasma processing. While the vacancies 9 formed in the side wall insulating layer PS2 had the same average diameter as the vacancies 10 before the formation of the wiring trench WD2, the denser side wall insulating layer PS2 is formed at the same time when the wiring trench WD2 is formed, and thereby the average diameter of the vacancies 9 in the side wall insulating layer PS2 becomes smaller than the average diameter of the vacancies 10.

Note that, FIG. 20 is an enlarged cross-sectional view of the semiconductor device of the present embodiment during the manufacturing process in a state after the process of FIG. 19 has been performed. That is, FIG. 20 is an enlarged cross-sectional view specifically explaining the manufacturing process explained by the use of FIG. 19. A structure formed above the interlayer insulating film IL1 is shown. Here, the bottom surface of the wiring trench WD2 is formed in the vicinity of the boundary between the upper insulating layer PT2 and the lower insulating layer PB2 and in the region under the boundary. That is, the via hole V1 is formed having the same height as the lower insulating layer PB2 and the wiring trench WD2 is formed having the same height as the upper insulating layer PT2.

This is configured for the purpose that, when the bottom surface of the wiring trench WD2 reaches the lower insulating layer PB2, the whole side wall of the plug PLG2 is covered by the lower insulating layer PB2 in the region contacting the interlayer insulating film IL2, and it is possible to obtain an effect of improving the EM characteristic, the TDDB characteristic, and the withstand voltage characteristic in the plug PLG2 and to improve the reliability of the semiconductor device. However, the present embodiment is not limited to this case, and the position of the bottom surface of the wiring trench WD2 may be located at the same height as the boundary.

Further, while not shown in the drawing, also on each of the bottom surface of the wiring trench WD2 and the side wall of the via hole V1, a layer which is denser and has a higher hardness is formed as with the side wall insulating layer PS2. The plasma processing forming such dense layers including the side wall insulating layer PS2 includes not only the plasma etching process for forming the wiring trench WD2 and the via hole V1, but also the plasma ashing processing of removing the resist film such as the photo-resist film FR2 (refer to FIG. 16), and the plasma processing in the formation processes of the above described barrier conductor film BM1 and the above described seed film. That is, the exposed surface of the interlayer insulating film IL2 is made denser in these processes including the plasma processing.

Figure 45:
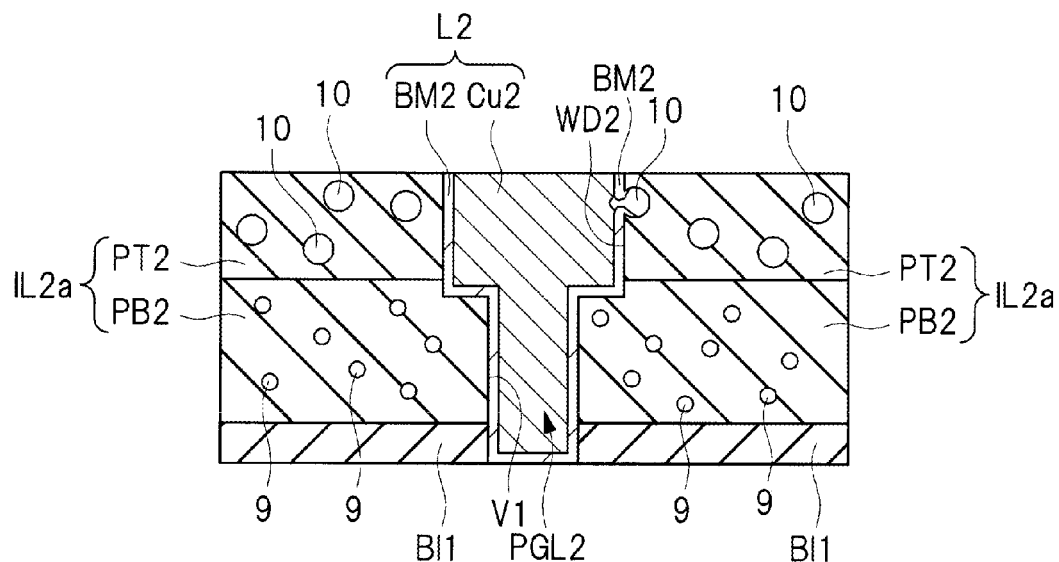
FIG. 45 is a cross-sectional view of a semiconductor device shown as a comparative example.

Here, when vacancies having a relatively large average diameter are exposed on the side wall of a wiring trench WD2 like the vacancies 10 shown in FIG. 45 of a comparative example, flatness of the side wall is lost, which makes it difficult to form the barrier conductor film on the side wall, and there is a possibility that adhesion is degraded between a copper film Cu2 and an interlayer insulating film IL2a. Note that FIG. 45 shows a cross-sectional view of a semiconductor device of the comparative example. The interlayer insulating film IL2a shown in FIG. 45 has a lower insulating layer PB2 and an upper insulating layer PT2 as with the interlayer insulating film IL2 shown in FIG. 3, but does not have a side wall insulating layer PS2. That is, the side wall of the upper insulating layer PT2 is exposed to the wiring trench WD2 formed in the upper surface of the interlayer insulating film IL2a and the surfaces of some vacancies 10 in the upper insulating layer PT2 are exposed. In such a portion, a void (air gap) is easily generated and the EM characteristic is easily degraded.

On the other hand, in the present embodiment, as shown in FIG. 20, the size of the vacancy exposed on the side wall of the wiring trench WD2 is made small by the formation of the side wall insulating layer PS2. Accordingly, roughness of the side wall of the wiring trench WD2 becomes small, and therefore it is possible to improve coverage of the barrier conductor film. That is, when the barrier insulating film is formed on the surfaces of the vacancies exposed to the wiring trench WD2 and the via hole V1, it is possible to prevent the occurrence of the problem that the film thickness of the barrier insulating film becomes small or the barrier insulating film is not formed.

Thereby, it is possible to prevent the adhesion degradation caused by formation failure of the barrier conductor film on the side wall of the wiring trench WD2, between the second layer wiring L2 and plug PLG2 (refer to FIG. 21) to be formed in the following process (refer to FIG. 21) and the interlayer insulating film IL2, and to prevent the occurrence of the EM, and therefore it is possible to improve the reliability of the semiconductor device. Further, it is possible to prevent generation of a region where the barrier insulating film is not formed, and therefore it is possible to prevent copper atoms configuring the second layer wiring L2 and the plug PLG2 from being diffused into the interlayer insulating film IL2 and to prevent degradation of the line-to-line TDDB characteristic, and resultantly it is possible to improve the reliability of the semiconductor device.

Figure 21:
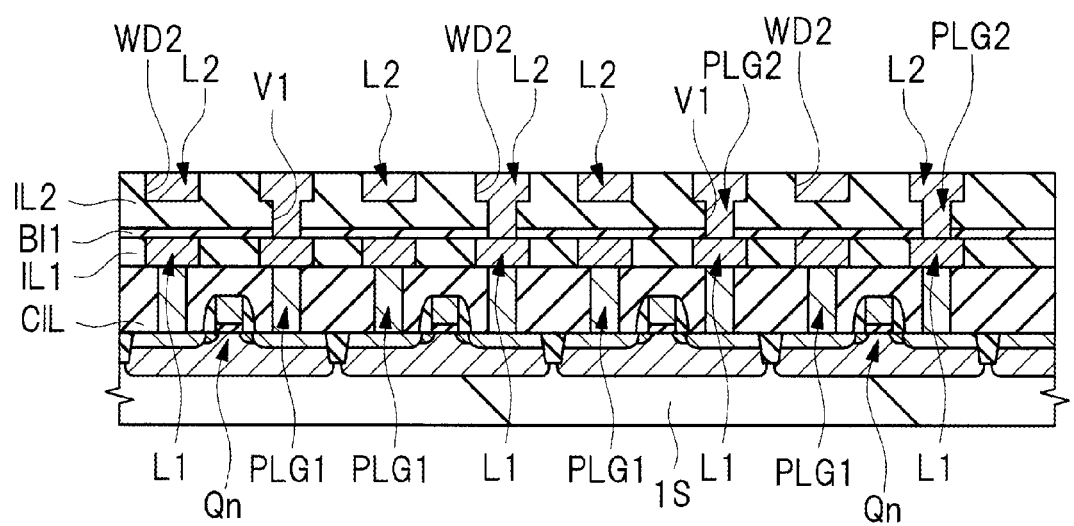
FIG. 21 is a cross-sectional view showing a method of manufacturing a semiconductor device succeeding FIG. 19.

Successively, as shown in FIG. 21, the unnecessary barrier conductor film, SiOC film O1 (refer to FIG. 14) and copper film Cu2, which are formed over the CMP protection film CMP1, are removed by a CMP method. Thereby, the interlayer insulating film IL2 is exposed, and also the second layer wiring L2 which is configured with the barrier conductor film and the copper film Cu2 embedded in the wiring trench WD2 and the plug PLG2 which is configured with the barrier conductor film and the copper film Cu2 embedded in the via hole V1 can be formed. The CMP protection film CMP1 is provided for protecting the semiconductor device during the manufacturing process from polishing pressure, scratch damage or the like by the CMP method at this time.

Note that, while, in the present embodiment, as explained by the use of FIG. 15 to FIG. 21, a via first manufacturing method is used to form the wiring trench WD2 after having formed the via hole V1 in the interlayer insulating film IL2 in the process of forming the second layer wiring L2 and the plug PLG2, a trench first manufacturing method may be used to form the via hole V1 after having formed the wiring trench WD2 in the interlayer insulating film IL2. Also in this case, the side wall insulating layer PS2 (refer to FIG. 13) is formed on the side wall of the wiring trench WD2.

Figure 22:
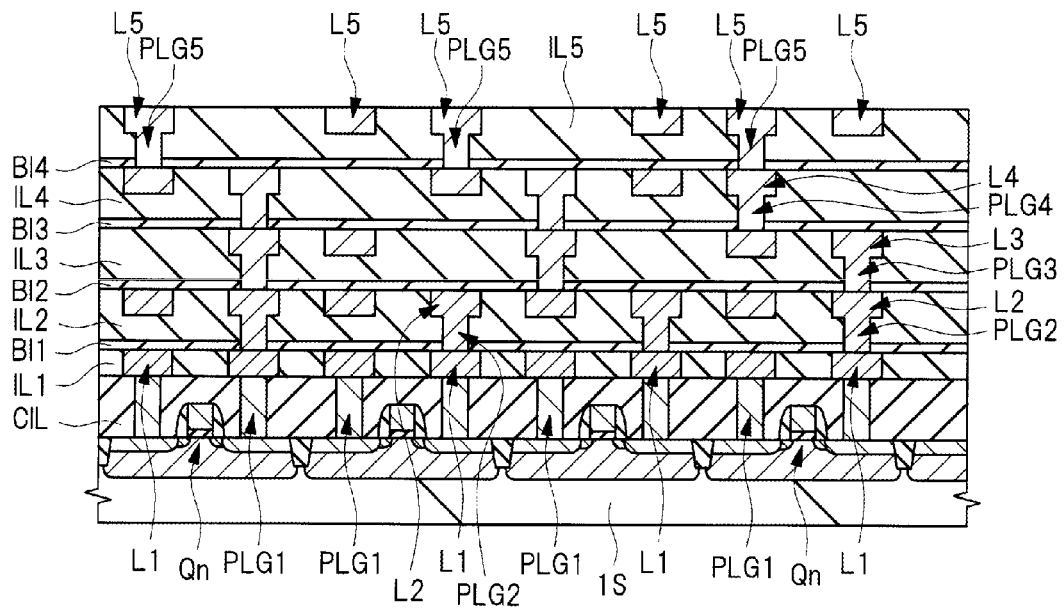
FIG. 22 is a cross-sectional view showing a method of manufacturing a semiconductor device succeeding FIG. 21.

After that, as shown in FIG. 22, ammonia plasma processing is performed on the surface of the interlayer insulating film IL2 in which the second layer wiring L2 is formed, and the surface of the second layer wiring L2 and the surface of the interlayer insulating film IL2 are cleaned. Successively, the barrier insulating film BI2 is formed over the interlayer insulating film IL2 in which the second layer wiring L2 is formed. The barrier insulating film BI2 is configured with a stacked film of an SiCN film and an SiCO film, for example, and this stacked film can be formed by a CVD method, for example. By repetition of such a manufacturing process, the third layer wiring L3 to the fifth layer wiring L5 are formed. Thereby, the second fine layer (second layer wiring L2 to fifth layer wiring L5) can be formed.

At this time, each of the interlayer insulating films IL2 to IL5 is the porous low-k film including the vacancies 9 and 10 as shown in FIG. 3. That is, the interlayer insulating films IL3 to IL5 are formed by means of increasing the porogen flow rate from 0.10 g/min to 0.30 g/min during the film formation process as with the interlayer insulating film IL2 explained by the use of FIG. 13. Therefore, each of the interlayer insulating films IL2 to IL5 has a layer which includes the vacancies having a relatively small average diameter in the lower part within the film and has a layer which includes the vacancies having a relatively large average diameter in the upper part within the film. Thereby, each of the interlayer insulating films IL2 to IL5 has a structure in which the lower part has a higher elastic modulus than the upper layer within the film.

Figure 23:
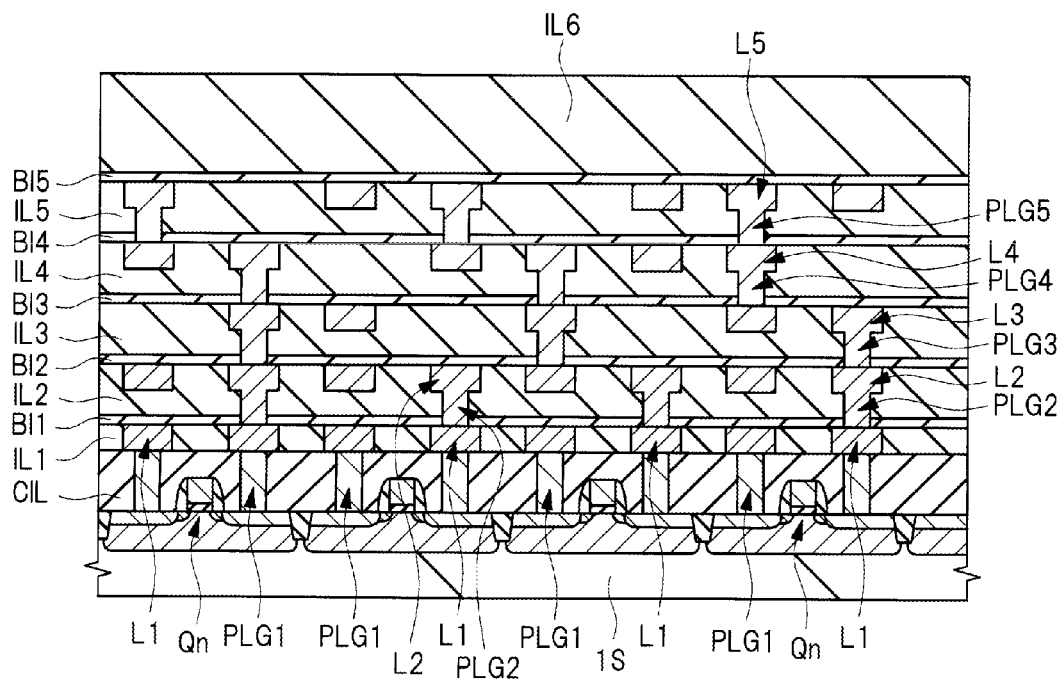
FIG. 23 is a cross-sectional view showing a method of manufacturing a semiconductor device succeeding FIG. 22.

Successively, there will be explained a process of forming the semi-global layer over the second fine layer. As shown in FIG. 23, ammonia plasma processing is performed on the surface of the interlayer insulating film IL5 in which the fifth layer wiring L5 is formed, and the surface of the fifth layer wiring L5 and the surface of the interlayer insulating film IL5 are cleaned. Successively, the barrier insulating film BI5 is formed over the interlayer insulating film IL5 in which the fifth layer wiring L5 is formed. The barrier insulating film BI5 is configured with a stacked film of an SiCN film and an SiCO film, for example, and this stacked film can be formed by a CVD method, for example.

Next, the interlayer insulating film IL6 is formed over the barrier insulating film BI5. This interlayer insulating film IL6 is formed by an SiOC film, for example, and can be formed by the use of a plasma CVD method, for example. The interlayer insulating film IL6 is a low-k film having a lower permittivity than a silicon oxide film and the like.

Figure 24:
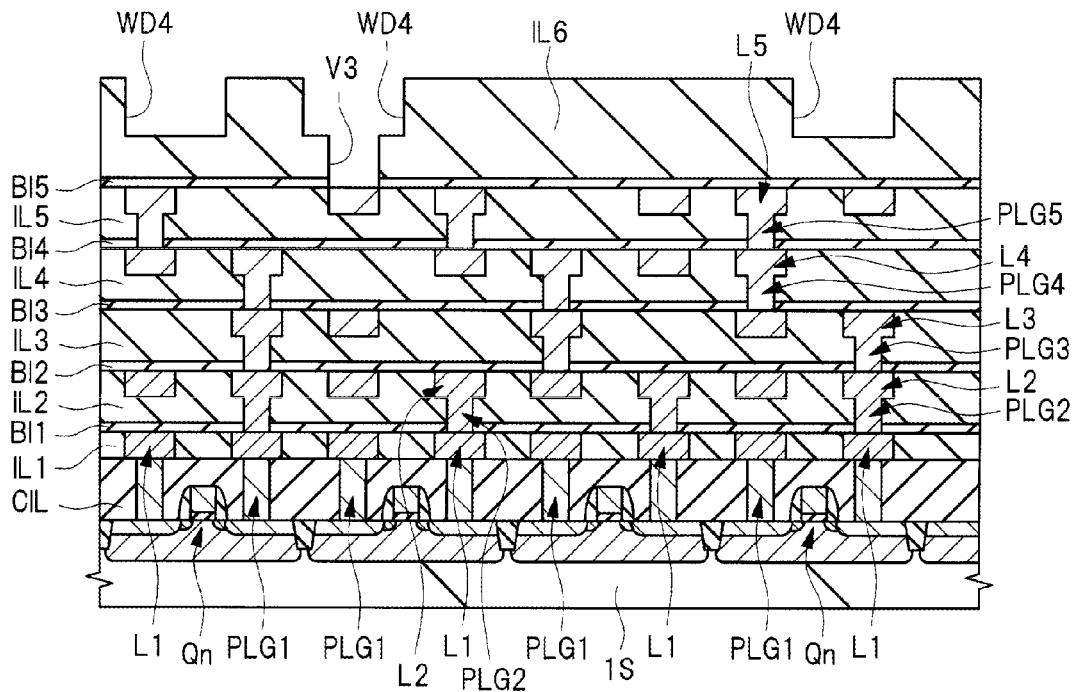
FIG. 24 is a cross-sectional view showing a method of manufacturing a semiconductor device succeeding FIG. 23.

Then, as shown in FIG. 24, a wiring trench WD4 and a via hole V3 are formed in the interlayer insulating film IL6 by the use of a photolithography technique and an etching technique. This via hole V3 is formed so as to pass through the interlayer insulating film IL6 configured with the SiOC film to reach the fifth layer wiring L5 at the bottom surface. Thereby, the surface of the fifth layer wiring L5 is exposed at the bottom surface of the via hole V3.

Figure 25:
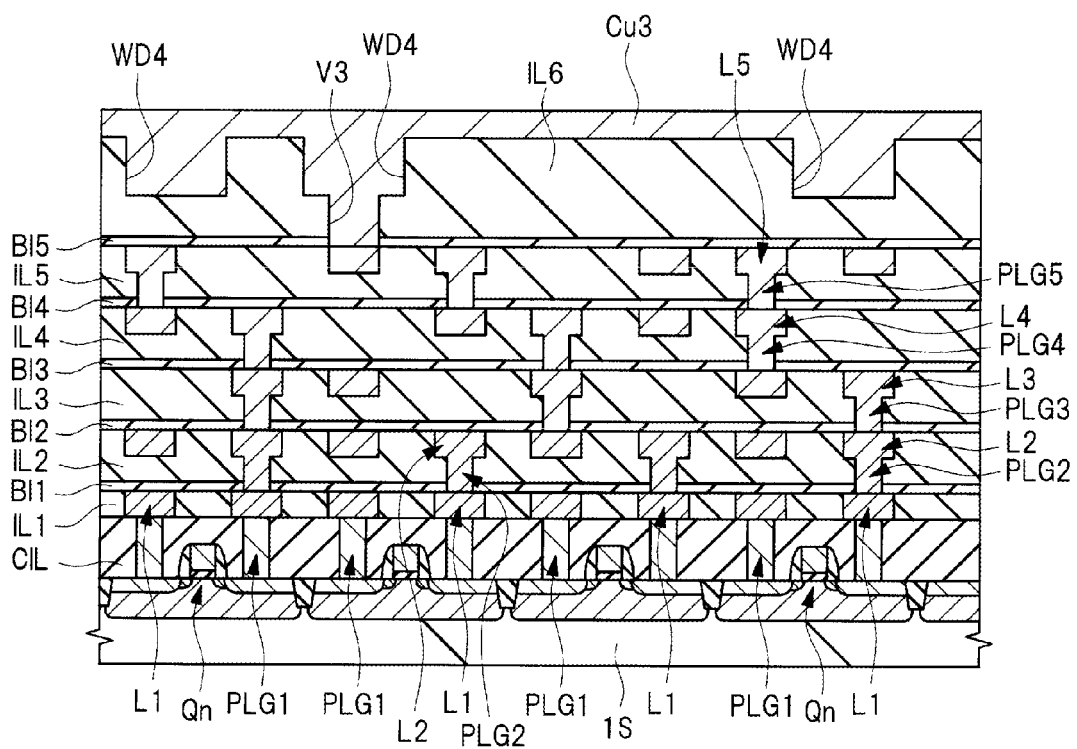
FIG. 25 is a cross-sectional view showing a method of manufacturing a semiconductor device succeeding FIG. 24.

After that, as shown in FIG. 25, a barrier conductor film (copper diffusion prevention film) (not shown in the drawing) is formed over the interlayer insulating film IL6 in which the wiring trench WD4 and the via hole V3 are formed. Specifically, the barrier conductor film is configured with tantalum (Ta), titanium (Ti), ruthenium (Ru), tungsten (W), manganese (Mn), nitride or silicide nitride thereof, or a stacked film thereof, and is formed by the use of a sputtering method, for example.

Successively, a seed film configured with a thin copper film, for example, is formed within the wiring trench WD4 and the via hole V3 and over the barrier conductor film formed over the interlayer insulating film IL6 by a sputtering method. Then, a copper film Cu3 is formed by an electrolytic plating method using this seed film as an electrode. This copper film Cu3 is formed so as to fill the wiring trench WD4 and the via hole V3. This copper film Cu3 is formed by a film containing mainly copper, for example. That is, the copper film Cu3 contains mainly copper (Cu) or copper alloy (copper (Cu) alloy). Other than the above, the copper film Cu3 sometimes includes aluminum (Al), magnesium (Mg), titanium (Ti), manganese (Mn), iron (Fe), zinc (Zn), zirconium (Zr), niobium (Nb), molybdenum (Mo), ruthenium (Ru), palladium (Pd), silver (Ag), gold (Au), indium (In), or alloy of lanthanoid series metal, actinoid based metal, or the like.

Figure 26:
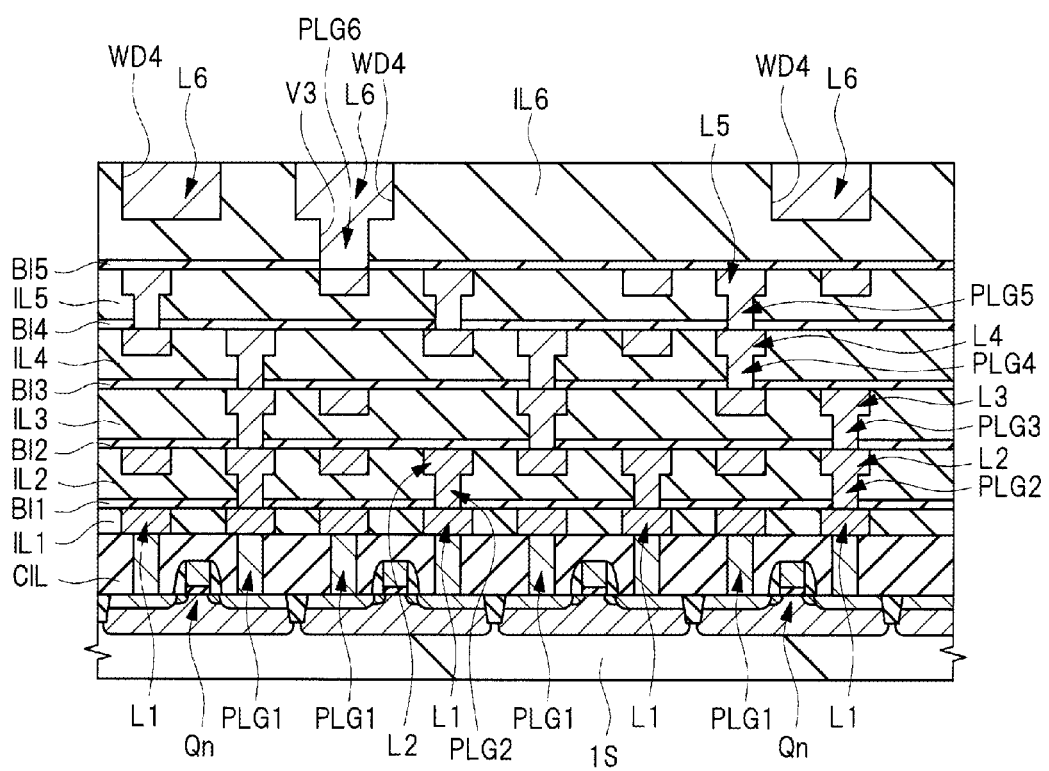
FIG. 26 is a cross-sectional view showing a method of manufacturing a semiconductor device succeeding FIG. 25.
Figure 27:
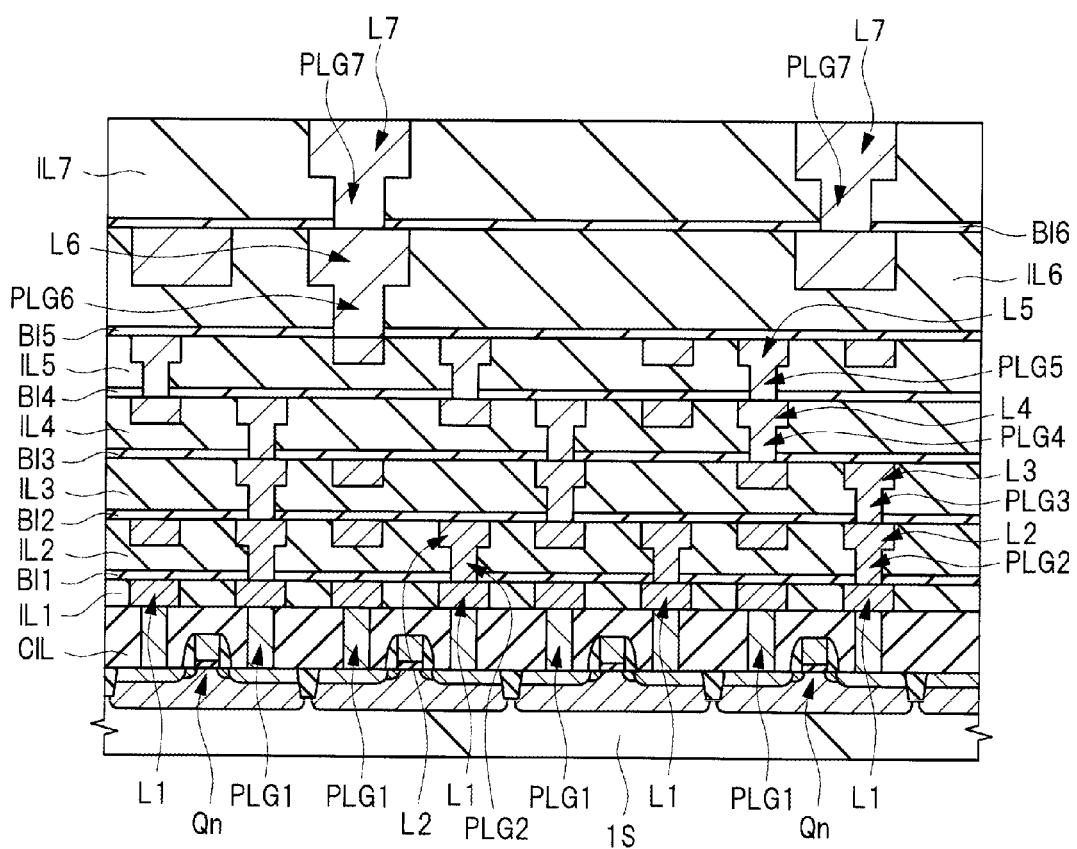
FIG. 27 is a cross-sectional view showing a method of manufacturing a semiconductor device succeeding FIG. 26.

Next, as shown in FIG. 26, the unnecessary barrier conductor film and the copper film Cu3 which are formed over the interlayer insulating film IL6 are removed by a CMP method. Thereby, the sixth layer wiring L6 which is configured with the barrier conductor film and the copper film Cu3 embedded in the wiring trench WD4 and the plug PLG6 which is configured with the barrier conductor and the copper film Cu3 embedded in the via hole V3 are formed. As described above, the sixth layer wiring L6 can be formed. By the repetition of such a manufacturing process, the seventh layer wiring L7 is also formed as shown in FIG. 27. Thereby, the semi-global layer (sixth layer wirings L6 to seventh layer wiring L7) can be formed.

Figure 28:
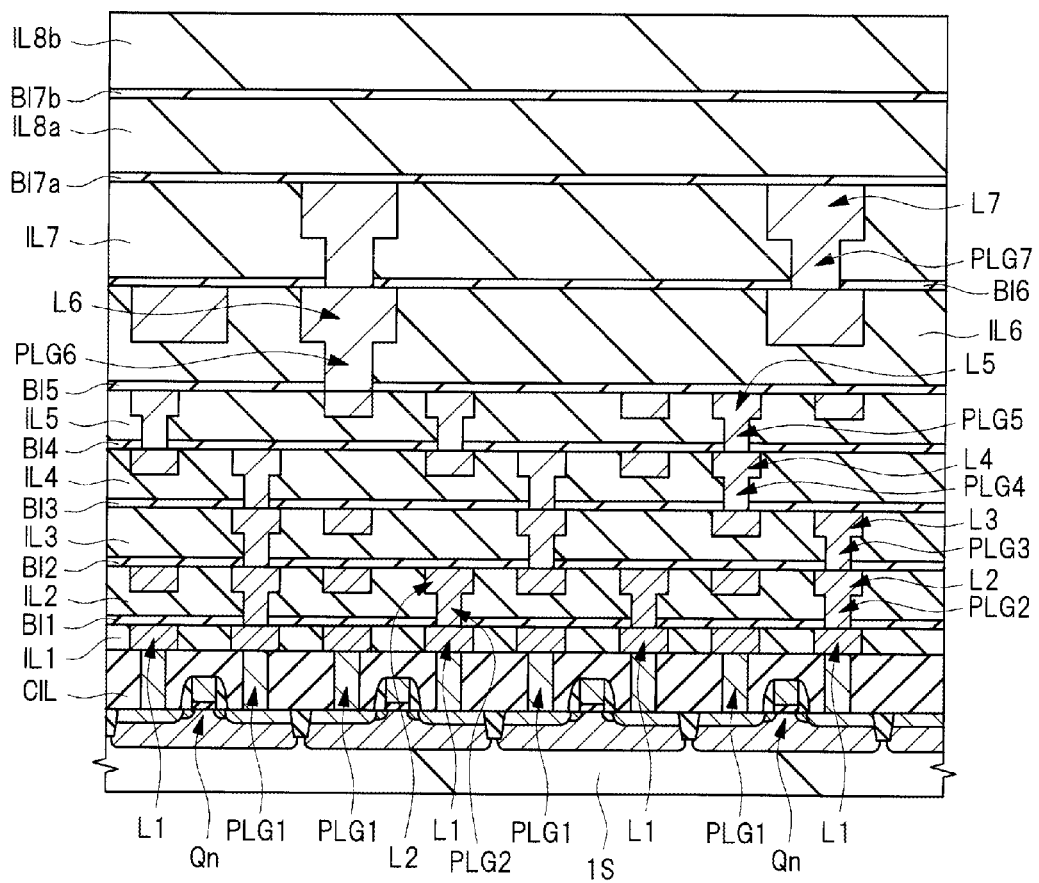
FIG. 28 is a cross-sectional view showing a method of manufacturing a semiconductor device succeeding FIG. 27.

Successively, a process of forming the global layer over the semi-global layer will be explained. As shown in FIG. 28, ammonia plasma processing is performed on the surface of the interlayer insulating film IL7 in which the seventh layer wiring L7 is formed, and the surface of the seventh layer wiring L7 and the surface of the interlayer insulating film IL7 are cleaned. Successively, the barrier insulating film BI7a is formed over the interlayer insulating film IL7 in which the seventh layer wiring L7 is formed. The barrier insulating film BI7a is configured with a stacked film of an SiCN film and an SiCO film, for example, and this stacked film can be formed by a CVD method, for example.

Next, the interlayer insulating film IL8a is formed over the barrier insulating film BI7a. This interlayer insulating film IL8a can be formed by a TEOS film, a silicon oxide film, or the like, for example, and is formed by the use of a plasma CVD method, for example. Moreover, the etching stop insulating film BI7b is formed over the interlayer insulating film IL8a, and the interlayer insulating film IL8b is formed over this etching stop insulating film BI7b. This etching stop insulating film BI7b is formed by an SiCN film, for example, and can be formed by a CVD method, for example. Further, this interlayer insulating film IL8b is formed by a TEOS film, a silicon oxide film, or the like, for example, and is formed by the use of a plasma CVD method, for example.

Figure 29:
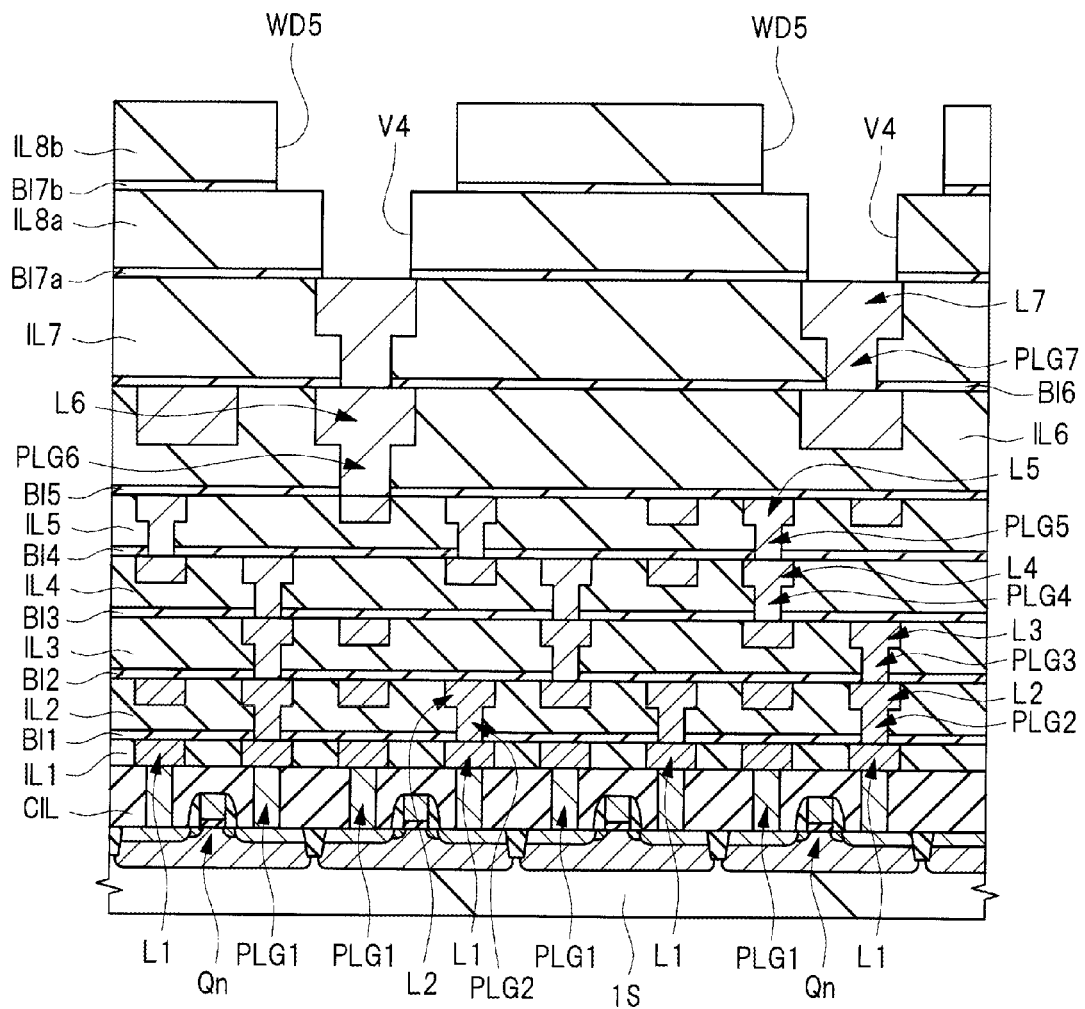
FIG. 29 is a cross-sectional view showing a method of manufacturing a semiconductor device succeeding FIG. 28.

Then, as shown in FIG. 29, the wiring trench WD5 is formed in the interlayer insulating film IL8b and the etching stop insulating film BI7b and also the via hole V4 is formed in the interlayer insulating film IL8a and the barrier insulating film BI7a by the use of a photolithography technique and an etching technique. This via hole V4 is formed so as to pass through the interlayer insulating film IL8a configured with a TEOS film, a silicon oxide film, or the like to reach the seventh layer wiring L7 at the bottom surface. Thereby, the surface of the seventh layer wiring L7 comes to be exposed at the bottom part of the via hole V4.

Figure 30:
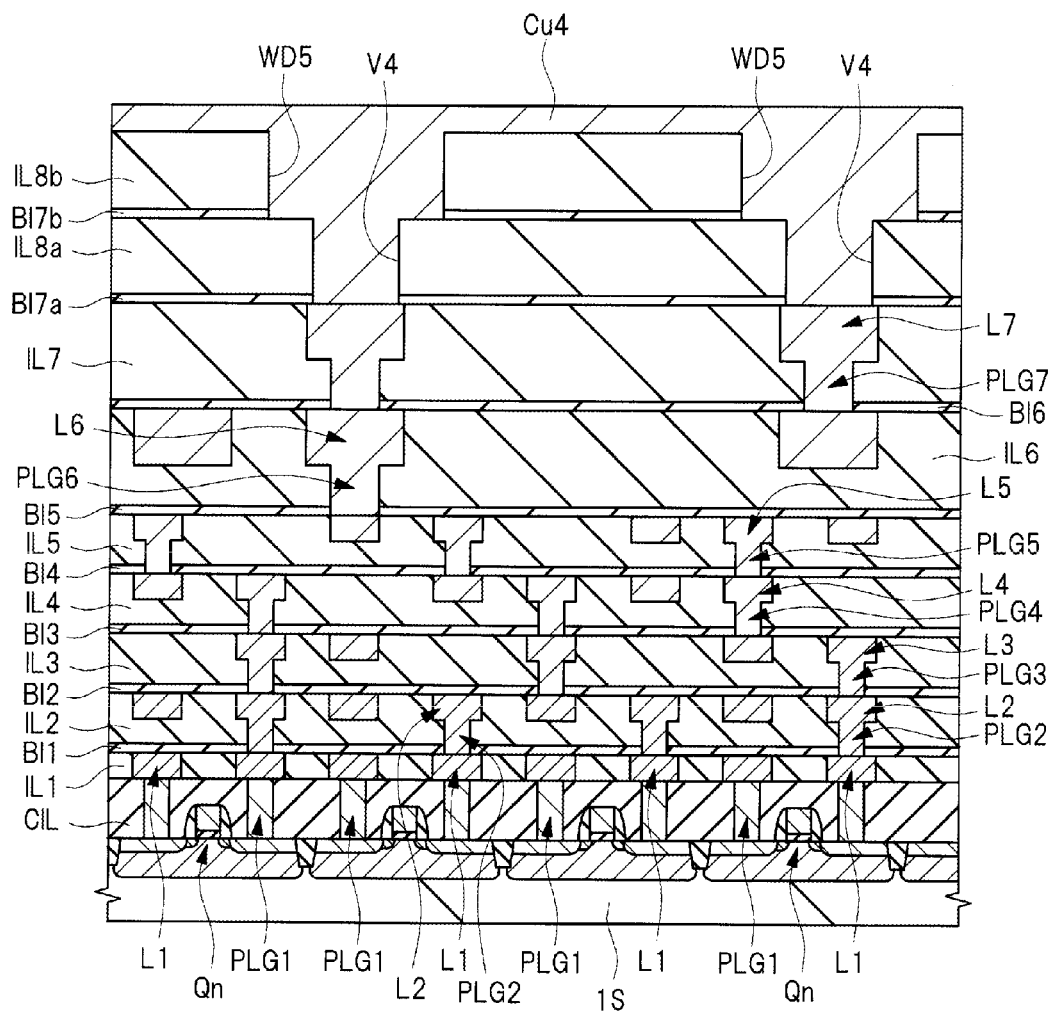
FIG. 30 is a cross-sectional view showing a method of manufacturing a semiconductor device succeeding FIG. 29.

After that, as shown in FIG. 30, a barrier conductor film (copper diffusion prevention film) (not shown in the drawing) is formed over the interlayer insulating film IL8b in which the wiring trench WD5 is formed and over the interlayer insulating film IL8a in which the via hole V4 is formed. Specifically, the barrier conductor film is configured with tantalum (Ta), titanium (Ti), ruthenium (Ru), tungsten (W), manganese (Mn), nitride or silicide nitride thereof, or a stacked film thereof, and is formed by the use of a sputtering method, for example.

Successively, a seed film configured with a thin copper film, for example, is formed within the wiring trench WD5 and the via hole V4 and over the barrier conductor film formed over the interlayer insulating film IL8b by a sputtering method. Then, a copper film Cu4 is formed by an electrolytic plating method using this seed film as an electrode. This copper film Cu4 is formed so as to fill the wiring trench WD5 and the via hole V4. This copper film Cu4 is formed by a film containing mainly copper, for example. That is, the copper film Cu4 contains mainly copper (Cu) or copper alloy (copper (Cu) alloy). Other than the above, the copper film Cu4 sometimes includes aluminum (Al), magnesium (Mg), titanium (Ti), manganese (Mn), iron (Fe), zinc (Zn), zirconium (Zr), niobium (Nb), molybdenum (Mo), ruthenium (Ru), palladium (Pd), silver (Ag), gold (Au), indium (In), or alloy of lanthanoid based metal, actinoid based metal, or the like.

Figure 31:
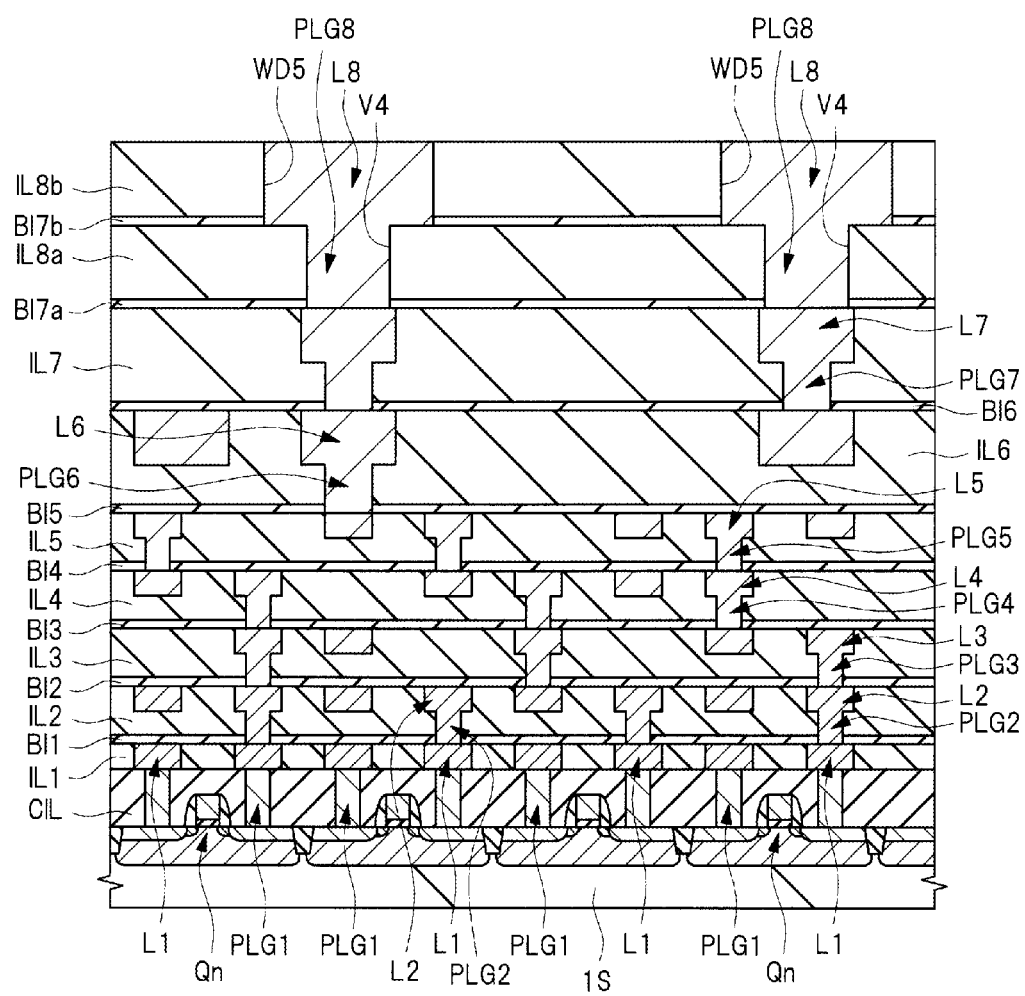
FIG. 31 is a cross-sectional view showing a method of manufacturing a semiconductor device succeeding FIG. 30.

Next, as shown in FIG. 31, the unnecessary barrier conductor film and copper film Cu4 which are formed over the interlayer insulating film IL8b are removed by a CMP method. Thereby, the eighth layer wiring L8 which is configured with the barrier conductor film and the copper film Cu4 embedded in the wiring trench WD5 and the plug PLG8 which is configured with the barrier conductor film and the copper film Cu4 embedded in the via hole V4 are formed. As described above, the eighth layer wiring L8 can be formed. Thereby, the global layer (eighth layer wiring L8) can be formed.

Figure 32:
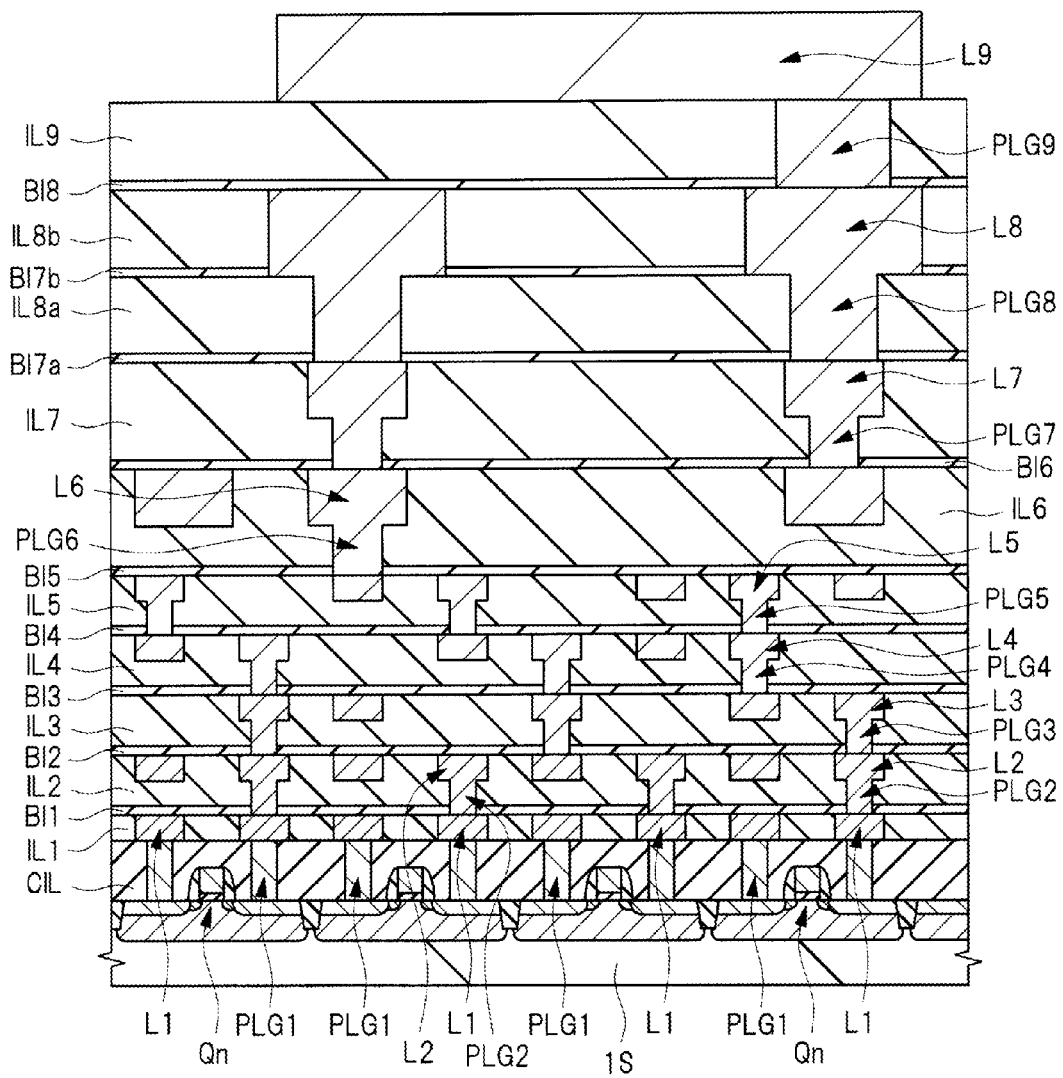
FIG. 32 is a cross-sectional view showing a method of manufacturing a semiconductor device succeeding FIG. 31.

Successively, as shown in FIG. 32, the barrier insulating film BI8 is formed over the interlayer insulating film IL8b in which the eighth layer wiring L8 is formed, and the interlayer insulating film IL9 is formed over the barrier insulating film BI8. The barrier insulating film BI8 is configured with a stacked film of an SiCN film and an SiCO film, for example, and this stacked film can be formed by a CVD method, for example. Further, the interlayer insulating film IL9 is formed by a TEOS film, a silicon oxide film, or the like, for example, and is formed by the use of a plasma CVD method, for example. Then, a via hole is formed passing through this interlayer insulating film IL9 and the barrier insulating film BI8.

Next, a stacked film which sequentially stacks a titanium/titanium nitride film, an aluminum film, and a titanium/titanium nitride film is formed on the side wall and the bottom surface of the via hole and over the interlayer insulating film IL9, and the plug PLG9 and the ninth layer wiring L9 which is the top layer wiring are formed by patterning of this stacked film.

Figure 33:
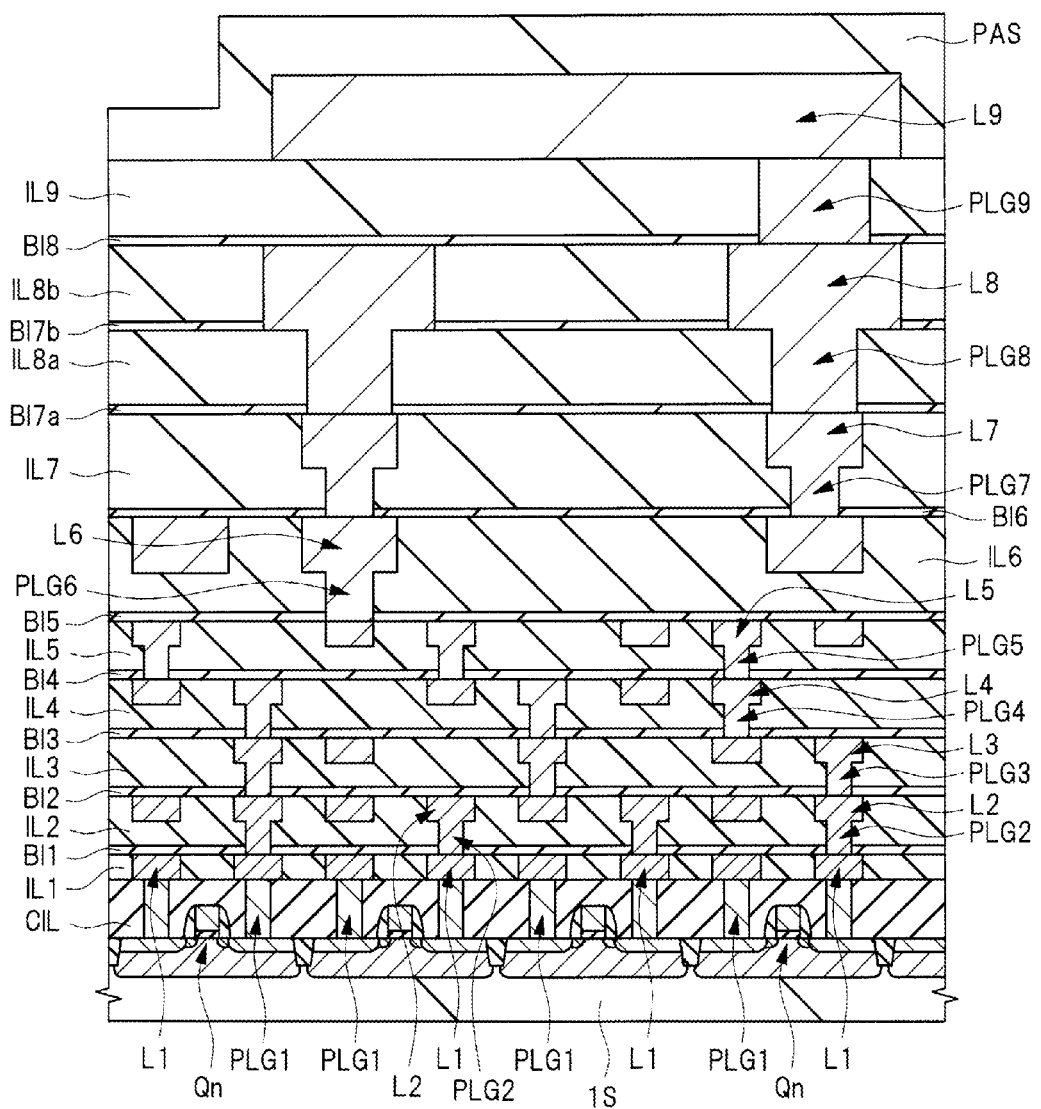
FIG. 33 is a cross-sectional view showing a method of manufacturing a semiconductor device succeeding FIG. 32.
Figure 34:
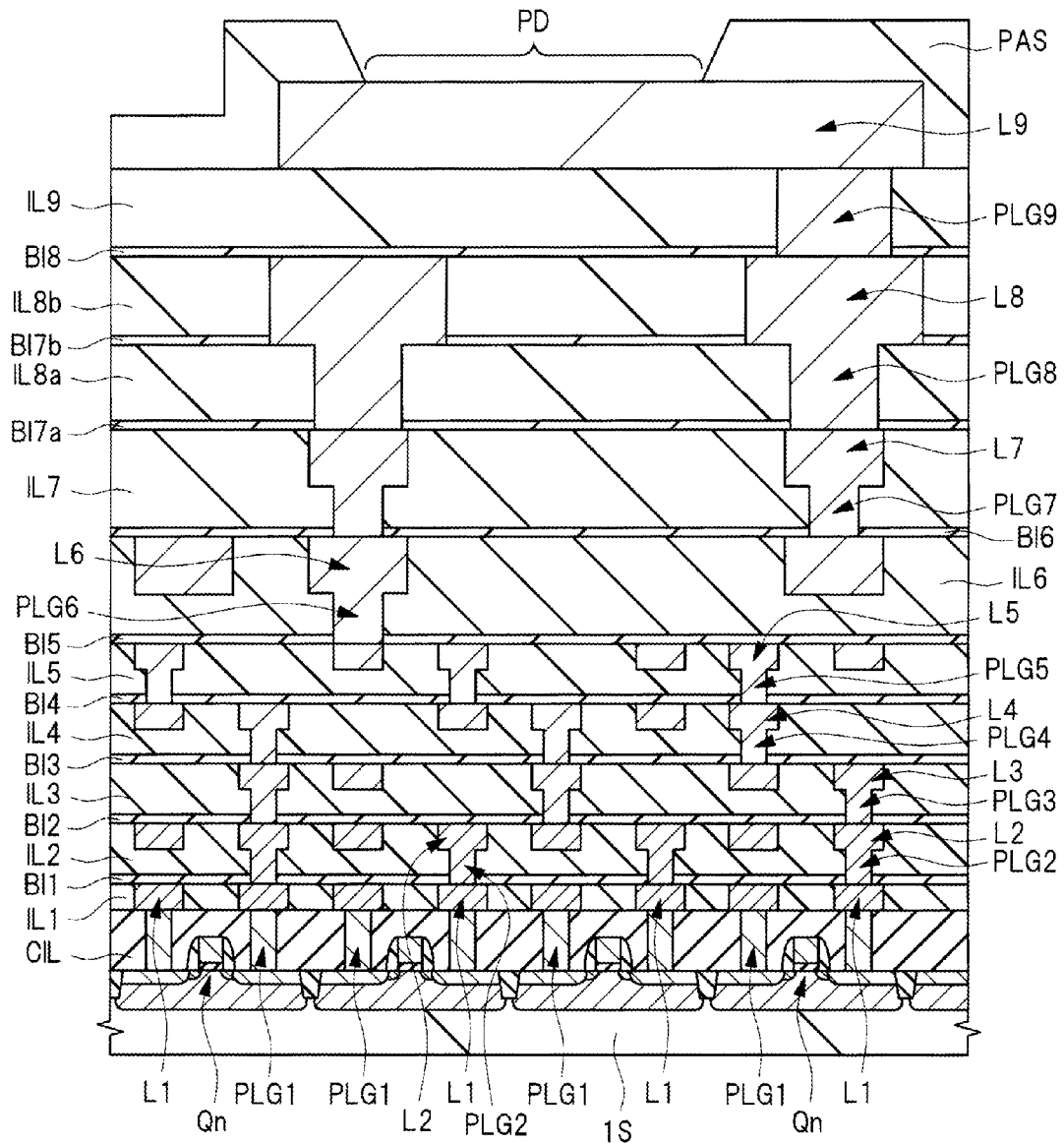
FIG. 34 is a cross-sectional view showing a method of manufacturing a semiconductor device succeeding FIG. 33.

After that, as shown in FIG. 33, the passivation film PAS which becomes a surface protection film is formed over the interlayer insulating film IL9 in which the ninth layer wiring L9 is formed. This passivation film PAS is formed by a silicon oxide film and a silicon nitride film disposed over this silicon oxide film, for example, and can be formed by a CVD method, for example. Then, as shown in FIG. 34, an opening is formed in the passivation film PAS by the use of a photolithography technique and an etching technique, and a part of the ninth layer wiring L9 is exposed to form the pad PD.

Figure 35:
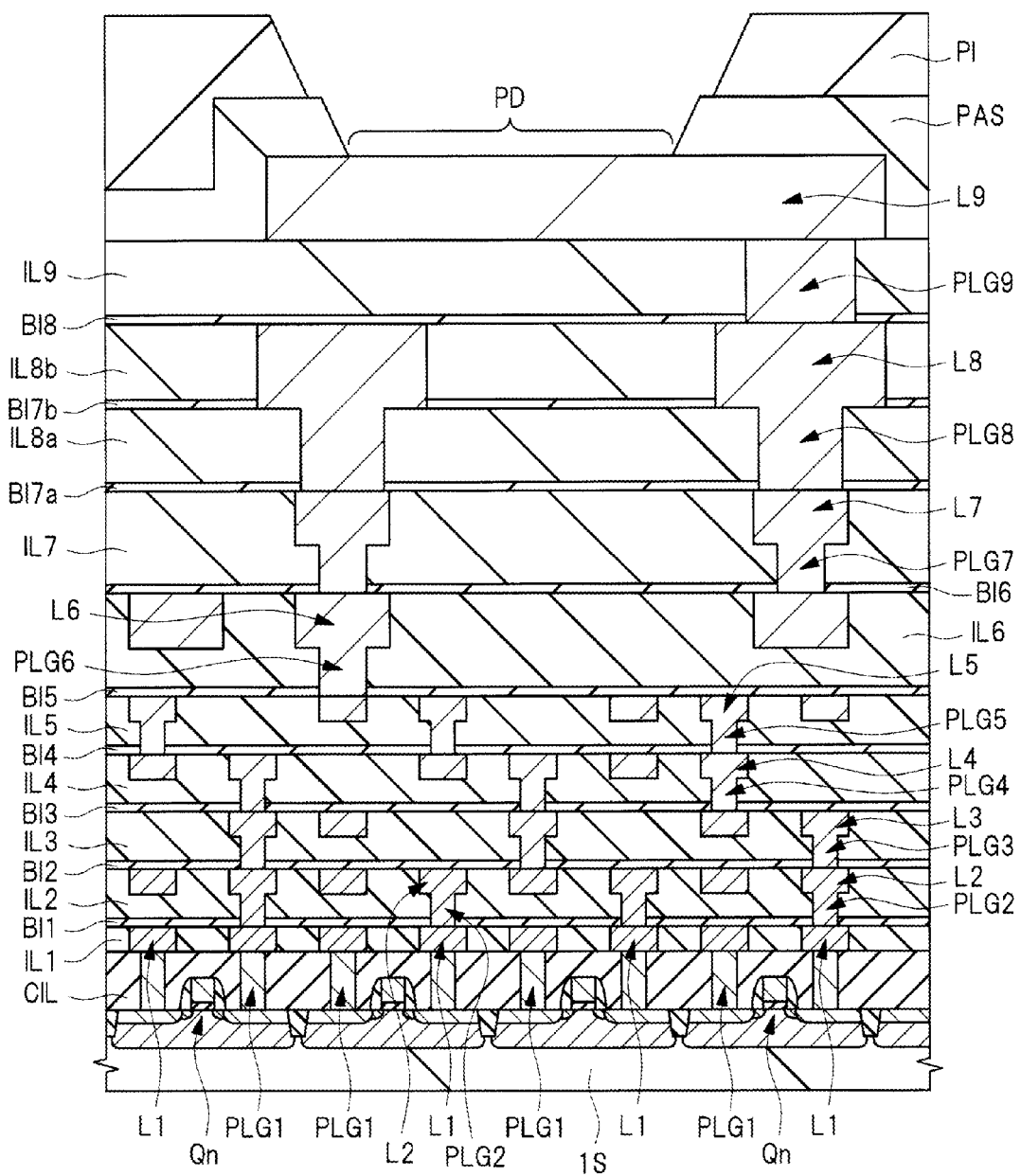
FIG. 35 is a cross-sectional view showing a method of manufacturing a semiconductor device succeeding FIG. 34.

Next, as shown in FIG. 35, the polyimide film PI is formed over the passivation film PAS which exposes the pad PD. Then, this polyimide film PI is patterned to expose the pad PD. As described above, the MISFET and the multilayer wiring are formed over the semiconductor substrate 1S and thereby the semiconductor device of the present embodiment shown in FIG. 1 is completed.

Note that there is not a restriction in particular for the porous low-k film explained in the present embodiment if the vacancies 9 and 10 shown in FIG. 3 are formed therein by elimination of porogen. That is, as a material for the porous low-k film, replacing the SiOC, an MSQ (Methyl Silsesquioxane) film or an HQS (Hydrogen Silsesquioxane) film which includes the vacancies 9 and 10 may be used, for example. As a manufacturing method of the porous low-k film, after formation of an insulating film having a plurality of vacancies including porogen gas by a coating method, a curing process may be performed to eliminate (exhaust) the porogen from the insulating film to form a porous low-k film.

In the following, there will be explained an effect of the method of manufacturing a semiconductor device in the present embodiment.

Figure 46:
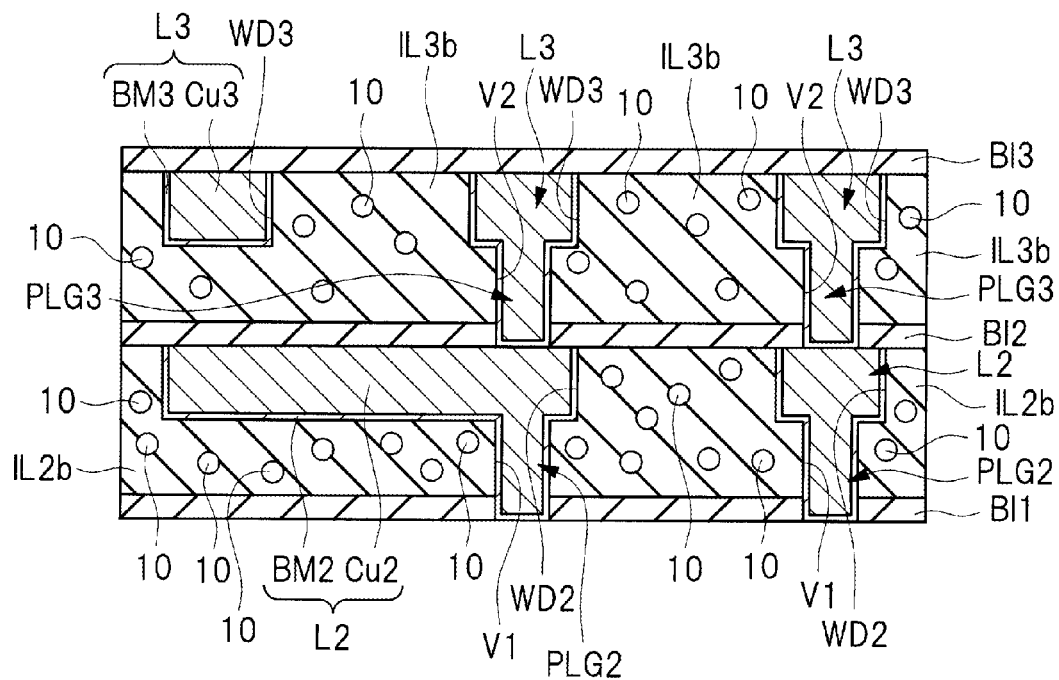
FIG. 46 is a cross-sectional view of a semiconductor device shown as a comparative example.

When a plurality of the vacancies is formed in the interlayer insulating film which embeds the wiring and the permittivity of the interlayer insulating film is reduced for reduction of capacitance generated between the wirings and other purposes, there is an idea that a plurality of the vacancies having the same diameter is formed in the whole region of the interlayer insulating film. A semiconductor device including an interlayer insulating film having such a structure is shown in FIG. 46 as a comparative example. FIG. 46 shows interlayer insulating films IL2b and IL3b which correspond to the interlayer insulating films IL2 and IL3 shown in FIG. 3, respectively. Further, FIG. 46 shows a second layer wiring L2 and a plug (via) PLG2 which are embedded in the interlayer insulating film IL2b and shows a third layer wiring L3 and a plug (via) PLG3 which are embedded in the interlayer insulating film IL3b.

As described above, when a relatively large vacancy having the same diameter as the vacancy in the interlayer insulating film located in the region having the same height as the wiring (interlayer insulating film between the neighboring wirings) is formed in the interlayer insulating film located in the region having the same height as the via (interlayer insulating film between the neighboring vias), there arises a problem that the EM characteristic (lifetime) of the metal wiring including the via is degraded and the TDDB characteristic (lifetime) between the metal wirings is degraded. That is, when the diameter of the vacancy formed in the interlayer insulating film between the neighboring vias, the degradation of the EM characteristic or the TDDB characteristic occurs considerably, and there arises a problem such as one that the resistance value of the metal wiring including the via is increased, and resultantly the reliability of the semiconductor device is degraded.

That is, when the relatively large vacancies 10 are formed across the whole region in each of the interlayer insulating films IL2b and the IL3b as shown in FIG. 46, while it is possible to reduce the permittivity of the insulating film by increasing the vacancy occupation rate in each upper part within the interlayer insulating films IL2b and IL3b, in the lower part, a void is easily generated in the plug (via) if the vacancy occupation rate is increased too much. Further, when the vacancies 10 having a large average diameter are formed in the interlayer insulating film IL3b to increase the vacancy occupation rate, a void is easily generated in the second layer wiring L2 directly under the interlayer insulating film IL3b.

One of the reasons why such a problem occurs is that the vacancies having large diameters are exposed on the side surfaces of the wiring trench in which the metal wiring is embedded and the via hole where the via is embedded and thereby adhesion is degraded between the barrier conductor film covering the surface of the metal wiring and via and the interlayer insulating film.

Further, another reason why the above described problem occurs is that the vacancy diameter is increased in the interlayer insulating film of the upper layer covering over the upper surface of the metal wiring which is embedded in the upper part of the lower layer interlayer insulating film, and thereby the elastic modulus of the upper layer interlayer insulating film is reduced. That is, when the elastic modulus is reduced in the interlayer insulating film formed over the metal wiring via the barrier insulating film, stress is reduced in the interlayer insulating film and force pressing the metal wiring of the lower layer from above is reduced, and thereby a void caused by the EM is generated in the metal wiring.

In addition, as another problem, there arises a possibility that, when a portion where the barrier conductor film is not formed exists on the side wall of the wiring trench or the like, water intrudes easily into the interlayer insulating film from such a position, the EM characteristic is degraded, the TDDB characteristic is degraded, or the withstand voltage is reduced between the wirings.

In the semiconductor device of the present embodiment, as explained by the use of FIG. 20, the average diameter of the vacancies exposed on each of the side walls of the wiring trench and the via hole is made smaller than that of the vacancies formed in the upper layer within the interlayer insulating film. Specifically, as shown in FIG. 20, the side wall insulating layer PS2 including the vacancy 9 having a relatively small diameter is formed on the surface of the interlayer insulating film in the region exposed on the side wall of the wiring trench WD2. Further, the lower insulating layer PB2 including the vacancy 9 having a relatively small diameter is formed on the bottom surface of the wiring trench WD2 and the side wall of the via hole V1.

In this manner, the diameter of the vacancy in the interlayer insulating film IL2 exposed on the side walls of the wiring trench WD2 and the via hole V1 is made smaller than that of the vacancy 10 in the upper insulating layer PT2, and thereby flatness in each of the side walls of the wiring trench WD2 and the via hole V1 can be improved. Accordingly, it is possible to improve the coverage of the barrier conductor film BM2 on the surfaces of the second layer wiring L2 and the plug PLG2.

Thereby, it is possible to prevent the degradation of the adhesion between the second layer wiring L2 and plug PLG2 and the interlayer insulating film IL2 which is caused by the formation failure of the barrier conductor film BM2. Accordingly, it is possible to prevent occurrence of the EM and thereby it is possible to improve the reliability of the semiconductor device. Further, since it is possible to prevent generation of a region where the barrier insulating film is not formed, it is possible to prevent copper atoms configuring the second layer wiring L2 and the plug PLG2 from being diffused into the interlayer insulating film IL2. Accordingly, it is possible to prevent degradation of the line-to-line TDDB characteristic, and resultantly it is possible to improve the reliability of the semiconductor device. These effects can be obtained also in the interlayer insulating films IL3 to IL5 (refer to FIG. 35) and the like over the interlayer insulating film IL2 by the formation of the same structure.

Figure 47:
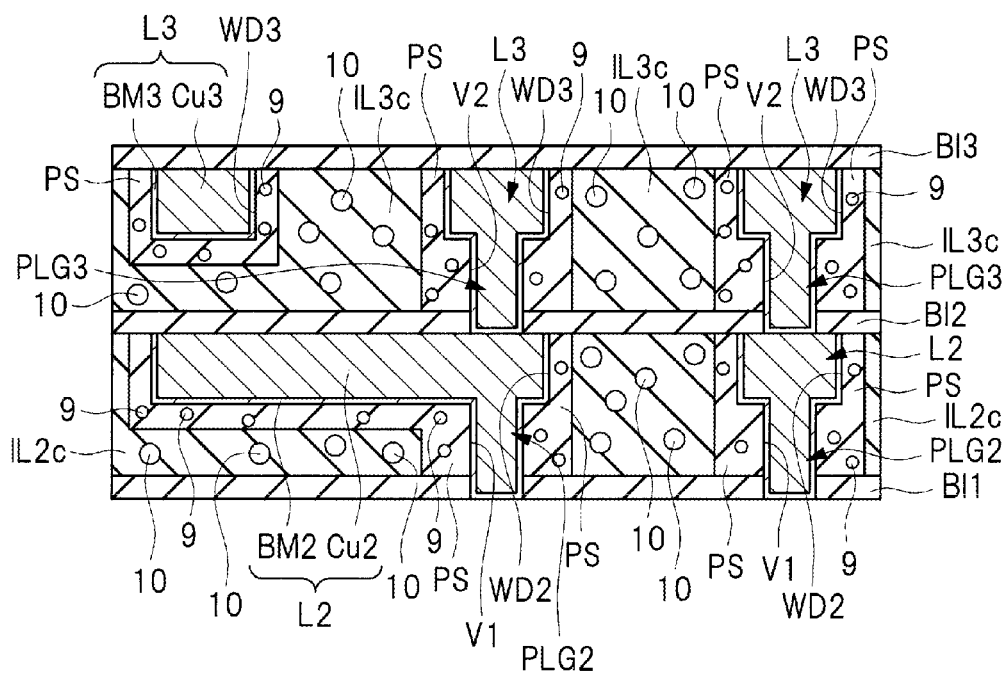
FIG. 47 is a cross-sectional view of a semiconductor device shown as a comparative example.

Note that, only for reducing the sizes of the vacancies exposed on the side walls of the wiring trench and the via hole, it might not be necessary to reduce the diameter of vacancy in the interlayer insulating film except the regions exposed on the side walls of the wiring trench and the via hole. FIG. 47 shows a semiconductor device in which the average diameter of the vacancies in the interlayer insulating film is reduced only in the vicinities of the side walls of the wiring trench and the via hole in this manner, as a comparative example. FIG. 47 is a cross-sectional view of the semiconductor device shown as the comparative example, and shows a cross-sectional view of the semiconductor device including interlayer insulating films IL2c and IL3c which correspond to the interlayer insulating films IL2 and IL3 shown in FIG. 35. As shown in FIG. 47, an insulating layer PS which includes a vacancy 9 having a relatively small vacancy diameter is formed in each of the interlayer insulating films IL2c and IL3c in each vicinity of the side walls of the wiring trenches WD2 and WD3 and via holes V1 and V2.

In the semiconductor device of the comparative example shown in FIG. 47, the vacancy 10 has a large diameter in the lower layer within the interlayer insulating film IL3c and stress is reduced in the lower part within the interlayer insulating film IL3c, and therefore a second layer wiring L2 cannot be pressed and there arises a problem that the EM lifetime of the metal wiring is degraded. The second layer wiring L2 extends along the lower surface of a barrier insulating film BI2 over the interlayer insulating film IL2c and is formed also directly under the region where an insulating layer PS of the interlayer insulating film IL3c is not formed.

That is, the lower surface of the interlayer insulating film IL3c which includes the vacancies 10 having a relatively large average diameter contacts directly above the second layer wiring L2 via the barrier insulating film BI2. In this case, the lower surface of the interlayer insulating film IL3c which includes the vacancies 10 has a lower elastic modulus and a smaller internal stress than the insulating layer PS, and therefore it is difficult to press and fix the second layer wiring L2 directly thereunder with the internal stress.

When the elastic modulus of the interlayer film around the second layer wiring L2 is reduced, the critical stress of the second layer wiring L2 is reduced. Accordingly, when current flows in the second layer wiring L2 and tensile stress is caused in the second layer wiring L2, the tensile stress exceeds the critical stress easily, and a void is generated in the second layer wiring L2. Accordingly, when a region where the insulating layer PS including the vacancy 9 is not formed directly above the second layer wiring L2 as shown in FIG. 47, it is not possible to prevent the degradation of the EM characteristic and the TDDB characteristic in the second layer wiring L2.

Accordingly, in the present embodiment, as shown in FIG. 3, the lower insulating layer PB2 in which the inside vacancy 9 has a reduced diameter is formed not only in the interlayer insulating film IL2 in the region exposed on the side wall of the via hole V1 but also along the whole lower surface of the interlayer insulating film IL2. While detailed illustration is omitted for the layers except the interlayer insulating films IL2 and IL3, also each of the interlayer insulating film IL3, the interlayer insulating films IL4 and IL5 (refer to FIG. 1) in the upper layer thereof and the like has the same structure as the interlayer insulating film IL2. For example, as shown in FIG. 2, while the upper surface of the second layer wiring L2 which extends along the upper surface of the semiconductor substrate (not shown in the drawing) is covered by the interlayer insulating film IL3, also in the region which contacts the upper surface of the second layer wiring L2 except the vicinity of the plug PLG3, the upper surface of the second layer wiring L2 is covered by the lower insulating layer PB3 in which the relatively small vacancy 9 (refer to FIG. 3) is formed. That is, the whole region directly above the second layer wiring L2 is covered by the lower insulating layer PB3 including the vacancy 9 except the region to which the plug PLG3 is coupled.

Since the lower insulating layer PB3 which is a part of the interlayer insulating film IL3 has a higher elastic modulus than the upper insulating layer PT3, stress at the bottom surface of the interlayer insulating film IL3 which covers the upper surface of the second layer wiring L2 is larger than that in the upper insulating layer PT3. When the elastic modulus in the lower insulating layer PB3 over the second layer wiring L2 is increased, the critical stress of the second layer wiring L2 is increased, and thereby, even when tensile stress is increased in the second layer wiring L2 by current flow in the second layer wiring L2, it is possible to prevent this tensile stress from exceeding the critical stress and to suppress generation of a void. Accordingly, it is possible to fix the second layer wiring L2, which is formed on the lower surface of the interlayer insulating film IL3 via the barrier insulating film BI2, with the stress in the lower insulating layer PB3 and to prevent the degradation of the EM characteristic of the second layer wiring L2, and resultantly it is possible to improve the reliability of the semiconductor device.

Further, for the problem that water intrudes easily into the interlayer insulating film from the side walls of the wiring trench and the like, in the present embodiment, it is possible to prevent the moisture adsorption from such a surface by causing the surface layers of the interlayer insulating film exposed on the side walls of the wiring trench and the like to become denser and have a higher hardness.

To cause the lower insulating layer of the interlayer insulating film to have a smaller vacancy and a higher elastic modulus as described above is realized by the process that the porogen flow rate is changed from 0.10 g/min to 0.30 g/min in the course of the formation of the interlayer insulating film as explained by the use of FIG. 13. That is, the above described effect can be obtained only by the change of the porogen flow rate during the film formation. Accordingly, by using the manufacturing method of the semiconductor device in the present embodiment, the above described effect is obtained extremely easily without requiring increase in the number of masks, increase in the number of film formation processes, increase in the number of etching processes, or the like, and it is possible to prevent the manufacturing steps of the semiconductor device from becoming complicated.

In the following, there will be explained an effect of the semiconductor device and the manufacturing method thereof in the present embodiment by the use of graphs shown in FIG. 36 to FIG. 42. However, in the following, there will be shown experimental results when a semiconductor device includes an interlayer insulating film which is formed by means of changing the porogen flow rate from 0.10 g/min to 0.30 g/min in the formation of a porous low-k film and this semiconductor device is used as a semiconductor device having the same effect as that of the present embodiment.

Figure 36:
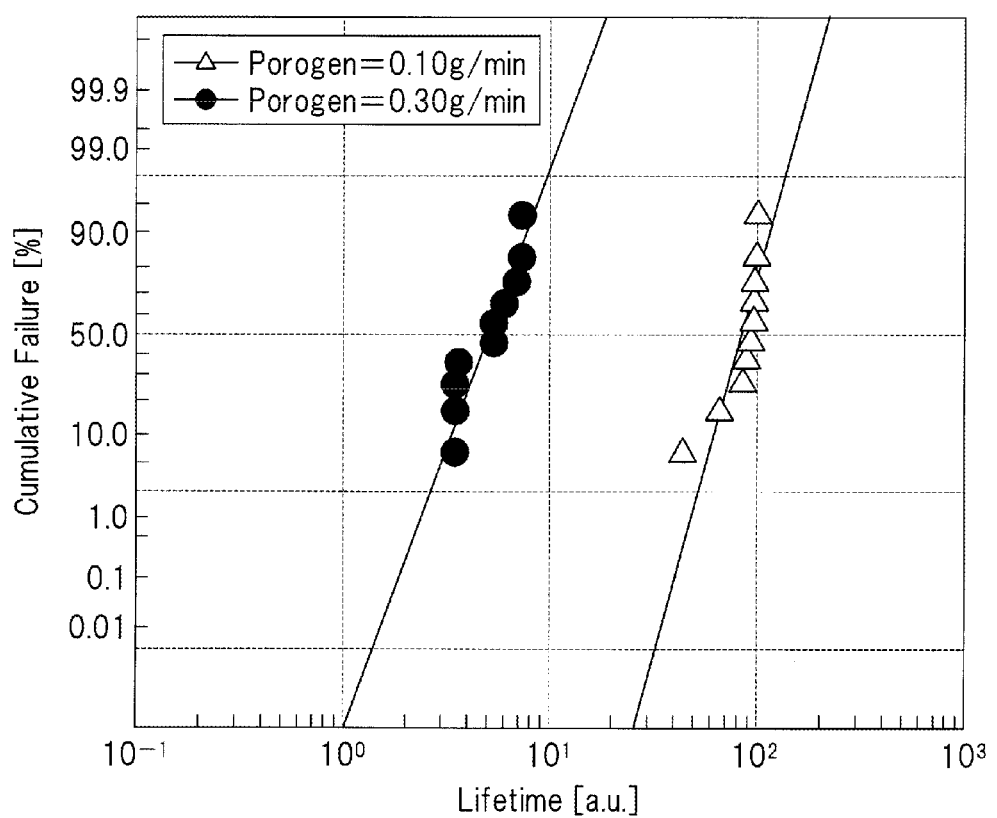
FIG. 36 is a graph showing a relationship between a porogen flow rate and an EM lifetime.

FIG. 36 is a graph having a horizontal axis of an EM lifetime and a vertical axis of a cumulative distribution thereof, and shows a graph for a porous low-k film (interlayer insulating film) which is formed at a porogen flow rate of 0.10 g/min, by white triangular plotting, and shows a graph for a porous low-k film (interlayer insulating film) which is formed at a porogen flow rate of 0.30 g/min, by black circular plotting. When the two graphs shown in FIG. 36 are compared, it seems that there is little difference in the EM lifetime between the interlayer insulating film formed at the reduced porogen flow rate and the interlayer insulating film formed at the increased porogen flow rate.

However, it has been found by an experiment by the present inventors that, while voids are frequently generated in the wiring extending along the major surface of the semiconductor substrate in the case of the porogen flow rate at 0.10 g/min, voids are frequently generated in the plug (via) coupling the upper and lower wirings in the case of the porogen flow rate at 0.30 g/min. That is, when the porogen flow rate is increased and the vacancy occupation rate is increased in the interlayer insulating film, voids are easily generated in the plug embedded in the lower part within the interlayer insulating film.

Figure 37:
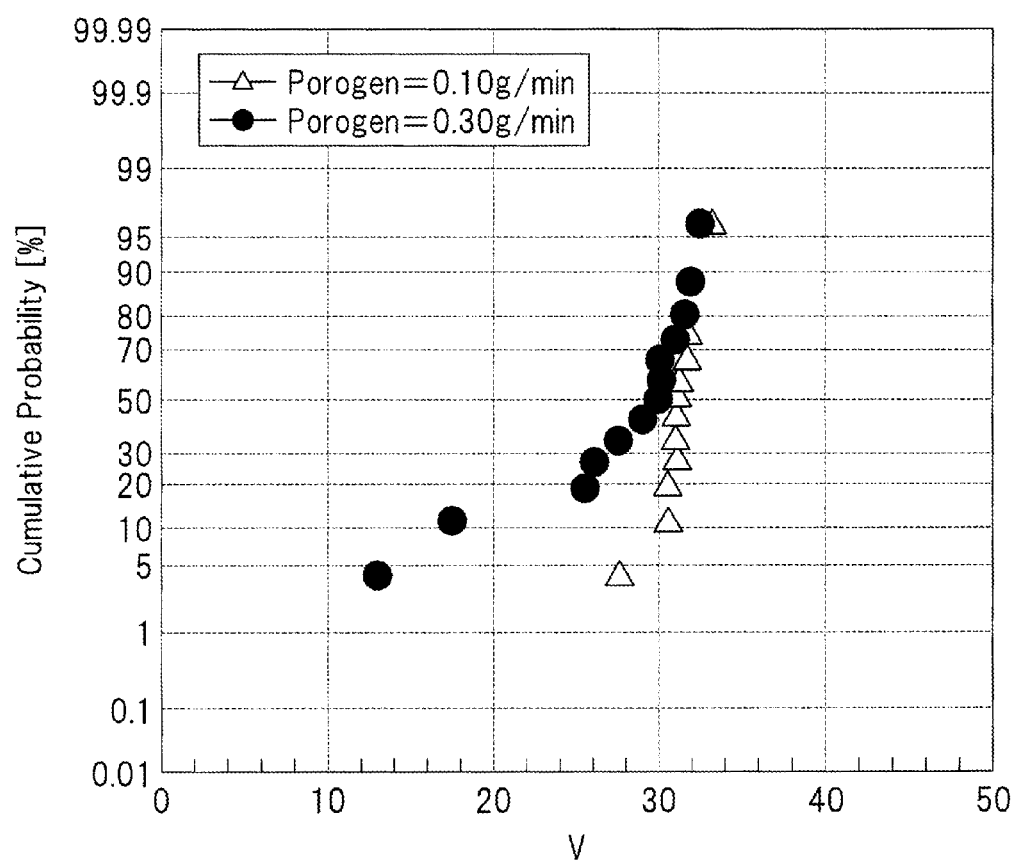
FIG. 37 is a graph showing a relationship between a porogen flow rate and an interwiring withstand voltage.

Next, FIG. 37 is a graph having a horizontal axis of an interwiring withstand voltage and a vertical axis of a cumulative distribution thereof, and shows a graph for the interlayer insulating film which is formed at a porogen flow rate of 0.10 g/min, by white triangular plotting, and shows a graph for the interlayer insulating film which is formed at a porogen flow rate of 0.30 g/min by black circular plotting.

Figure 38:
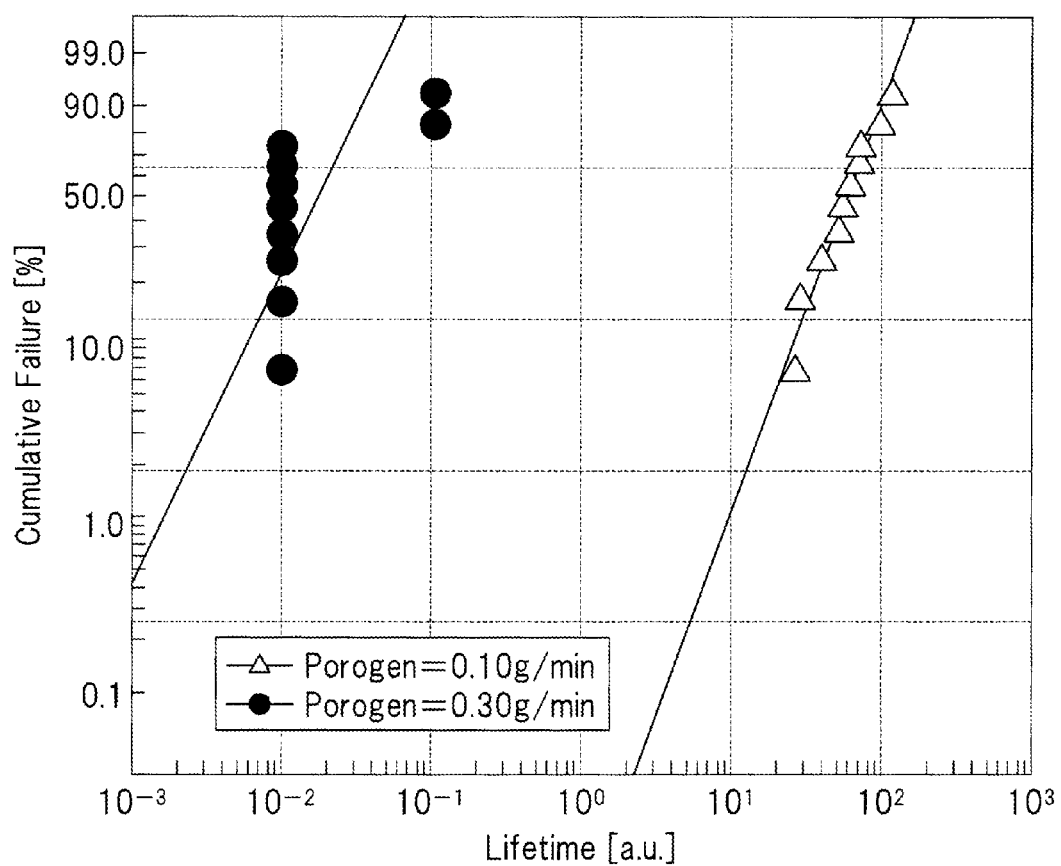
FIG. 38 is a graph showing a relationship between a porogen flow rate and a line-to-line TDDB lifetime.

Further, a graph shown in FIG. 38 is a graph having a horizontal axis of a line-to-line TDDB lifetime and a vertical axis of a cumulative distribution thereof, and shows a graph for the interlayer insulating film which is formed at a porogen flow rate of 0.10 g/min, by white triangular plotting, and shows a graph for the interlayer insulating film which is formed at a porogen flow rate of 0.30 g/min, by black circular plotting.

As shown in FIG. 37, the withstand voltage becomes lower for the interlayer insulating film formed at the increased porogen flow rate than that for the interlayer insulating film formed at the reduced porogen flow rate. Further, as shown in FIG. 38, the TDDB lifetime becomes shorter for the interlayer insulating film formed at the increased porogen flow rate than that for the interlayer insulating film formed at the reduced porogen flow rate. It is conceivable that these phenomena result from the fact that voids are more easily generated in the plug (via) part for the interlayer insulating film formed at an increased porogen flow rate, as explained by the use of FIG. 36.

Figure 39:
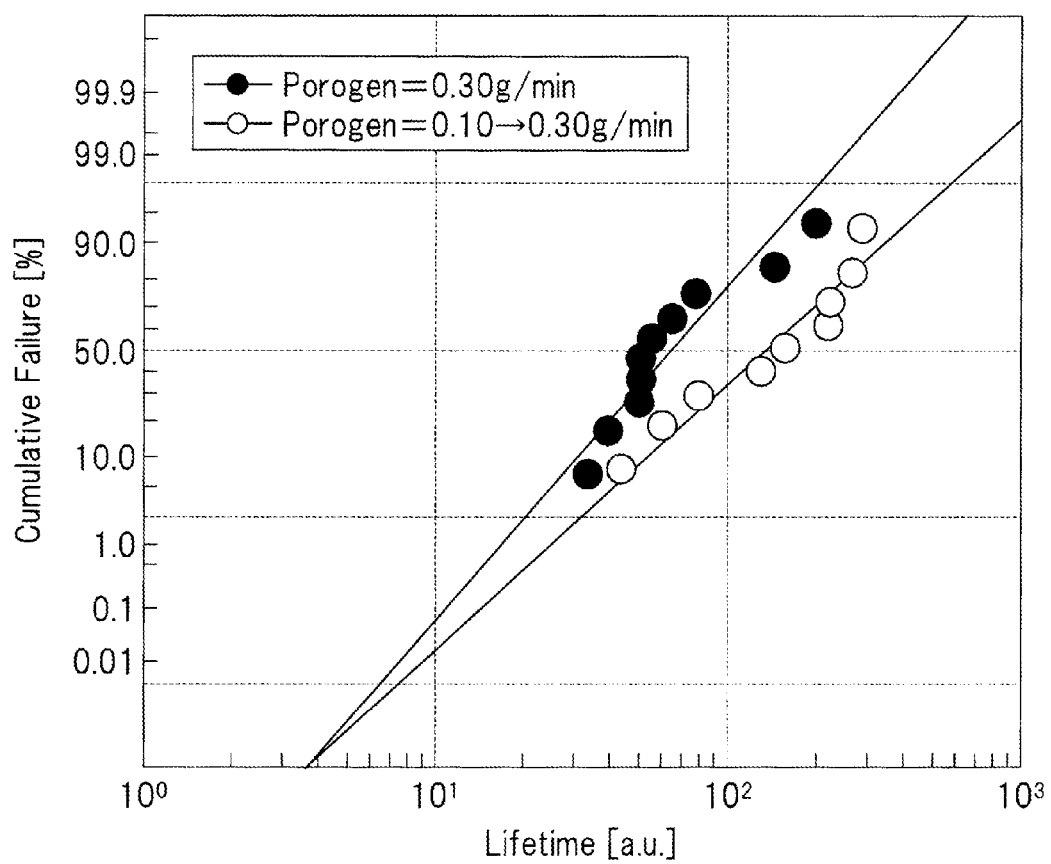
FIG. 39 is a graph showing a relationship between a porogen flow rate and an EM lifetime.
Figure 40:
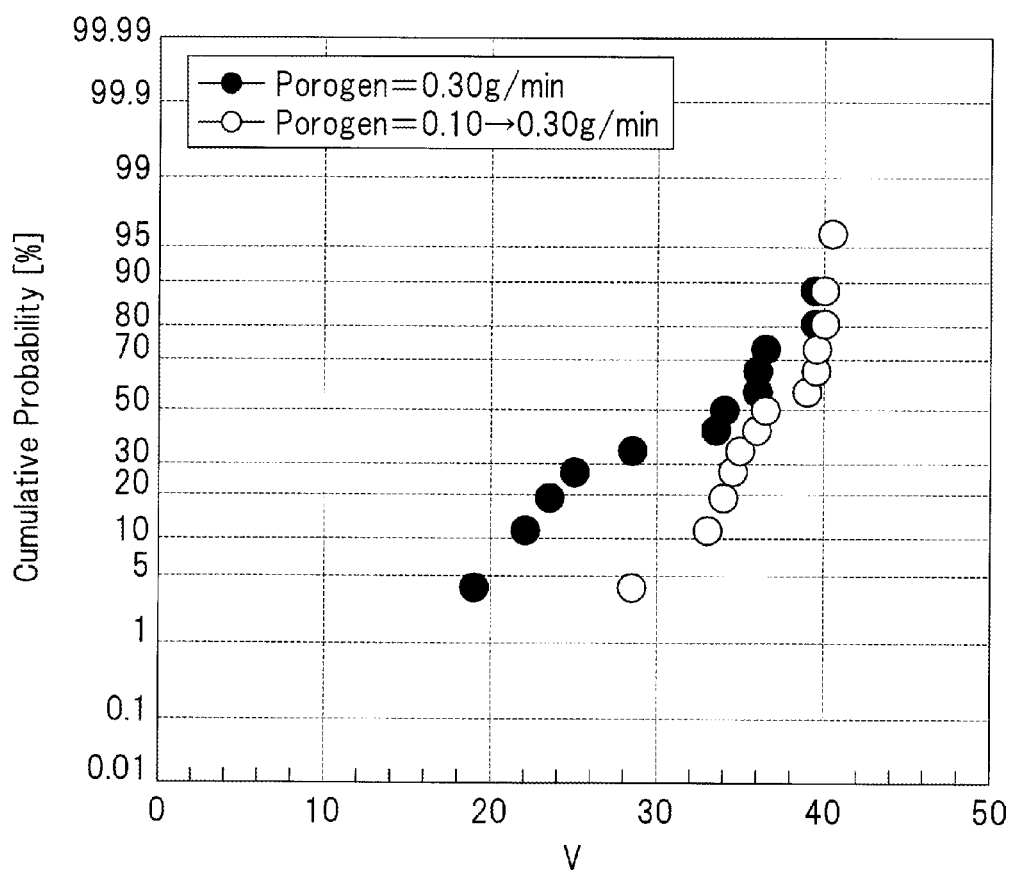
FIG. 40 is a graph showing a relationship between a porogen flow rate and an interwiring withstand voltage.
Figure 41:
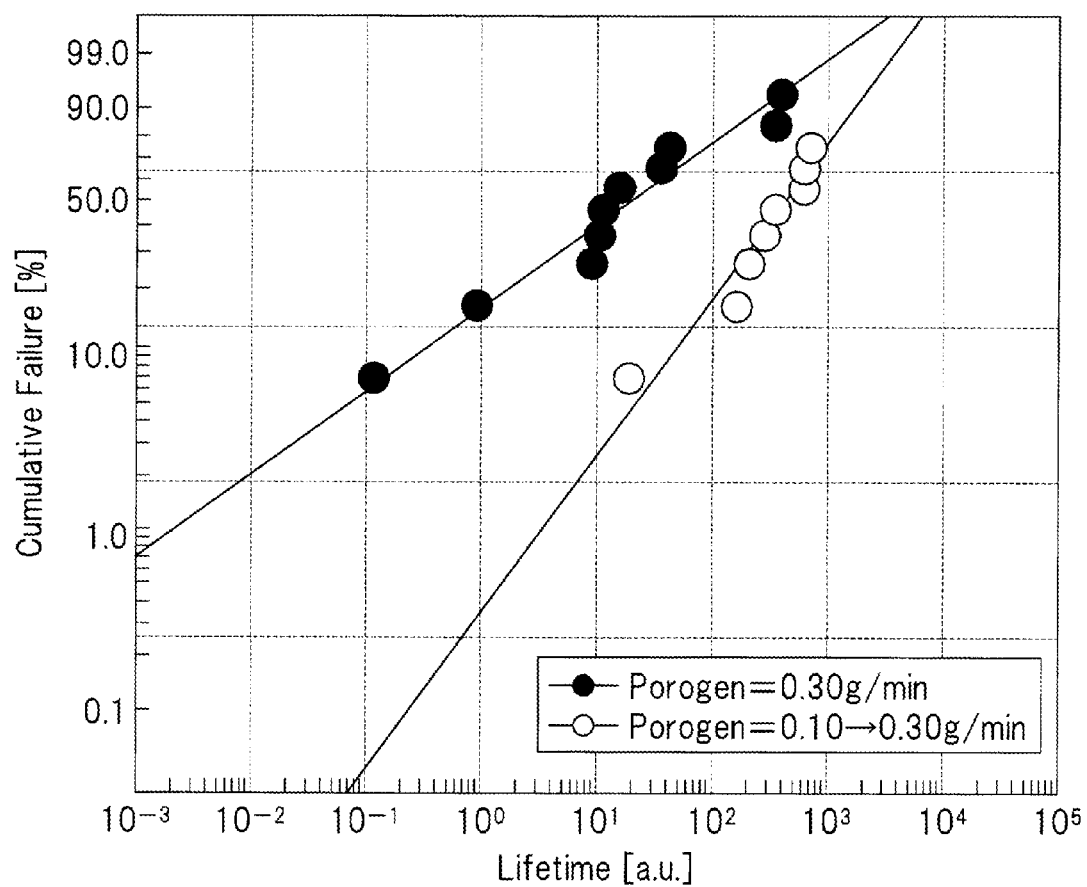
FIG. 41 is a graph showing a relationship between a porogen flow rate and a line-to-line TDDB lifetime.

Next, FIG. 39 is a graph having a horizontal axis of an EM lifetime and a vertical axis of a cumulative distribution thereof. Further, FIG. 40 is a graph having a horizontal axis of an interwiring withstand voltage and a vertical axis of a cumulative distribution thereof. Further, FIG. 41 has a horizontal axis of a line-to-line TDDB lifetime and a vertical axis of a cumulative distribution thereof. Each of FIG. 39, FIG. 40, and FIG. 41 shows a graph for the interlayer insulating film which is formed by means of changing the porogen flow rate from 0.10 g/min to 0.30 g/min during a film formation process of the interlayer insulating film, by white circular plotting, and shows a graph for the interlayer insulating film which is formed by means of keeping the porogen flow rate constant at 0.30 g/min during a film formation process of the interlayer insulating film, by black circular plotting. That is, the graph shown by the white circular plotting is a graph for the case of using a porous low-k film having the same effect as the porous low-k film used in the semiconductor device of the present embodiment.

As shown in FIG. 39, FIG. 40, and FIG. 41, the EM lifetime and line-to-line TDDB lifetime become longer and the withstand voltage is more improved for the interlayer insulating film which is formed by means of changing the porogen flow rate from 0.10 g/min to 0.30 g/min than for the interlayer insulating film which is formed by means of keeping the porogen flow rate constant at a constant value of 0.30 g/min.

Accordingly, in the semiconductor device of the present embodiment, it is possible to improve the EM lifetime, the line-to-line TDDB lifetime, and the withstand voltage by increasing the porogen flow rate in a step-by-step manner during the film formation process of the porous low-k film (interlayer insulating film). This is an effect obtained by the reduction of the vacancy density in the interlayer insulating film between a plurality of the plugs (vias) as described above.

Figure 42:
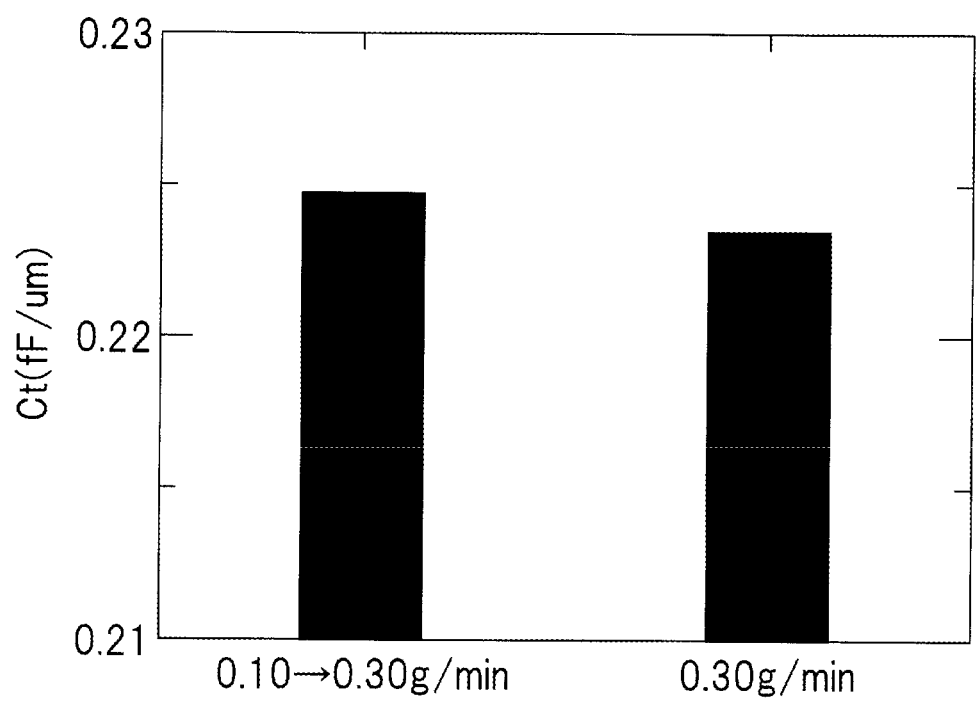
FIG. 42 is a graph showing a relationship between a porogen flow rate and a capacitance of an interlayer insulating film.

Note that, when the interlayer insulating film which is formed by means of keeping the porogen flow rate constant at 0.30 g/min and the interlayer insulating film which is formed by means of changing the porogen flow rate from 0.10 g/min to 0.30 g/min are compared, it is conceivable that the permittivity (capacitance) becomes larger in the insulating film formed by means of changing the above described flow rate. However, actually, as shown in the graph of FIG. 42, an increase in the permittivity (capacitance) is approximately 0.6% which is a value in a range without a practical problem, when the interlayer insulating film formed by means of keeping the porogen flow rate constant at 0.30 g/min and the interlayer insulating film formed by means of changing the porogen flow rate from 0.10 g/min to 0.30 g/min are compared. Accordingly, even when the vacancy average diameter is reduced in the lower insulating layer within the interlayer insulating film as in the present embodiment, the increase in the permittivity of the interlayer insulating film can be kept within a range without a problem.

Here, FIG. 42 shows a graph for the interlayer insulating film formed by means of keeping the porogen flow rate constant at 0.30 g/min (right side of FIG. 42) and a graph for the interlayer insulating film formed by means of changing the porogen flow rate from 0.10 g/min to 0.30 g/min (left side of FIG. 42), when the vertical axis is a capacitance (permittivity) of the interlayer insulating film.

While, hereinabove, the invention achieved by the present inventors has been explained specifically according to the embodiment, the present invention is not limited to the embodiment and obviously can be changed variously in the range without departing from the gist thereof.

What is claimed is:

1. A method of manufacturing a semiconductor device, comprising the steps of:
    (a) forming a second interlayer insulating film over a substrate;
    (b) forming a second wiring trench in an upper surface of the second interlayer insulating film to form a second wiring by embedding the second wiring in the second wiring trench;
    (c) supplying source gas including porogen to form a first interlayer insulating film over the second interlayer insulating film so as to cover the second wiring;
    (d) eliminating porogen from the first interlayer insulating film by performing UV curing;
    (e) after the (d) step, forming a via hole which passes through the first interlayer insulating film;
    (f) after the (d) step, forming a first wiring trench in an upper surface of the first interlayer insulating film; and
    (g) forming a via in the via hole and forming a first wiring by embedding the first wiring in the first wiring trench,
    wherein, the (c) step forms the first interlayer insulating film having a first film and a second film which includes more porogen than the first film, by increasing a porogen flow rate during the formation step of the first interlayer insulating film,
    wherein the (d) step forms a plurality of first vacancies in the first film and forms a plurality of second vacancies having an average diameter larger than an average diameter of the first vacancies in the second film, by eliminating the porogen, and
    wherein the (f) step forms a third film, including a plurality of third vacancies having an average diameter smaller than the average diameter of the second vacancies, on a side wall of the first wiring trench by forming the first wiring trench by plasma etching.

2. The method of manufacturing a semiconductor device according to claim 1,
    wherein the second wiring extends in a direction along the substrate and the first film covers an upper surface of the second wiring.

3. The method of manufacturing a semiconductor device according to claim 1, wherein
    the (g) step forms a plurality of the first wirings and a plurality of the vias, and
    the first film is formed in a whole region between the vias.

4. The method of manufacturing a semiconductor device according to claim 1,
    wherein the (a) step includes the steps of:
        (c1) supplying source gas including porogen to form the second interlayer insulating film, and
        (d1) eliminating porogen from the second interlayer insulating film by performing UV curing,
    the (c1) step forms the second interlayer insulating film having a fourth film and a fifth film which includes more porogen than the fourth film by increasing a porogen flow rate during the formation step of the second interlayer insulating film, and
    the (d1) step forms a plurality of fourth vacancies in the fourth film and forms a plurality of fifth vacancies having an average diameter larger than the fourth vacancies in the fifth film, by eliminating the porogen.

5. The method of manufacturing a semiconductor device according to claim 1, wherein the second film is formed to have a lower permittivity than the first film.

6. The method of manufacturing a semiconductor device according to claim 1, wherein the second film is formed to have a lower permittivity than the third film.

7. The method of manufacturing a semiconductor device according to claim 1, wherein when the first wiring trench and the via hole are formed, the third film covers the side wall of the first wiring trench and the first film covers a bottom surface of the first wiring trench and a side wall of the via hole such that the second film with the second vacancies having the larger average diameters than the first vacancies and the third vacancies is prevented from being exposed to the side wall of the first wiring trench and the side wall of the via hole.

* * * * *